(12) United States Patent
Terasawa et al.

(10) Patent No.: US 10,608,010 B2
(45) Date of Patent: Mar. 31, 2020

(54) THREE-DIMENSIONAL MEMORY DEVICE CONTAINING REPLACEMENT CONTACT VIA STRUCTURES AND METHOD OF MAKING THE SAME

(71) Applicant: SANDISK TECHNOLOGIES LLC, Addison, TX (US)

(72) Inventors: Yujin Terasawa, Yokkaichi (JP); Genta Mizuno, Yokkaichi (JP); Yusuke Mukae, Yokkaichi (JP); Yoshinobu Tanaka, Yokkaichi (JP); Shiori Kataoka, Yokkaichi (JP); Ryosuke Itou, Yokkaichi (JP); Kensuke Yamaguchi, Yokkaichi (JP); Naoki Takeguchi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/002,265

(22) Filed: Jun. 7, 2018

(65) Prior Publication Data
US 2019/0280001 A1    Sep. 12, 2019

Related U.S. Application Data

(60) Provisional application No. 62/640,776, filed on Mar. 9, 2018.

(51) Int. Cl.
*H01L 27/11582* (2017.01)
*H01L 27/11524* (2017.01)
(Continued)

(52) U.S. Cl.
CPC .. *H01L 27/11582* (2013.01); *H01L 21/76816* (2013.01); *H01L 21/76865* (2013.01);
(Continued)

(58) Field of Classification Search
CPC . H01L 2924/00014; H01L 2224/45144; H01L 2924/00; H01L 51/5246; H04N 5/378
(Continued)

(56) References Cited

U.S. PATENT DOCUMENTS

| 9,716,105 B1 | 7/2017 | Tsutsumi |
| 9,960,181 B1 | 5/2018 | Cui et al. |
| 2016/0365352 A1* | 12/2016 | Nishikawa ........ H01L 27/11582 |

OTHER PUBLICATIONS

U.S. Appl. No. 15/638,672, filed Jun. 30, 2017, SanDisk Technologies LLC.

(Continued)

*Primary Examiner* — Andy Huynh
(74) *Attorney, Agent, or Firm* — The Marbury Law Group, PLLC

(57) ABSTRACT

An alternating stack of insulating layers and sacrificial material layers is formed with stepped surfaces. Sacrificial metal plates are formed on the top surfaces of the sacrificial material layers, and a retro-stepped dielectric material portion is formed over the sacrificial metal plates. Contact via cavities are formed through the retro-stepped dielectric material portion employing the sacrificial metal plates as etch stop structures. The sacrificial metal plates are replaced with portions of insulating spacer layers. Sacrificial via fill structures within remaining volumes of the contact via cavities. The sacrificial material layers are replaced with electrically conductive layers. The sacrificial via fill structures are replaced with portions of staircase-region contact via structures that contact the electrically conductive layers.

11 Claims, 51 Drawing Sheets

(51) Int. Cl.
*H01L 27/11556* (2017.01)
*H01L 27/11529* (2017.01)
*H01L 27/1157* (2017.01)
*H01L 21/768* (2006.01)
*H01L 23/522* (2006.01)
*H01L 23/528* (2006.01)
*H01L 27/11573* (2017.01)

(52) U.S. Cl.
CPC .... *H01L 21/76877* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
USPC ........................................................ 257/314
See application file for complete search history.

(56) References Cited

OTHER PUBLICATIONS

U.S. Appl. No. 15/813,579, filed Nov. 15, 2017, SanDisk Technologies LLC.
U.S. Appl. No. 15/813,625, filed Nov. 15, 2017, SanDisk Technologies LLC.
U.S. Appl. No. 15/873,101, filed Jan. 17, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.

\* cited by examiner

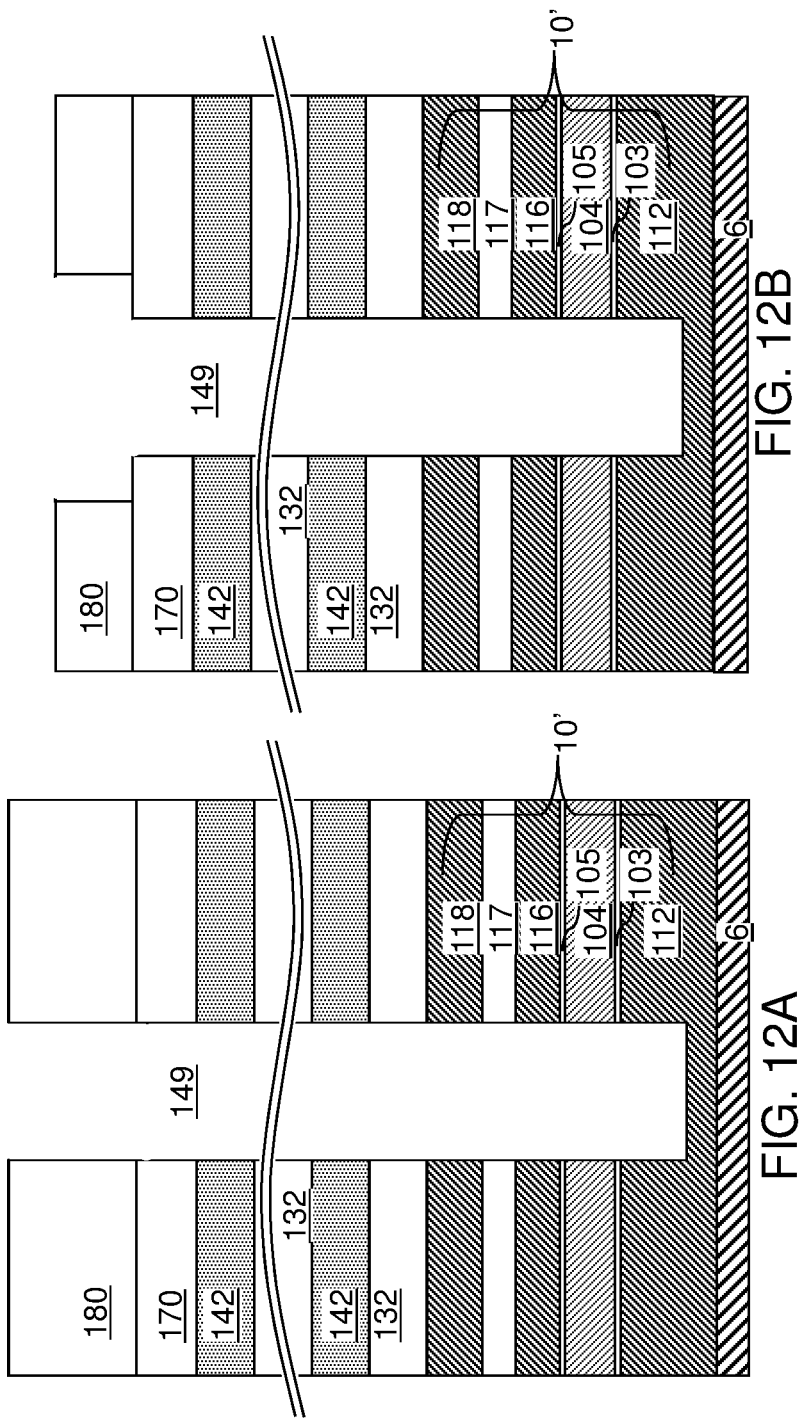

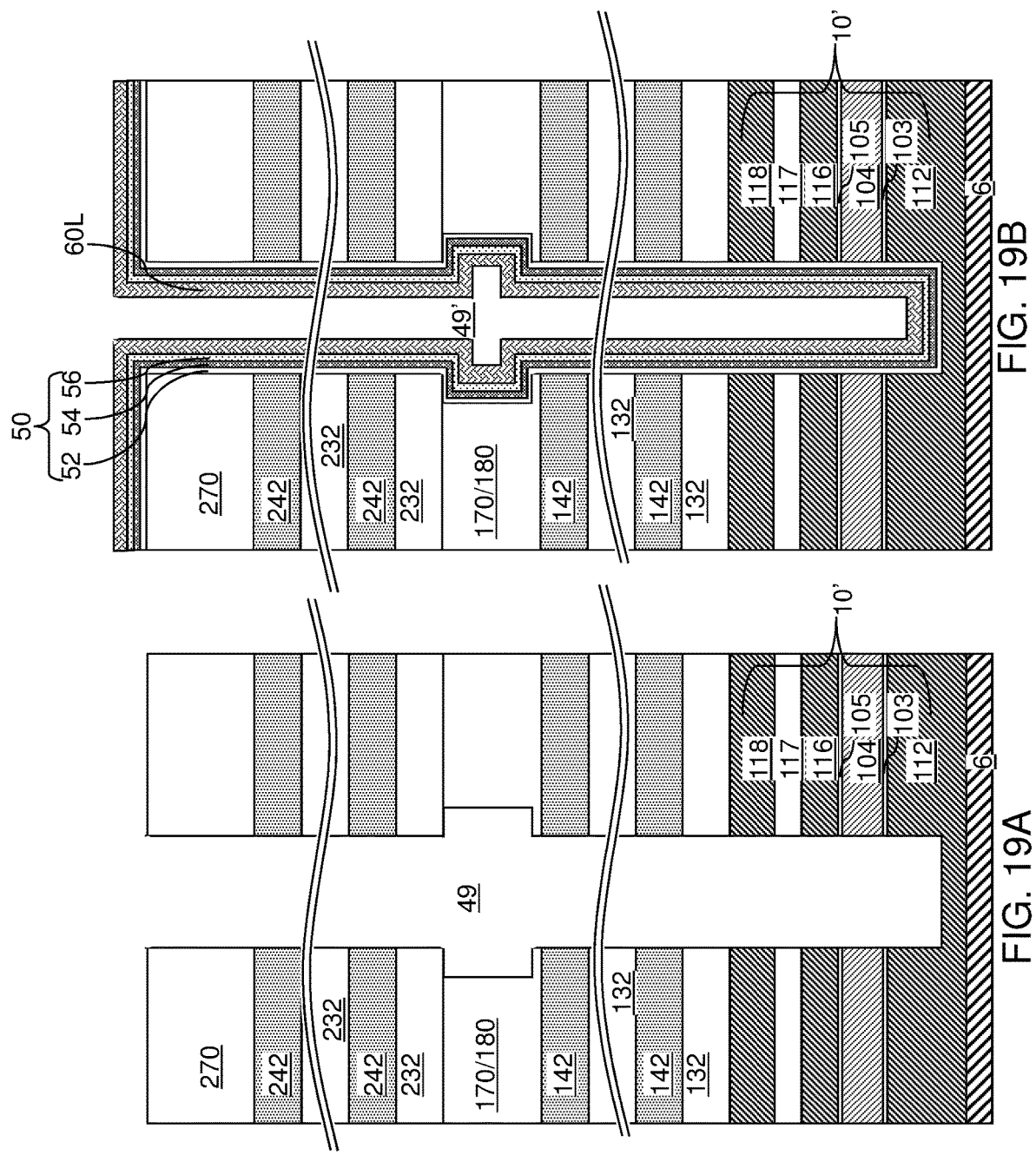

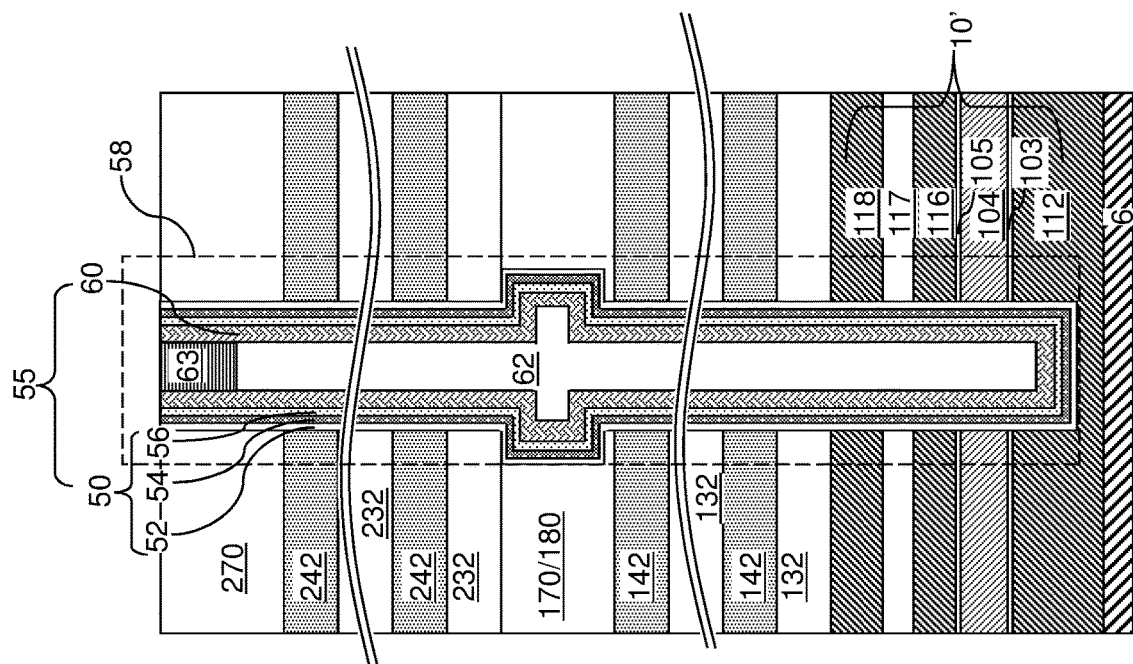
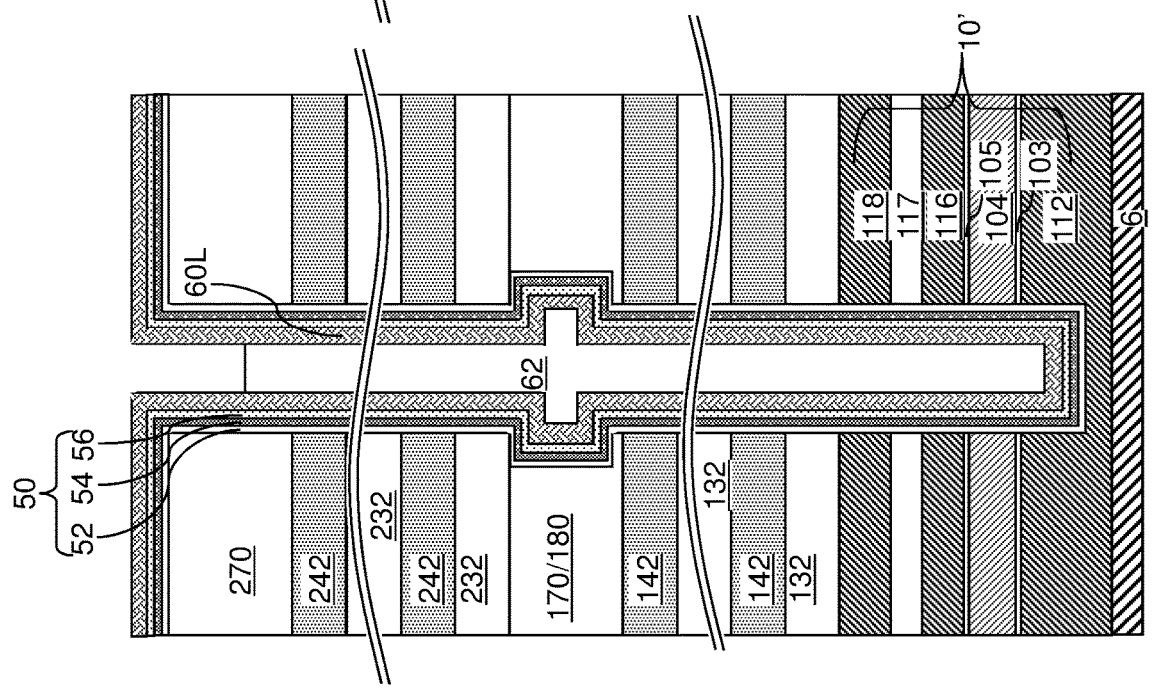

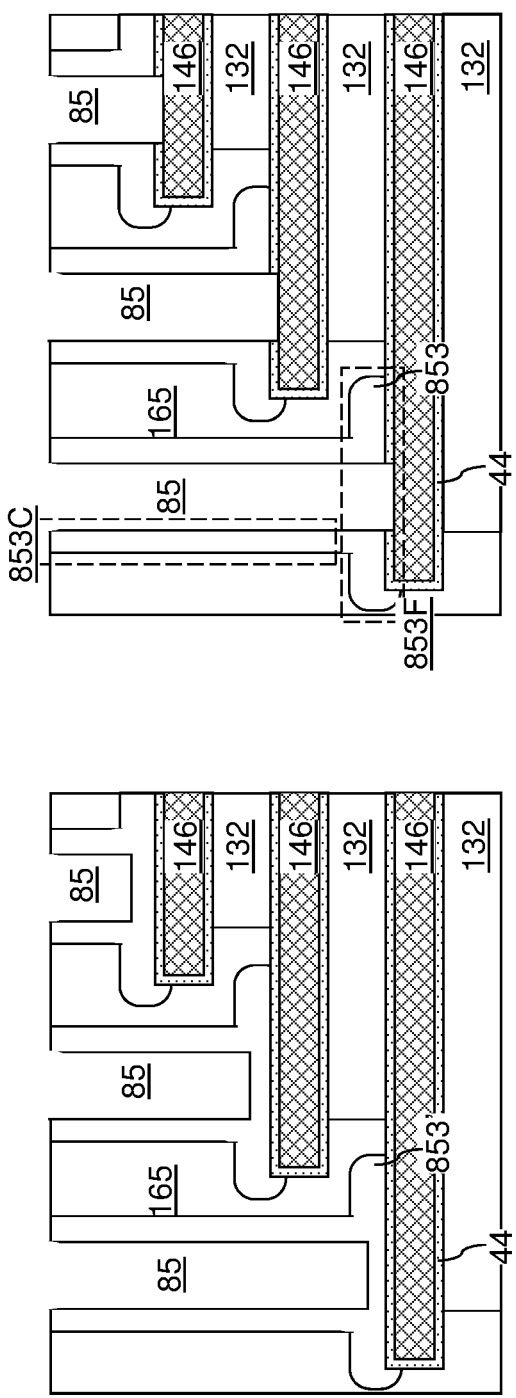
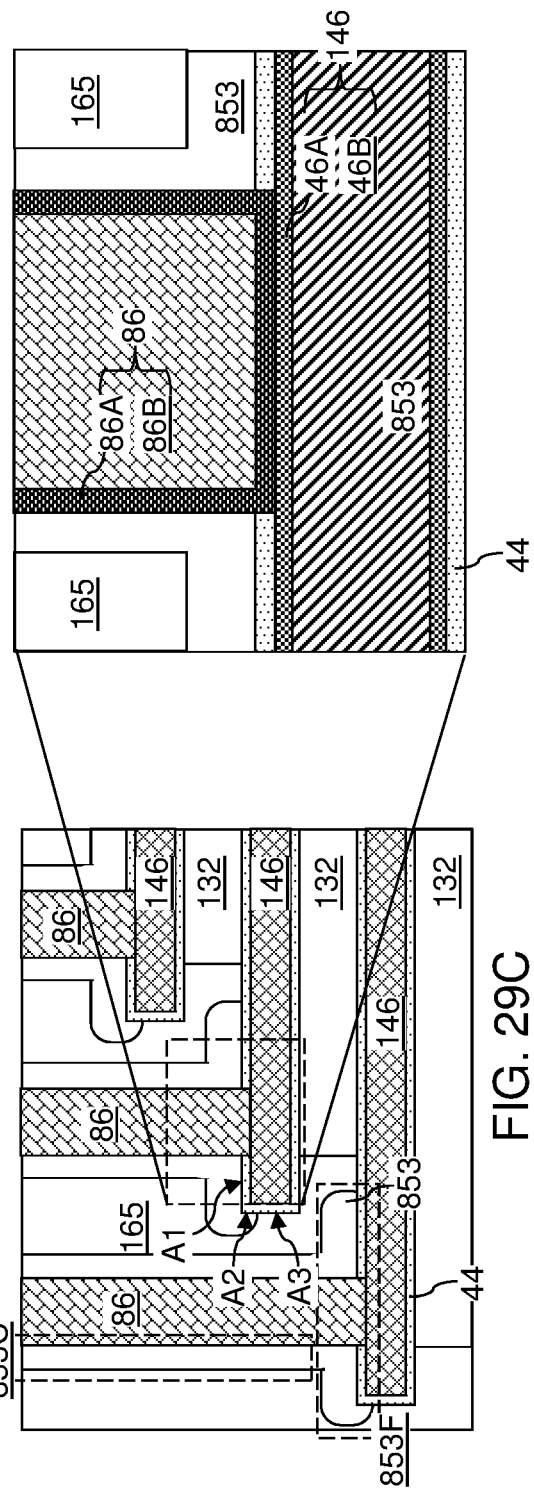
FIG. 29A
FIG. 29B
FIG. 29C

THREE-DIMENSIONAL MEMORY DEVICE CONTAINING REPLACEMENT CONTACT VIA STRUCTURES AND METHOD OF MAKING THE SAME

RELATED APPLICATIONS

The present application claims the benefit of priority from U.S. Provisional Application Ser. No. 62/640,776 filed on Mar. 9, 2018, the entire contents of which are incorporated herein by reference.

FIELD

The present disclosure relates generally to the field of semiconductor devices, and specifically to a three-dimensional memory device including replacement contact via structures and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a three-dimensional memory device is provided, which comprises A three-dimensional memory device, comprising: a first alternating stack of first insulating layers and first electrically conductive layers; memory stack structures vertically extending through each layer in the first alternating stack in a memory array region, wherein each of the memory stack structures comprises a memory film and a vertical semiconductor channel; a first retro-stepped dielectric material portion having first stepped surfaces overlying the first alternating stack in a staircase region, wherein each first electrically conductive layer includes an overhang region that protrudes farther into the first retro-stepped dielectric material portion than an underlying first insulating layer; and staircase-region contact via structures extending through the first retro-stepped dielectric material portion and contacting a respective one of the first electrically conductive layers.

According to another aspect of the present disclosure, a method of forming a three-dimensional memory device is provided, which comprises the steps of: forming a first alternating stack of first insulating layers and first sacrificial material layers over a substrate; forming first stepped surfaces by patterning the first alternating stack in a staircase region, wherein top surfaces of the first sacrificial material layers are physically exposed at the first stepped surfaces; forming sacrificial metal plates on the top surfaces of the first sacrificial material layers at the first stepped surfaces; forming a first retro-stepped dielectric material portion over the sacrificial metal plates; forming first contact via cavities through the first retro-stepped dielectric material portion employing the sacrificial metal plates as etch stop structures; forming sacrificial via fill structures within volumes of the first contact via cavities; replacing the first sacrificial material layers with material portions including first electrically conductive layers; and replacing the sacrificial via fill structures with portions of staircase-region contact via structures that contact the first electrically conductive layers.

BRIEF DESCRIPTION OF THE DRAWINGS

FIGS. 12A-12B illustrate sequential vertical cross-sectional views of a first-tier memory opening during expansion of an upper region of the first-tier memory opening according to an embodiment of the present disclosure.

FIGS. 19A-19D are sequential vertical cross-sectional views of an inter-tier memory opening during formation of a memory opening fill structure according to an embodiment of the present disclosure.

FIGS. 29A-29C are sequential vertical cross-sectional views of staircase-region contact via cavities during formation of staircase-region contact via structures according to an embodiment of the present disclosure.

DETAILED DESCRIPTION

Figure 1A:
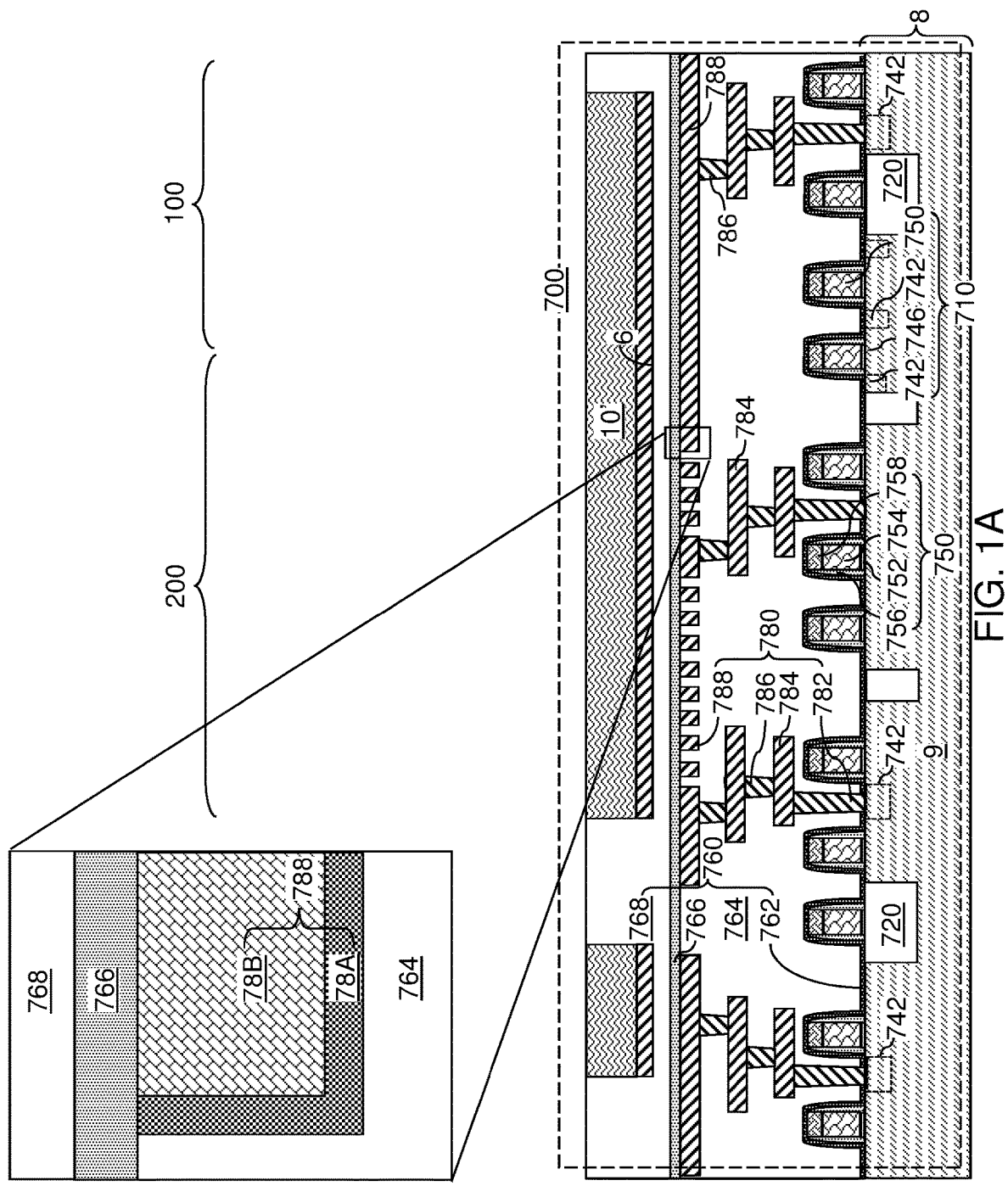
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

The total number of electrically conductive layers (e.g., word lines and select gate electrodes) increases with an increase in the areal device density of a three-dimensional memory device. However, an increase in the total number of the electrically conductive layers poses a new challenge in formation of contact via structures to the electrically conductive layers. In order to contain the total processing cost and process time during manufacture of a three-dimensional memory device, it is desirable to form all contact via structures to the electrically conductive layers in a single via etch process and a single via fill process. The increase in the total number of the electrically conductive layers within a layer stack increases the depth variations in the via cavities during the via etch process. Correspondingly, the probability of an etch-through to an underlying level resulting in an inter-level electrical short and/or the probability of an incomplete via etch process resulting in an electrical open between an electrically conductive layer and a contact via structure increases with the increase in the total number of the electrically conductive layers in an alternating stack.

According to one embodiment, a process using sacrificial metal plates located over the sacrificial material layers in the staircase region reduces or prevents overetch or underetch during via cavity formation. The embodiments of the present disclosure are directed to a three-dimensional memory device including replacement contact via structures and methods of making the same, the various aspects of which are described herein in detail. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
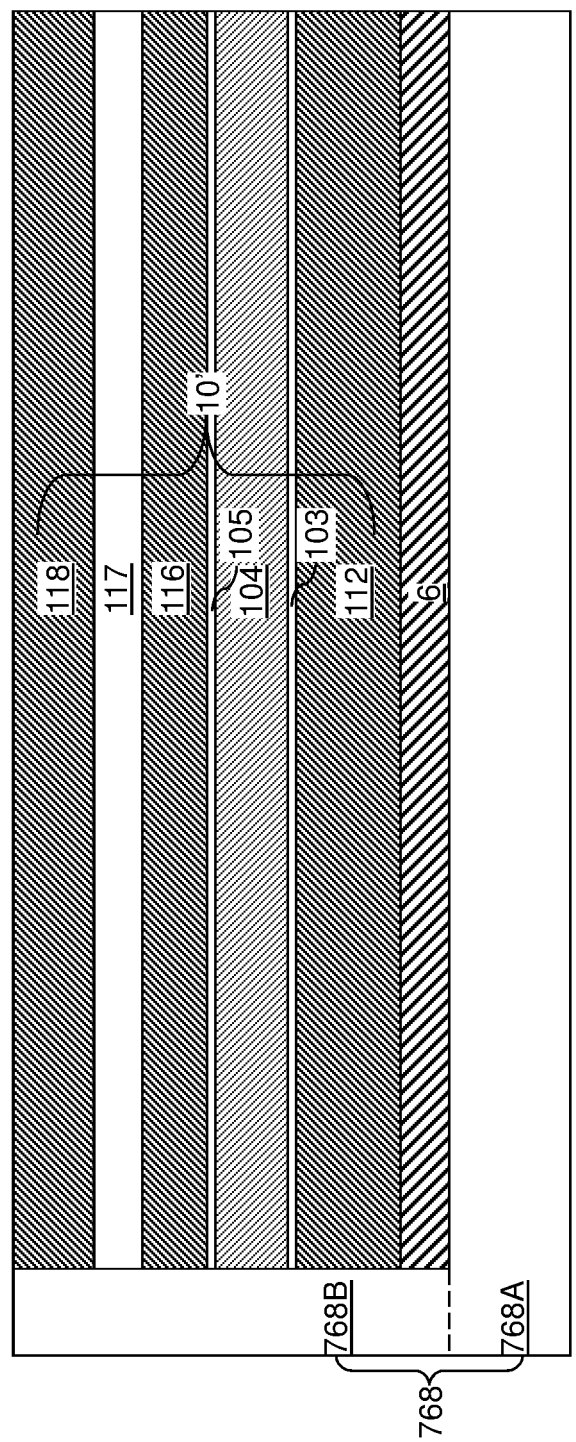
FIG. 1B is a magnified view of the in-process source level material layers of FIG. 1A.

Referring to FIGS. 1A and 1B, an exemplary structure according to the first embodiment of the present disclosure is illustrated. FIG. 1B is a magnified view of an in-process source-level material layers 10' illustrated in FIG. 1A. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower-level dielectric layers 760. The lower-level dielectric layers 760 constitute a dielectric layer stack in which each lower-level dielectric layer 760 overlies or underlies other lower-level dielectric layers 760. The lower-level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower-level dielectric layers 760 functions as a matrix for lower-level metal interconnect structures 780 that provide electrical wiring among the various nodes of the semiconductor devices and landing pads for through-stack contact via structures to be subsequently formed. The lower-level metal interconnect structures 780 are embedded within the dielectric layer stack of the lower-level dielectric layers 760, and comprise a lower-level metal line structure located under and optionally contacting a bottom surface of the silicon nitride layer 766.

For example, the lower-level metal interconnect structures 780 can be embedded within the at least one first dielectric material layer 764. The at least one first dielectric material layer 764 may be a plurality of dielectric material layers in which various elements of the lower-level metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and topmost lower-level metal line structures 788 that are configured to function as landing pads for through-stack contact via structures to be subsequently formed. In this case, the at least one first dielectric material layer 764 may be a plurality of dielectric material layers that are formed level by level while incorporating components of the lower-level metal interconnect structures 780 within each respective level. For example, single damascene processes may be employed to form the lower-level metal interconnect structures 780, and each level of the lower-level metal via structures 786 may be embedded within a respective via level dielectric material layer and each level of the lower-level metal line structures (784, 788) may be embedded within a respective line level dielectric material layer. Alternatively, a dual damascene process may be employed to form integrated line and via structures, each of which includes a lower-level metal line structure and at least one lower-level metal via structure.

The topmost lower-level metal line structures 788 can be formed within a topmost dielectric material layer of the at least one first dielectric material layer 764 (which can be a plurality of dielectric material layers). Each of the lower-level metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower-level metal line structures 788 and the topmost surface of the at least one first dielectric material layer 764 may be planarized by a planarization process, such as chemical mechanical planarization. In this case, the top surfaces of the topmost lower-level metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower-level metal line structures 788 and the topmost surface of the at least one first dielectric material layer 764. Alternatively, a portion of the first dielectric material layer 764 can be located on the top surfaces of the topmost lower-level metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a in-process source-level material layers 10'. The optional planar conductive material layer 6, if present, provides a high conductivity conduction path for electrical current that flows into, or out of, the in-process source-level material layers 10'. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. The planar conductive material layer 6 may function as a special source line in the completed device. In addition, the planar conductive material layer 6 may comprise an etch stop layer and may comprise any suitable conductive, semiconductor or insulating layer. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed.

As shown in FIG. 1B, the in-process source-level material layers 10' can include various layers that are subsequently modified to form source-level material layers. The source-level material layers, upon formation, include a buried source layer that functions as a common source region for vertical field effect transistors of a three-dimensional memory device. In one embodiment, the in-process source-level material layer 10' can include, from bottom to top, a lower source layer 112, a lower sacrificial liner 103, a source-level sacrificial layer 104, an upper sacrificial liner 105, an upper source layer 116, a source-level insulating layer 117, and an optional source-select-level conductive layer 118.

The lower source layer 112 and the upper source layer 116 can include a doped semiconductor material such as doped polysilicon or doped amorphous silicon. The conductivity type of the lower source layer 112 and the upper source layer 116 can be the opposite of the conductivity of vertical semiconductor channels to be subsequently formed. For example, if the vertical semiconductor channels to be subsequently formed have a doping of a first conductivity type, the lower source layer 112 and the upper source layer 116 have a doping of a second conductivity type that is the opposite of the first conductivity type. The thickness of each of the lower source layer 112 and the upper source layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional planar conductive material layer 6 and the in-process source-level material layers 10' may be patterned to provide openings in areas in which through-stack contact via structures and through-dielectric contact via structures are to be subsequently formed. Patterned portions of the stack of the planar conductive material layer 6 and the in-process source-level material layers 10' are present in each memory array region 100 in which three-dimensional memory stack structures are to be subsequently formed. The at least one second dielectric material layer 768 can include a blanket layer portion 768A underlying the planar conductive material layer 6 and the in-process source-level material layers 10' and a patterned portion 768B that fills gaps among the patterned portions of the planar conductive material layer 6 and the in-process source-level material layers 10'.

Openings in the optional planar conductive material layer 6 and the in-process source-level material layers 10' can be formed within the area of a staircase region 200 in which contact via structures contacting word line electrically conductive layers are to be subsequently formed. In one embodiment, additional openings in the optional planar conductive material layer 6 and the in-process source-level material layers 10' can be formed within the area of a memory array region 100, in which a three-dimensional memory array including memory stack structures is to be subsequently formed. A peripheral device region 400 that is subsequently filled with a field dielectric material portion can be provided adjacent to the staircase region 200.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are embedded in the lower-level dielectric layers 760.

The lower-level metal interconnect structures 780 can be electrically shorted to active nodes (e.g., transistor active regions 742 or gate electrodes 754) of the semiconductor devices 710 (e.g., CMOS devices), and are located at the level of the lower-level dielectric layers 760. Through-stack contact via structures can be subsequently formed directly on the lower-level metal interconnect structures 780 to provide electrical connection to memory devices to be subsequently formed. In one embodiment, the pattern of the lower-level metal interconnect structures 780 can be selected such that the topmost lower-level metal line structures 788 (which are a subset of the lower-level metal interconnect structures 780 located at the topmost portion of the lower-level metal interconnect structures 780) can provide landing pad structures for the through-stack contact via structures to be subsequently formed.

Figure 2:
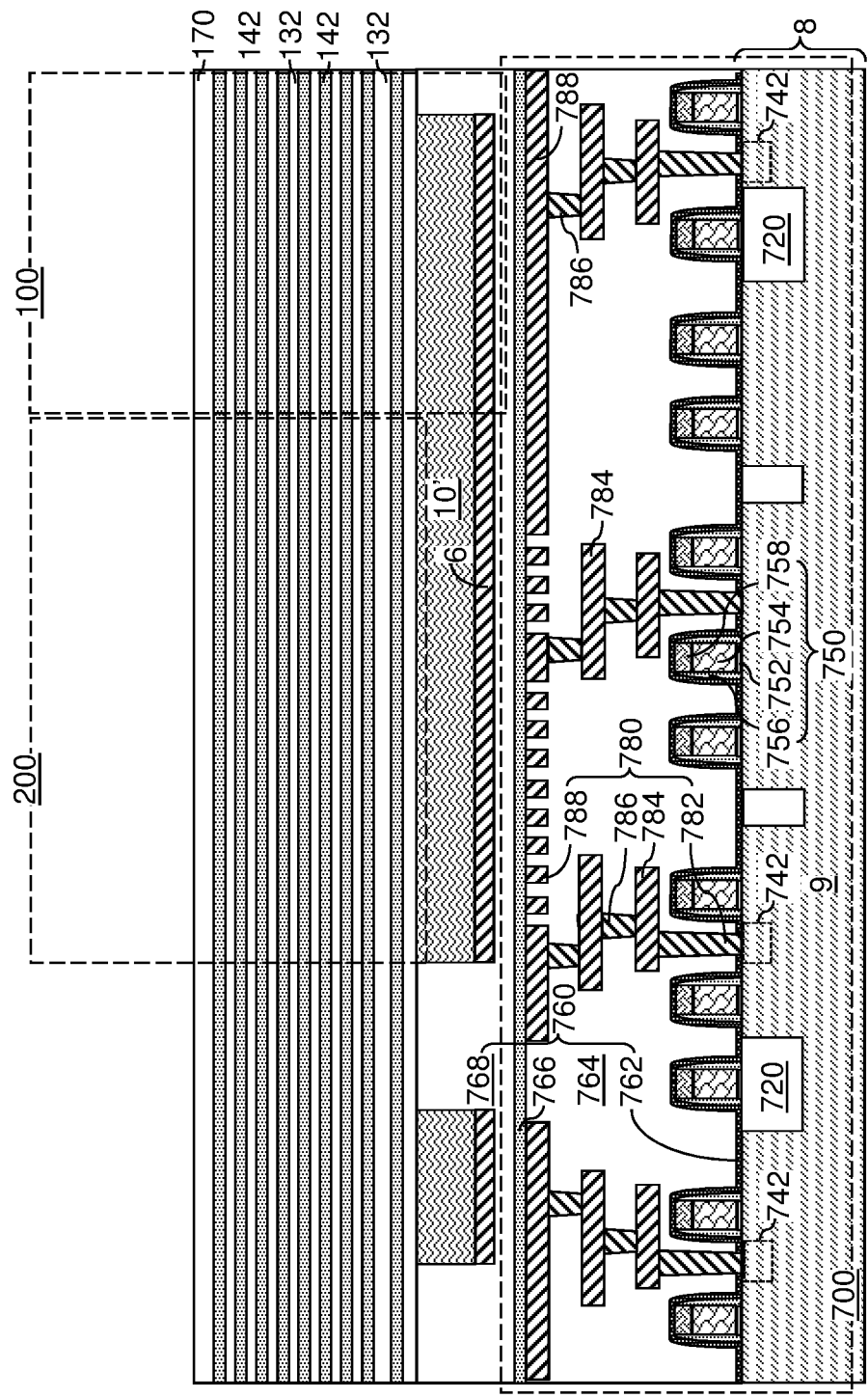
FIG. 2 is a vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
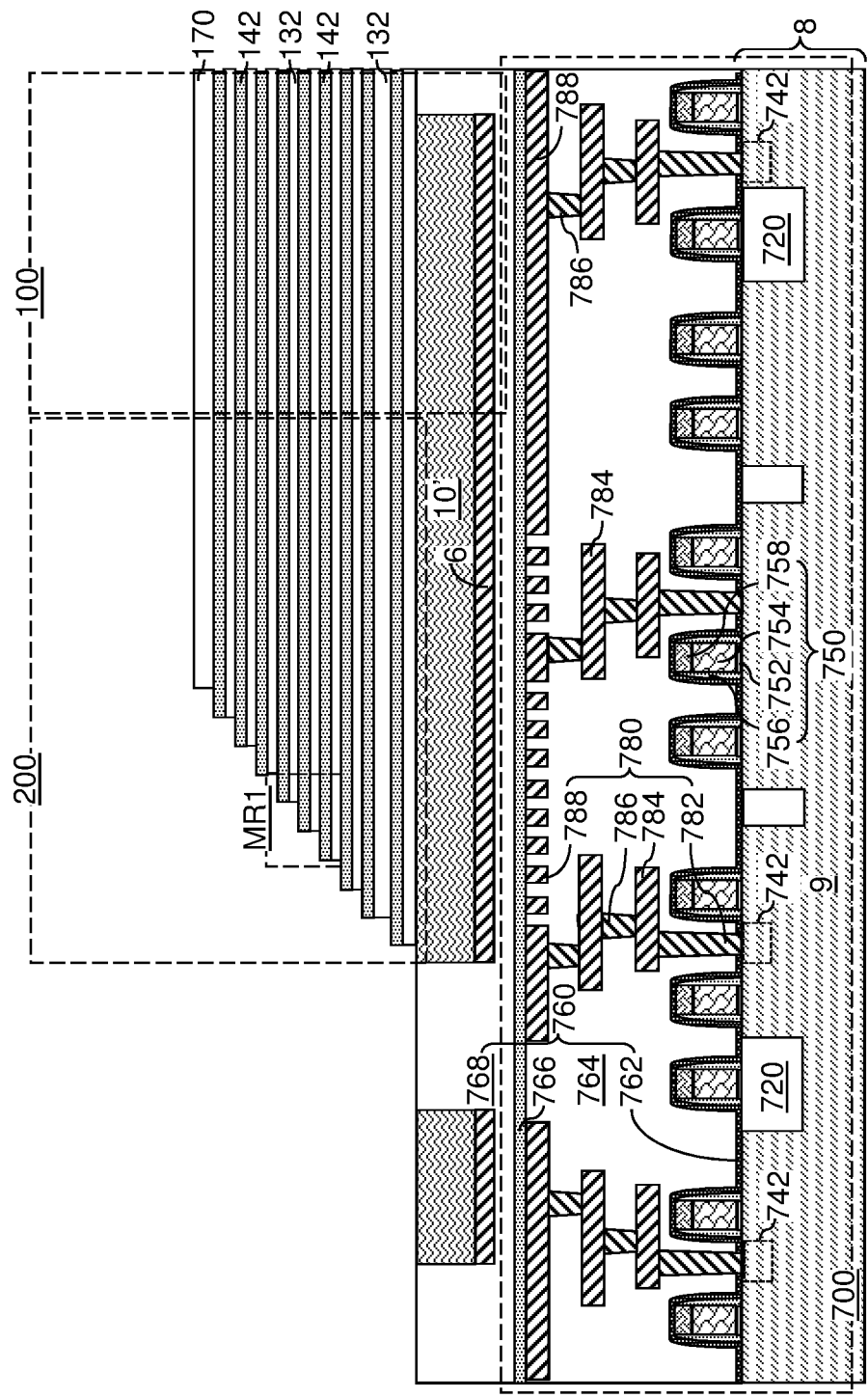
FIG. 3 is a vertical cross-sectional view of the exemplary structure after patterning a first-tier staircase region on the first-tier alternating stack according to an embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

FIGS. 4A-4E are sequential vertical cross-sectional views of a region MR1 of the first stepped surfaces of the exemplary structure during formation of sacrificial metal plates according to an embodiment of the present disclosure.

Figure 4A:
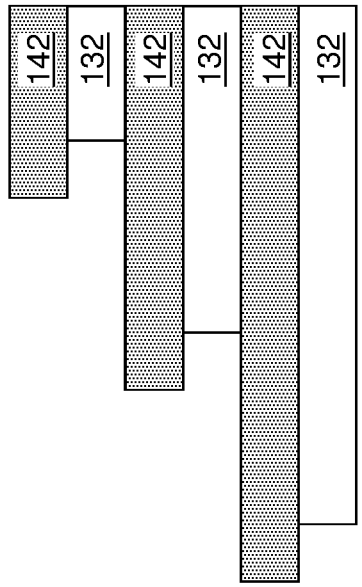
FIGS. 4A-4E are sequential vertical cross-sectional views of a region of the first stepped surfaces of the exemplary structure during formation of sacrificial metal plates according to an embodiment of the present disclosure.

Referring to FIG. 4A, the region MR1 of the first stepped surfaces of the exemplary structure is illustrated after the processing steps of FIG. 3.

Figure 4B:
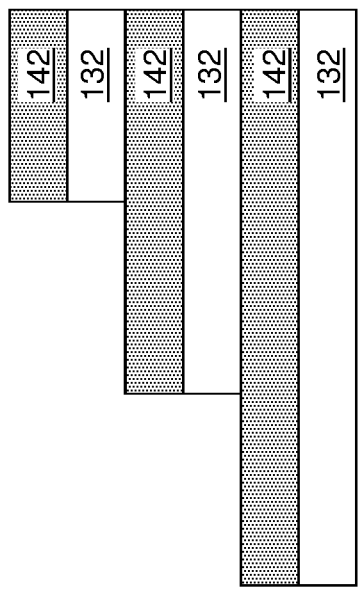

Referring to FIG. 4B, sidewalls of the first insulating layers 132 are laterally recessed selective to sidewalls of the first sacrificial material layers 142. An isotropic etch process that etches the material of the first insulating layers 132 selective to the material of the first sacrificial material layers 142 can be employed. For example, if the first insulating layers 132 comprise silicon oxide and if the first sacrificial material layers 142 comprise silicon nitride, a wet etch process employing hydrofluoric acid can be employed to laterally recess the sidewalls of the first insulating layers 132 selective to the first sacrificial material layers 142. The lateral recess distance may be in a range from 20 nm to 200 nm, such as from 40 nm to 100 nm, although lesser and greater lateral etch distances can also be employed. Each first sacrificial material layer 142 can include an overhang region that protrudes laterally from a sidewall of an underlying first insulating layer 132.

Figure 4C:
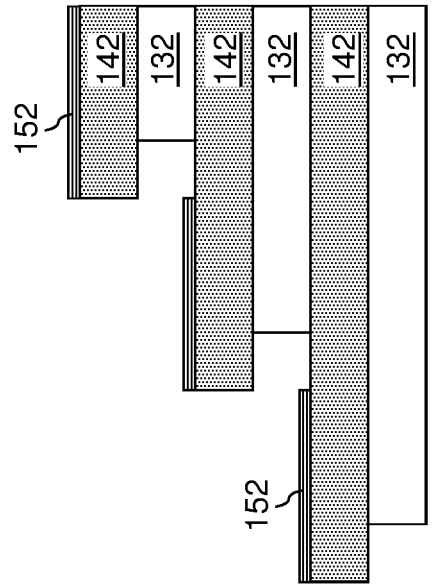

Referring to FIG. 4C, a first metallic material can be anisotropically deposited on physically exposed surfaces of the first sacrificial material layers 142 without depositing the first metallic material on the laterally recessed sidewalls of the first insulating layers 132 to form first metallic material portions 152. The first metallic material is a material that can be etched by a wet etch process selective to the materials of the first insulating layers 132 and the first sacrificial material layers 142. For example, the first metallic material can include tungsten, titanium, tantalum, or molybdenum. An anisotropic deposition process can be employed to deposit the first metallic material. For example, physical vapor deposition (PVD) or vacuum evaporation can be employed to deposit the first metallic material. The thickness of the horizontal portions of the deposited first metallic material can be greater than the thickness of the vertical portions of the deposited first metallic material by a factor of 2 or more. The thickness of the horizontal portions of the deposited first metallic material may be in a range from 5 nm to 30 nm, although lesser and greater thicknesses can also be employed. The first metallic material portions 152 can have inverted L-shapes.

Figure 4D:
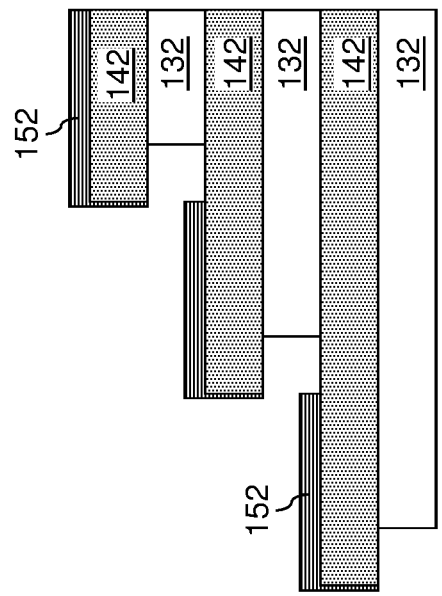

Referring to FIG. 4D, the first metallic material portions 152 can be isotropically etched by an isotropic etch process. For example, a wet etch process that etches the first metallic material selective to the materials of the first insulating layers 132 and the first sacrificial material layers 142 can be employed. In an illustrative example, the first metallic material comprises tungsten, and the isotropic etch process can include a wet etch process employing a mixture of hydrochloric acid and nitric acid, sulfuric acid, nitric acid, and/or a mixture of hydrofluoric acid and nitric acid. The duration of the isotropic etch process can be selected such that vertical portions of the first metallic material is completely removed from sidewalls of the first sacrificial material layers 142, while thinned horizontal portions of the first metallic material are present on top surfaces of the first sacrificial material layers 142. The thinned first metallic material portions 152 can have the shapes of planar plates having a uniform thickness throughout.

Figure 4E:
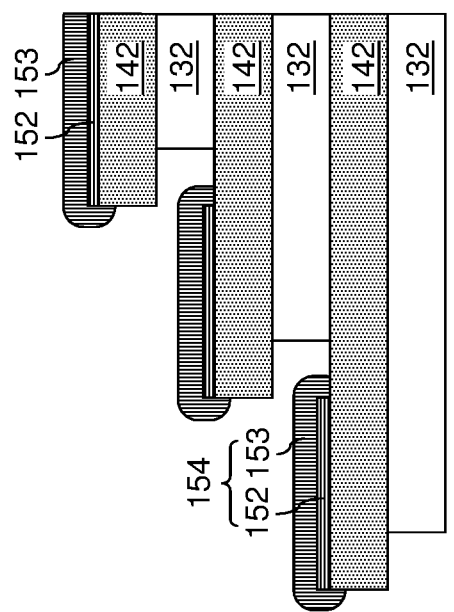

Referring to FIG. 4E, a second metallic material can be selectively grown from physically exposed surfaces of the remaining portions of first metallic material without growing the second metallic material from surfaces of the first insulating layers 132 and the first sacrificial material layers 142 by a selective deposition process. The second metallic material can include a metallic material that does not nucleate on dielectric surfaces and grows only from metallic surfaces. For example, the second metallic material can include tungsten, cobalt, ruthenium, or molybdenum. Second metallic material portions 153 are formed on the first metallic material portions 152. The thickness of the second metallic material portions 153 can be in a range from 5 nm to 40 nm, such as from 10 nm to 20 nm, although lesser and greater thicknesses can also be employed.

Sacrificial metal plates 154 are formed on the top surfaces of the first sacrificial material layers 142 at the first stepped surfaces. Each sacrificial metal plate 154 can include grown portions of the second metallic material, i.e., a second metallic material portion 153, and a remaining portion of the first metallic material after the isotropic etch process, i.e., a first metallic material portion 152. The height of each sacrificial metal plate 154 can be less than the height of each first insulating layer 132. For example, the height of each sacrificial metal plate 154 can be in a range from 10 nm to 40 nm, although lesser and greater thicknesses can also be employed.

Figure 5:
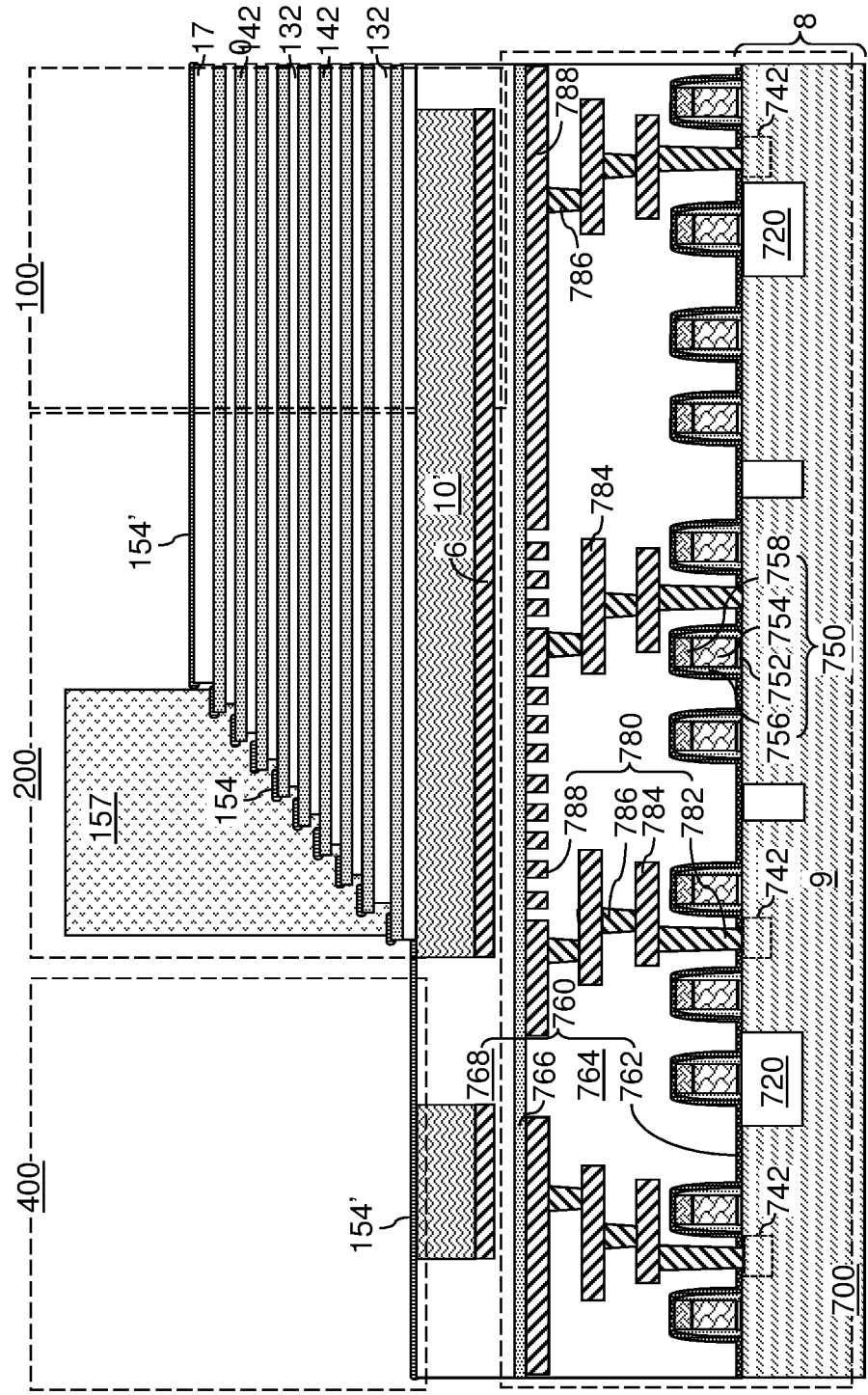
FIG. 5 is a vertical cross-sectional view of the exemplary structure after application and patterning of an etch mask layer according to an embodiment of the present disclosure.

Referring to FIG. 5, the first and second metallic materials can be deposited outside the first stepped surfaces concurrently with formation of the sacrificial metal plates 154, i.e., during the processing steps of FIGS. 4B-4E. The region in which the first alternating stack (132, 142) is not present is herein referred to as a peripheral device region 400. Sacrificial metal layers 154' are formed on top of the first insulating cap layer 170 and on the physically exposed horizontal surfaces of the at least one second dielectric material layer 768 and the in-process source-level material layers 10' located in the peripheral device region 400 outside the memory array region 100 and the staircase region 200. A photoresist layer 157 can be applied over the exemplary structure, and can be lithographically patterned to cover the first stepped surfaces without covering the sacrificial metal layers 154'. An etch process, such as a wet etch process, can be performed to remove the sacrificial metal layers 154' while the patterned photoresist layer 157 covers and protects the sacrificial metal plates 154. For example, if the first metallic material and the second metallic material comprise tungsten, and the isotropic etch process can include a wet etch process employing a mixture of hydrochloric acid and nitric acid, sulfuric acid, nitric acid, and/or a mixture of hydrofluoric acid and nitric acid. The photoresist layer 157 can be subsequently removed, for example, by ashing.

Figure 6:
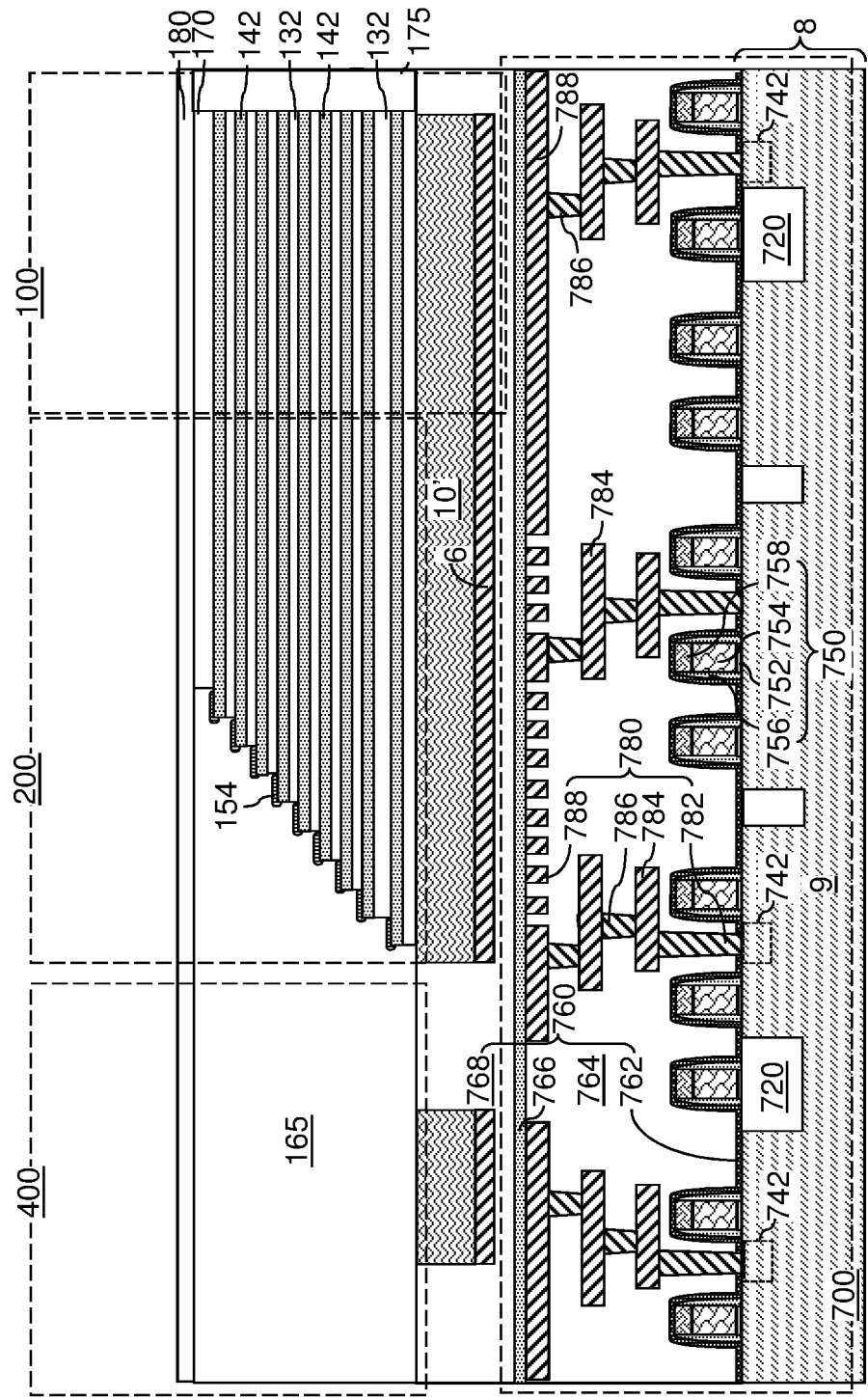
FIG. 6 is a vertical cross-sectional view of the exemplary structure after formation of a first retro-stepped dielectric material portion, first dielectric pillar portions, and an inter-tier dielectric layer according to an embodiment of the present disclosure.

Referring to FIG. 6, openings including substantially vertical straight sidewalls can be formed through the first-tier alternating stack (132, 142), for example, by applying a photoresist layer (not shown) and forming openings in the memory array region 100, and by transferring the pattern of the openings in the photoresist layer through the first alternating stack (132, 142) by an anisotropic etch process. A top surface of the at least one second dielectric layer 768 can be physically exposed at the bottom of each opening through the first-tier alternating stack (132, 142). The photoresist layer can be removed, for example, by ashing.

A dielectric fill material (such as undoped silicate glass or doped silicate glass) can be deposited to fill the openings in the memory array region 100 and the first stepped cavity. Excess portions of the dielectric fill material can be removed from above the horizontal plane including the top surface of the first insulating cap layer 170. Remaining portions of the dielectric fill material filling the openings in the memory array region 100 constitute first dielectric pillar portions 175. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142), the first dielectric pillar portions 175, and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165, 175). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 7:
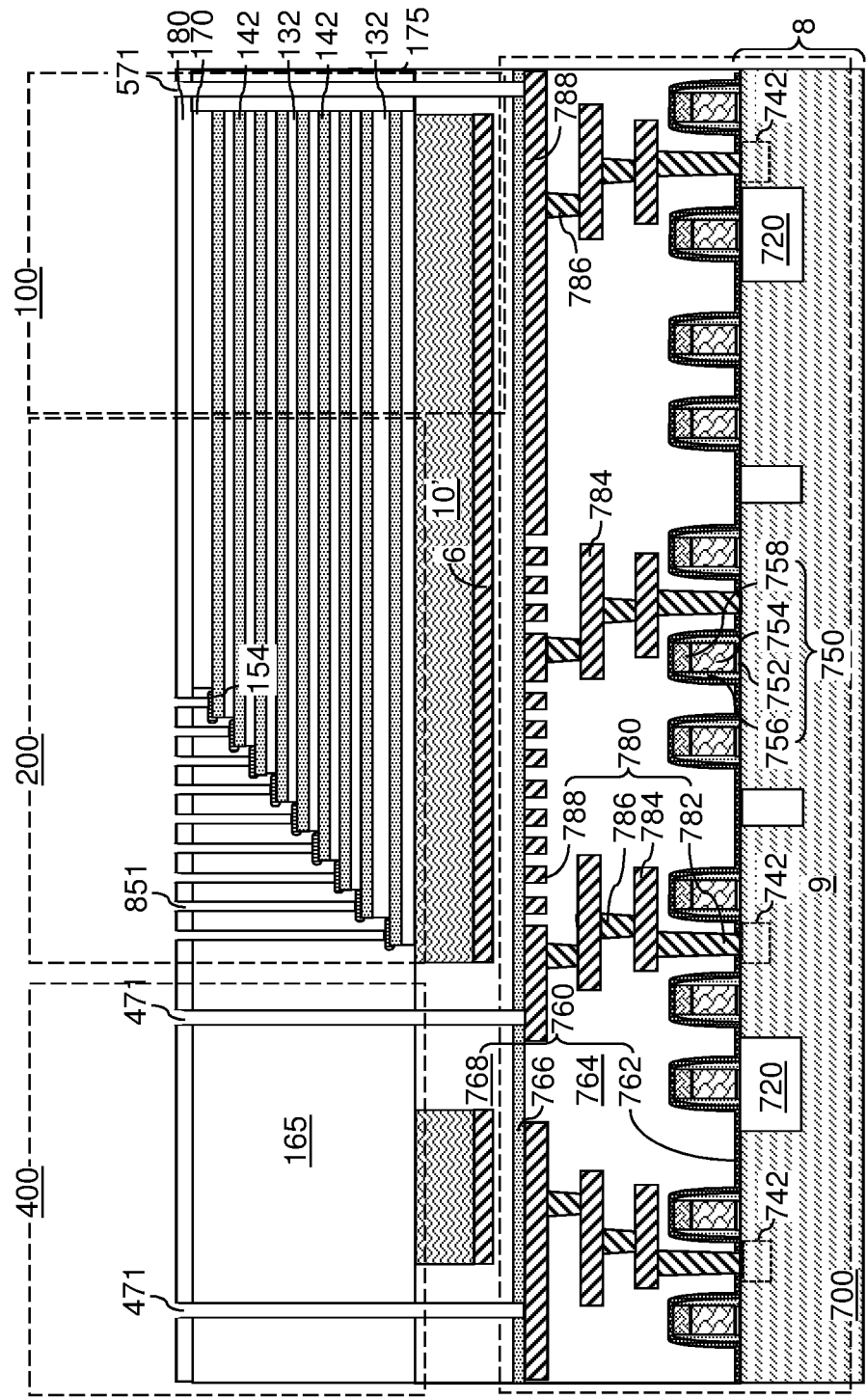
FIG. 7 is a vertical cross-sectional view of the exemplary structure after formation of first staircase-region contact via cavities, first peripheral-region via cavities, and first array-region via cavities according to an embodiment of the present disclosure.

Referring to FIG. 7, various first contact via cavities (851, 471, 571) are formed through the inter-tier dielectric layer 180 and the first-tier structure (132, 142, 170, 165, 175). For example, a photoresist layer (not shown) can be applied over the inter-tier dielectric layer 180, and can be lithographically patterned by exposure and development to form openings therein. The pattern of the openings in the photoresist layer can be transferred through the underlying portions of the inter-tier dielectric layer 180 and various portions of the first-tier structure (132, 142, 170, 165, 175) by an anisotropic etch process to form the various first contact via cavities (851, 471, 571). The locations of the various via cavities (471, 571) and 851 are selected such that each of the first contact via cavities (471, 571) and 851 is formed over a respective metallic material portion (788, 154) such as a topmost lower metal line structure 788 or a sacrificial metal plate 154, respectively. The metallic material portion (788, 154) can function as an etch stop structure. Thus, various first contact via cavities (851, 471, 571) having different depths can be formed by a same anisotropic etch process.

The first contact via cavities (851, 471, 571) includes first staircase-region contact via cavities 851, first peripheral-region via cavities 471, and first array-region via cavities 571. The first staircase-region contact via cavities 851 can extend to a top surface of a respective one of the sacrificial metal plates 154. Thus, each first staircase-region contact via cavities 851 can be formed on a horizontal step of the first stepped surfaces located between a neighboring pair of vertical steps S of the first stepped surfaces. The first peripheral-region via cavities 471 can extend through the first retro-stepped dielectric material portion 165 and the at least one second dielectric layer 768 to a top surface a respective one of the topmost lower metal line structures 788. The first array-region via cavities 571 can vertically extend through the first dielectric pillar portions 175 and the at least one second dielectric layer 768 to a top surface a respective one of the topmost lower metal line structures 788. In one embodiment, remaining portions of the first dielectric pillar portions 175 can have substantially vertical straight sidewalls at the periphery. The photoresist layer can be subsequently removed, for example, by ashing.

Figure 8:
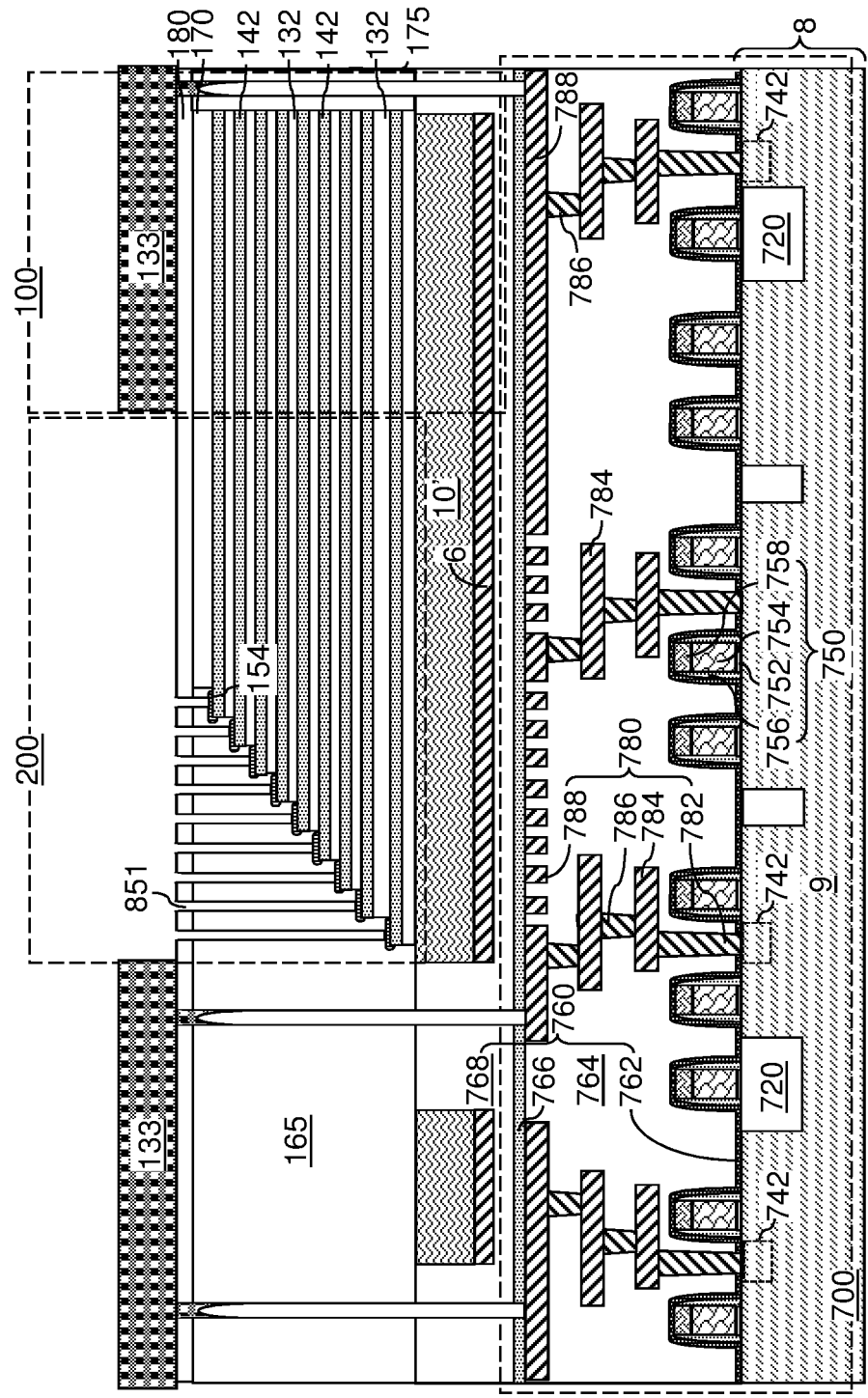
FIG. 8 is a vertical cross-sectional view of the exemplary structure after formation of a patterning film that covers the first peripheral-region via cavities and the first array-region via cavities according to an embodiment of the present disclosure.

Referring to FIG. 8, a patterning film 133 can be anisotropically applied over the exemplary structure. The patterning film 133 non-conformally covers the various first contact via cavities (851, 471, 571) such that the thickness of the patterning film 133 decreases rapidly with vertical distance from the horizontal plane including the top surface of the inter-tier dielectric layer 180 within each of the first contact via cavities (851, 471, 571). The patterning film 133 includes a carbon-based material such as amorphous carbon, diamond-like carbon (DLC), or an inorganic compound including carbon. For example, Advanced Patterning Film (APF) by Applied Materials, Inc™ may be employed, alone or in combination with a dielectric anti-reflective coating. The portions of the patterning film 133 in the staircase region 200 can be removed by lithographic patterning. For example, a photoresist layer (not shown) can be applied over the patterning film 133, and can be patterned by lithographic exposure and development. Unmasked portions of the patterning film 133 in the staircase region 200 can be removed by etching. The photoresist layer can be subsequently removed selective to the patterning film 133. The patterning film 133 covers the first peripheral-region via cavities 471 and the first array-region via cavities 571.

FIGS. 9A-9D illustrate a region of the first stepped surfaces of the exemplary structure during formation of insulating spacer layers 853' and staircase-region sacrificial via fill structures 854.

Figure 9A:
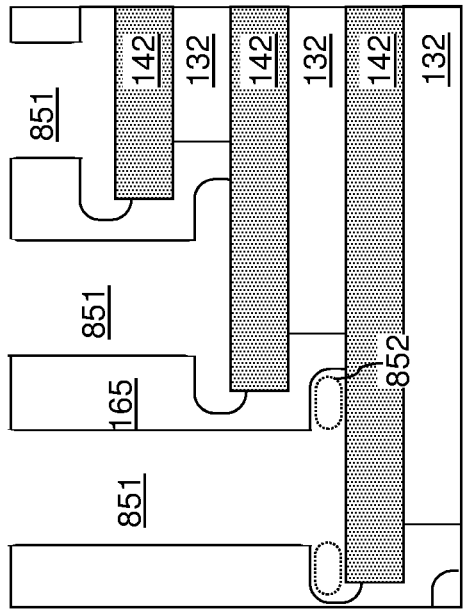
FIGS. 9A-9D are sequential vertical cross-sectional views of a region of the first stepped surfaces of the exemplary structure during formation of insulating spacer layers according to an embodiment of the present disclosure.

Referring to FIG. 9A, top surfaces of the sacrificial metal plates 154 are physically exposed underneath each first staircase-region contact via cavities 851.

Figure 9B:
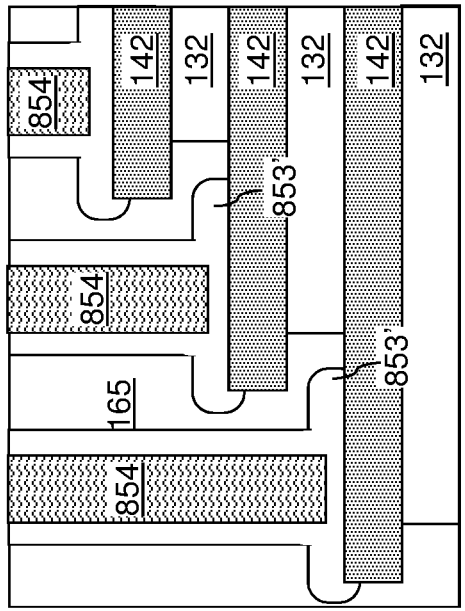

Referring to FIG. 9B, an isotropic etch process is performed to remove the sacrificial metal plates 154. The isotropic etch process has etch chemistry that removes the material of the sacrificial metal plates 154 selective to the materials of the first sacrificial material layers 142 and the first insulating layers 132. For example, if the sacrificial metal plates 154 include tungsten, the isotropic etch process can be a wet etch process employing a mixture of hydrochloric acid and nitric acid, sulfuric acid, nitric acid, and/or a mixture of hydrofluoric acid and nitric acid. The isotropic etch process removes the sacrificial metal plates 154 through the first staircase-region contact via cavities 851 (which are also referred to as first contact via cavities). Bottom portions of each staircase-region contact via cavity 851 can be laterally expanded to include a respective annular cavity region 852.

Figure 9C:
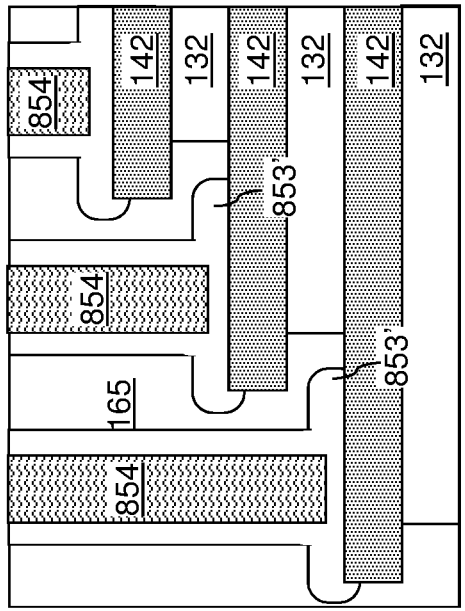

Referring to FIG. 9C, an insulating spacer layer 853' can be formed in the first staircase-region contact via cavities 851 by conformally depositing a dielectric material at a bottom surface and around a periphery of each of the first staircase-region contact via cavities 851. The insulating spacer layer 853' includes a dielectric material that is different from the material of the first sacrificial material layers 142. For example, the insulating spacer layer 853' can include a silicon oxide material formed by thermal decomposition of tetraethylorthosilicate (TEOS), which is commonly referred to as TEOS oxide. The thickness of the insulating spacer layer 853' can be selected such that the annular cavity regions 852 of the first staircase-region contact via cavities 851 are filled within the insulating spacer layers 853'. The insulating spacer layer 853' can contact horizontal surfaces of the first sacrificial material layers 42 and an upper portion of a sidewall of each first sacrificial material layer 142. An unfilled volume 851' is present within each of the first staircase-region contact via cavities 851.

Figure 9D:
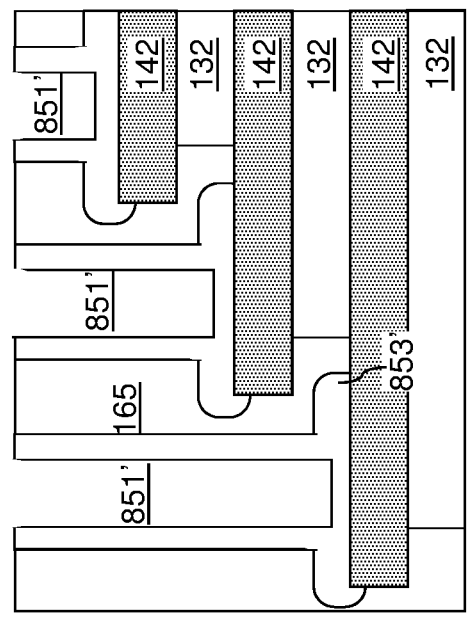
Figure 10:
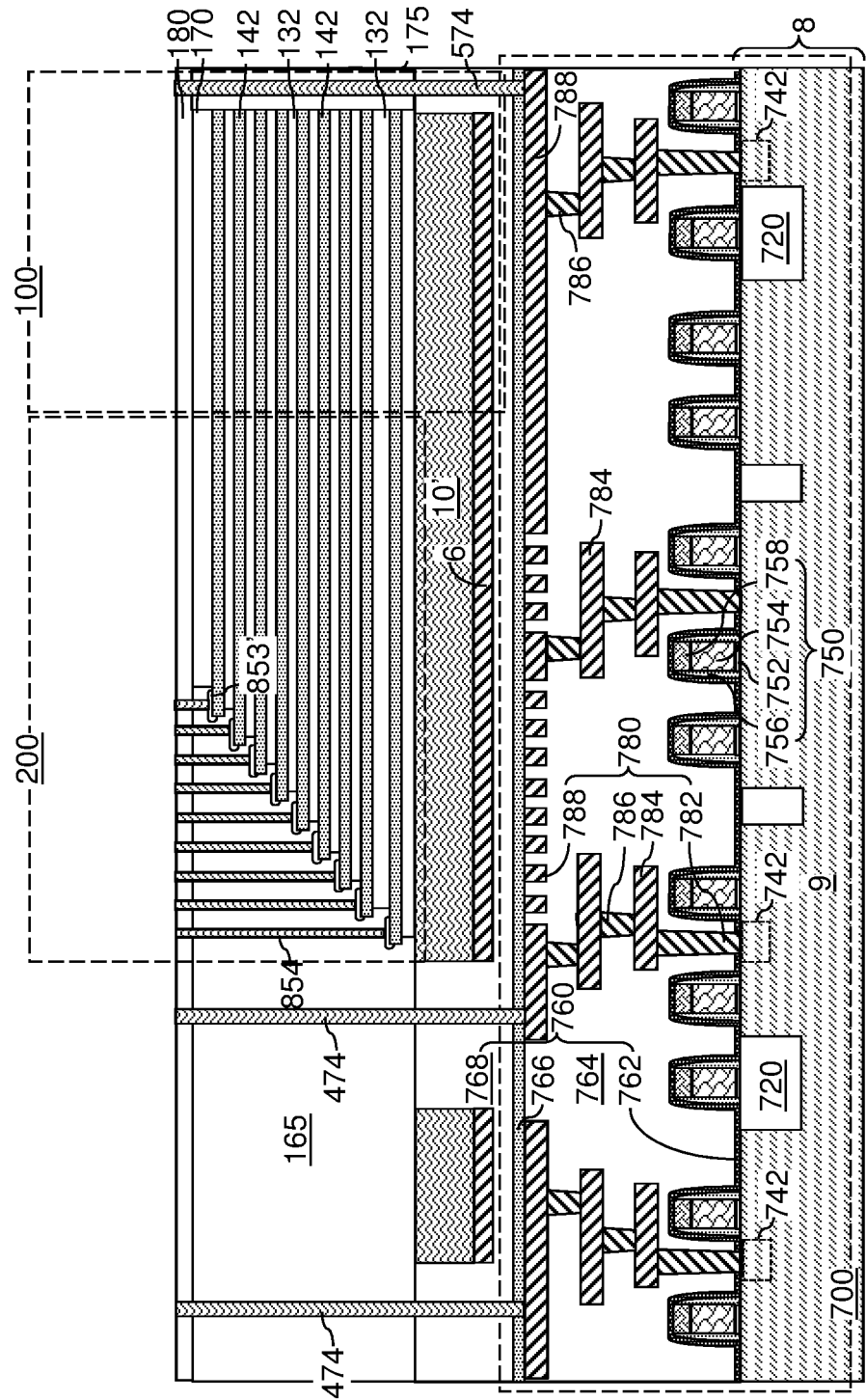
FIG. 10 is a vertical cross-sectional view of the exemplary structure at the processing steps of FIG. 9D.

Referring to FIGS. 9D and 10, the patterning film 133 can be removed, for example, by ashing. The first peripheral-region via cavities 471 and the first array-region via cavities 571 are physically exposed after removal of the patterning film 133.

A sacrificial fill material can be deposited in the unfilled volumes 851' of the first staircase-region contact via cavities 851, the first peripheral-region via cavities 471, and the first array-region via cavities 571. The sacrificial fill material is a material that can be removed selective to the materials of the insulating spacer layer 853', the dielectric pillar portions 175, and the first retro-stepped dielectric material portion 165 in a subsequent processing step. For example, the sacrificial fill material can include silicon (such as amorphous silicon or polysilicon), a silicon-germanium alloy, amorphous carbon or diamond-like carbon (DLC), organosilicate glass, or a silicon-based polymer. Excess portion of the sacrificial fill material can be removed from above the horizontal plane including the top surface of the inter-tier dielectric layer 180 by a planarization process (such as a reactive ion etch process or chemical mechanical planarization (CMP)).

Each remaining portion of the sacrificial fill material constitutes a sacrificial via fill structure (854, 474, 574). Specifically, each staircase-region contact via cavity 851 can be filled with a combination of a remaining portion of the insulating spacer layer 853' and a staircase-region sacrificial via fill structure 854. The bottom surface of each staircase-region sacrificial via fill structure 854 can be vertically spaced from an underlying one of the first sacrificial material layer 142 by a planar remaining portion of the insulating spacer layer 853'. Each remaining portion of the sacrificial fill material in the first peripheral-region via cavities 471 constitutes a peripheral-region sacrificial via fill structure 474. Each remaining portion of the sacrificial fill material in the first array-region via cavities 571 constitutes an array-region sacrificial via fill structure 574.

Figure 11A:
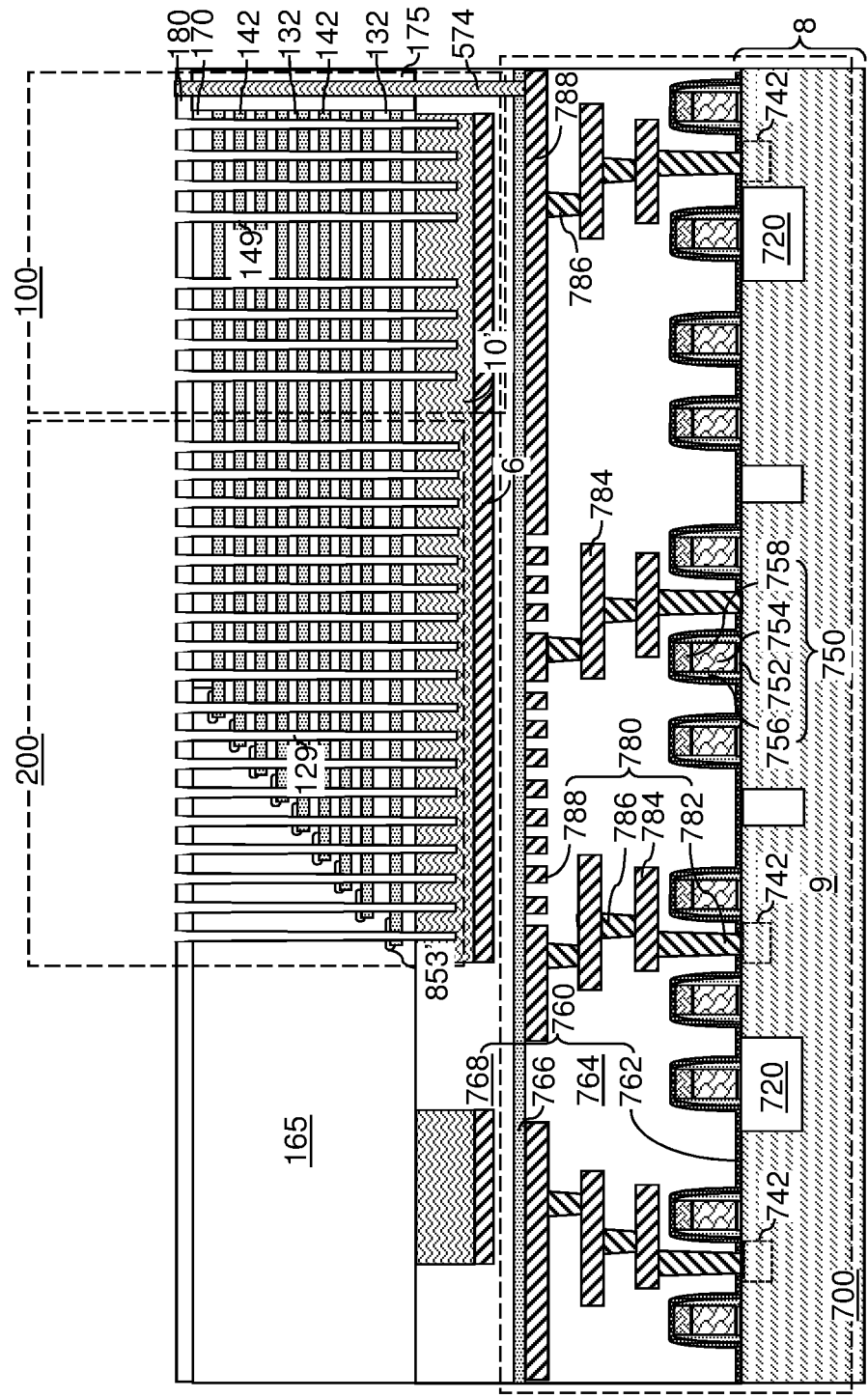
FIG. 11A is a vertical cross-sectional view of the exemplary structure after formation of first-tier memory openings and first-tier support openings according to an embodiment of the present disclosure.
Figure 11B:
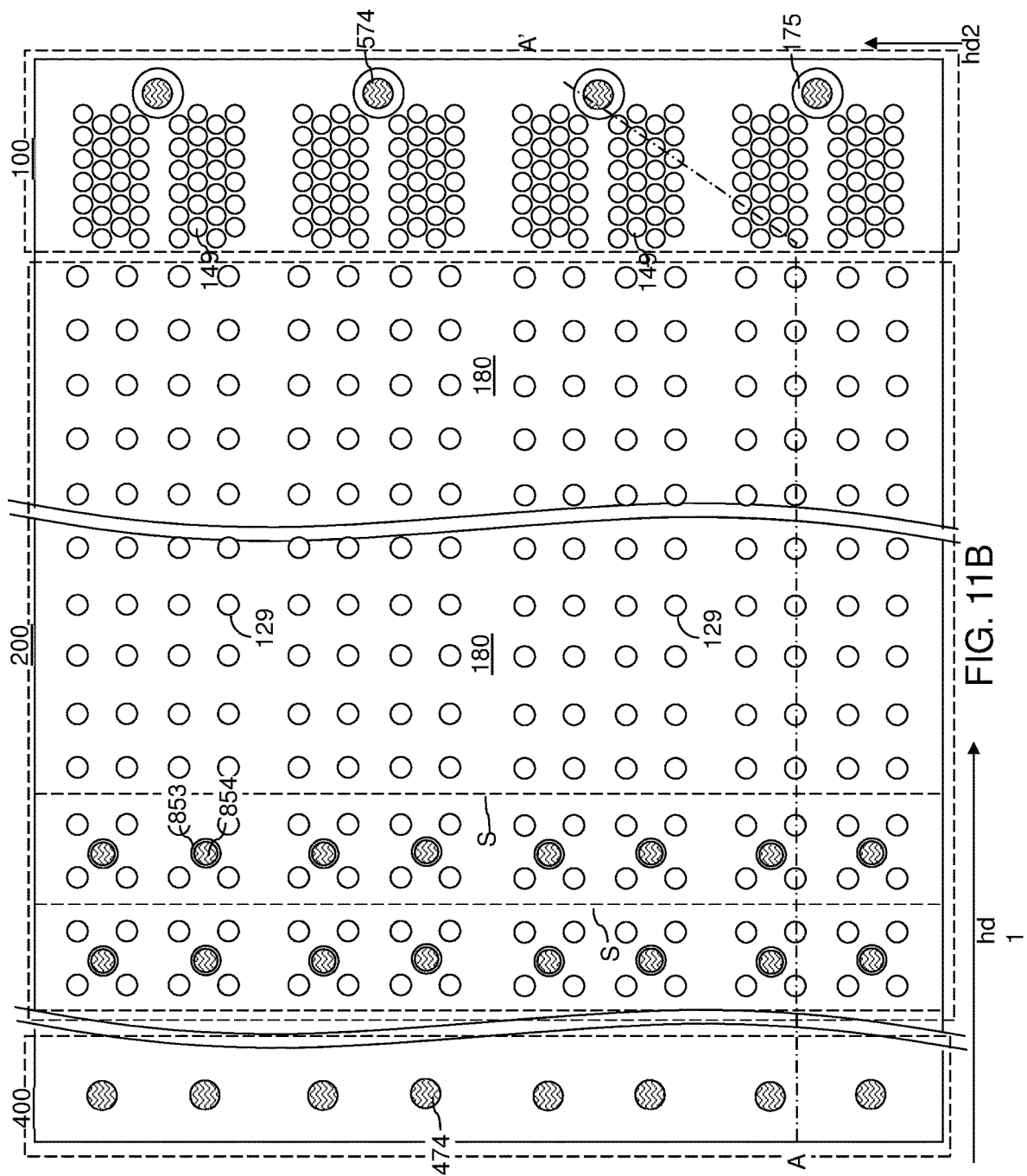
FIG. 11B is a top-down view of the exemplary structure of FIG. 11A. The hinged vertical plane A-A' corresponds to the plane of the vertical cross-sectional view of FIG. 11A.

Referring to FIGS. 11A and 11B, first-tier memory openings 149 and first tier support openings 129 can be formed. The first-tier memory openings 149 and the first-tier support openings 129 extend through the first-tier alternating stack (132, 142) at least to a top surface of the lower source layer 112 within the in-process source level layers 10'. The first-tier memory openings 149 can be formed in the memory array region 100 at locations at which memory stack structures including vertical stacks of memory elements are to be subsequently formed. The first-tier support openings 129 can be formed in the staircase-region contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 129. In other words, the transfer of the pattern in the patterned lithographic material stack through the first insulating cap layer 170 and the first-tier alternating stack (132, 142) forms the first-tier memory openings 149 and the first-tier support openings 129.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the first-tier support openings 129 can be substantially vertical, or can be tapered. Subsequently, the patterned lithographic material stack can be subsequently removed, for example, by ashing.

Optionally, the portions of the first-tier memory openings 149 and the first-tier support openings 129 at the level of the inter-tier dielectric layer 180 can be laterally expanded by an isotropic etch. FIGS. 12A and 12B illustrate a processing sequence for laterally expanding portions of the first-tier memory openings 149 at the level of the inter-tier dielectric layer 180. FIG. 12A illustrates a first-tier memory opening 149 immediately after the anisotropic etch that forms the first-tier memory openings 149. The anisotropic etch can terminate after each of the first-tier memory openings 149 extends to the lower source layer 112. The inter-tier dielectric layer 180 can comprise a dielectric material (such as borosilicate glass) having a greater etch rate than the first insulating layers 132 (that can include undoped silicate glass). Referring to FIG. 12B, an isotropic etch (such as a wet etch employing HF) can be employed to expand the lateral dimensions of the first-tier memory openings at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings). The same structural modifications can be made within each first-tier support opening 129.

Figure 13A:
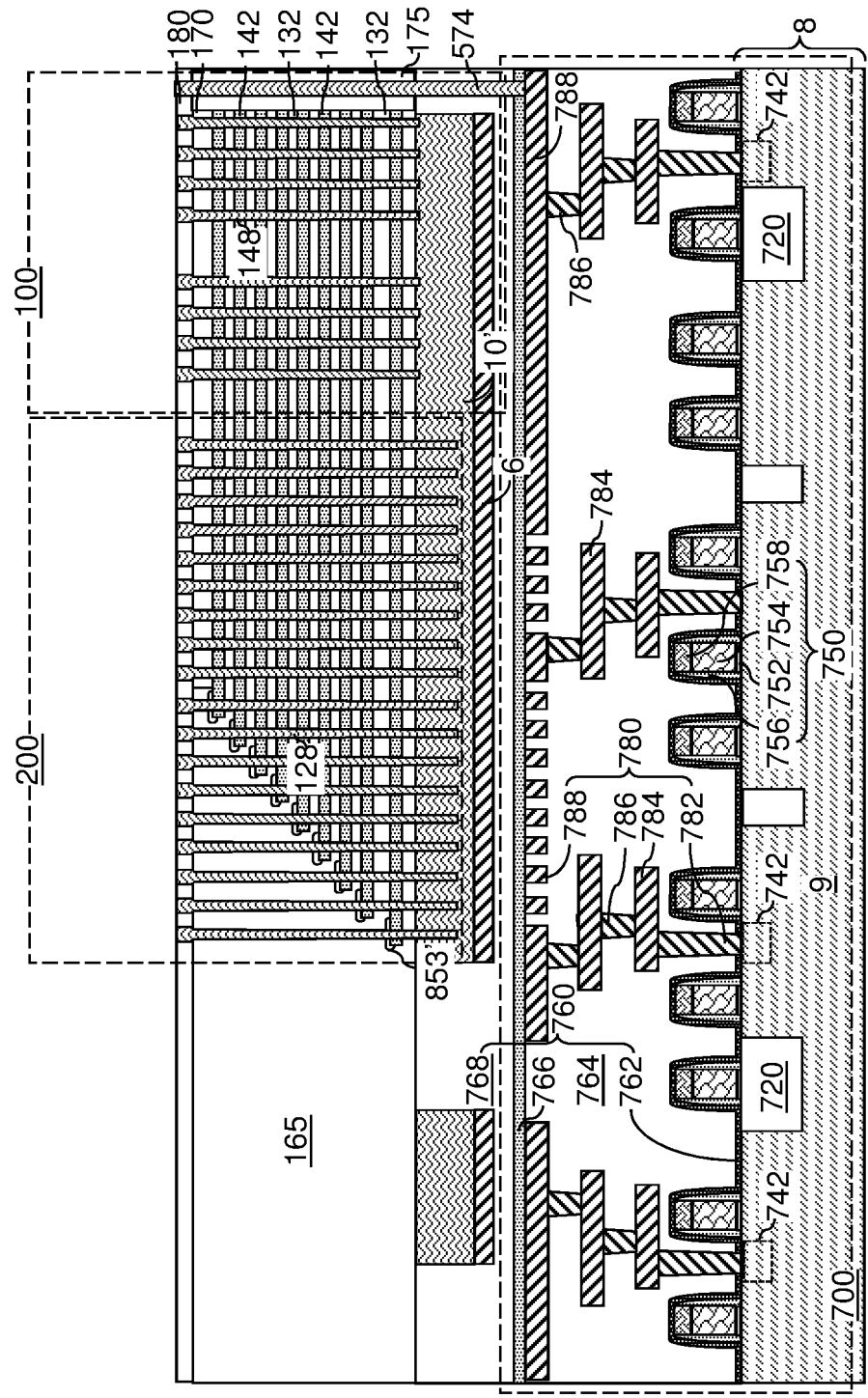
FIG. 13A is a vertical cross-sectional view of the exemplary structure after formation of sacrificial memory opening fill portions and first-tier support opening fill portions according to an embodiment of the present disclosure.
Figure 13B:
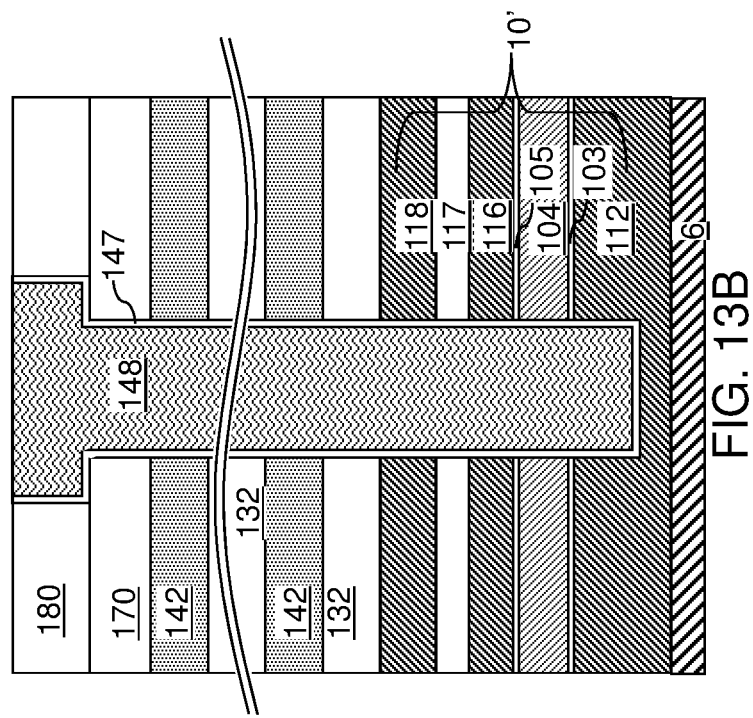
FIG. 13B is a magnified vertical cross-sectional view of a sacrificial memory opening fill structure in the exemplary structure of FIG. 13A.

Referring to FIGS. 13A and 13B, sacrificial opening liners 147 can be formed within each of the first-tier memory openings 149 and the first-tier support openings 129 by conformal deposition of a sacrificial material such as silicon oxide or silicon nitride. The thickness of the sacrificial opening liners 147 can be in a range from 1 nm to 3 nm, although lesser and greater thicknesses can also be employed.

Sacrificial memory opening fill portions 148 can be formed in the first-tier memory openings 149, and sacrificial support opening fill portions 128 can be formed in the first-tier support openings 129. For example, a sacrificial fill material layer is deposited in the first-tier memory openings 149 and the first-tier support openings 129. The sacrificial fill material layer includes a sacrificial material which can be subsequently removed selective to the materials of the first insulating layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the inter-tier dielectric layer 180. For example, the sacrificial fill material layer can be recessed to a top surface of the inter-tier dielectric layer 180 employing a planarization process. The planarization process can include a recess etch, chemical mechanical planarization (CMP), or a combination thereof. The top surface of the first insulating layer 170 (and optionally layer 180 if present) the inter-tier dielectric layer 180 can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 129 constitutes a sacrificial support opening fill portion 128. The top surfaces of the sacrificial memory opening fill portions 148 and the sacrificial support opening fill portions 128 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 128 may, or may not, include cavities therein.

Figure 14A:
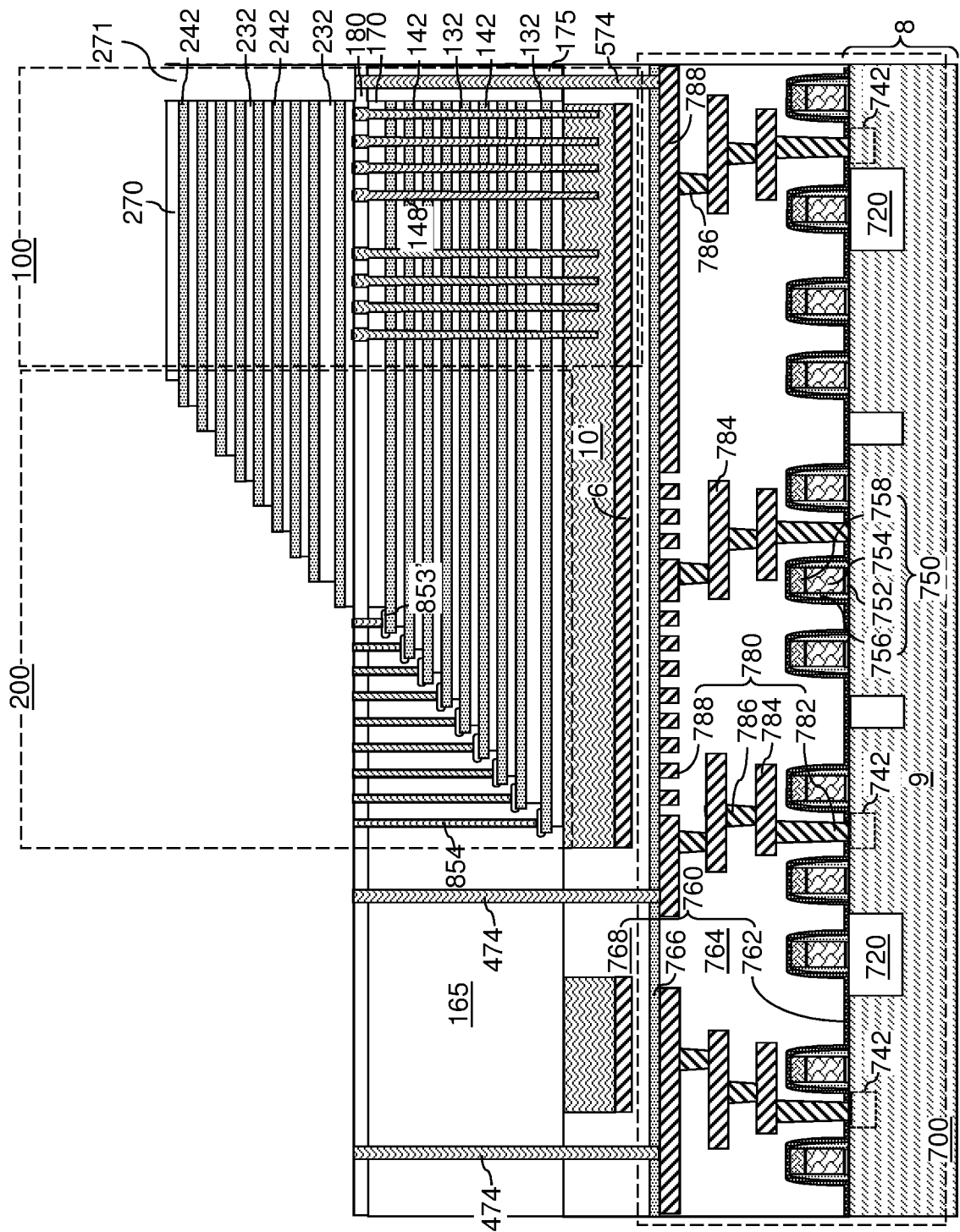
FIG. 14A is a vertical cross-sectional view of the exemplary structure after formation of a second-tier alternating stack of second insulating layers and second spacer material layers and second stepped surfaces according to an embodiment of the present disclosure.
Figure 14B:
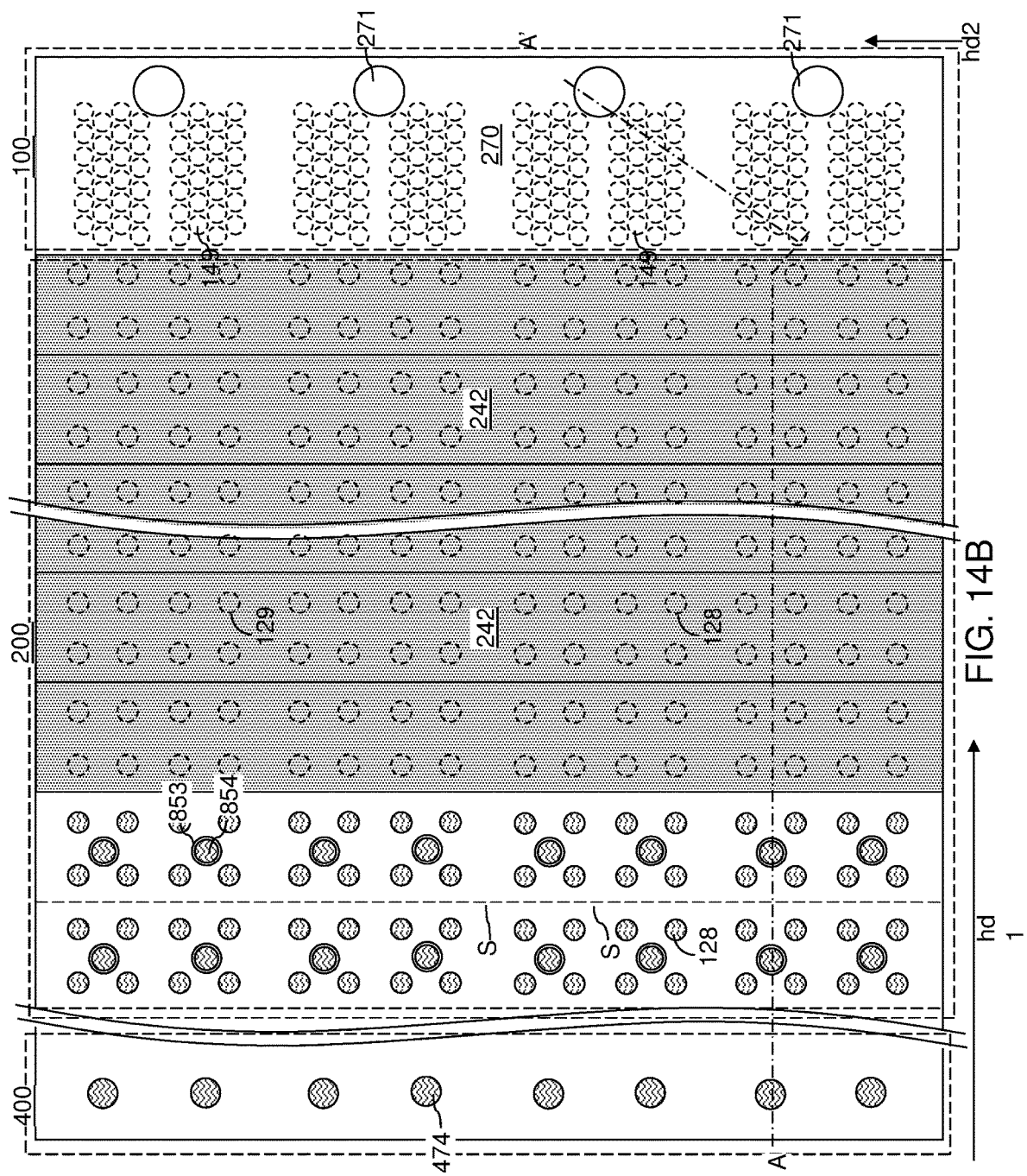
FIG. 14B is a top-down view of the exemplary structure of FIG. 14A. The hinged vertical plane A-A' corresponds to the plane of the vertical cross-sectional view of FIG. 14A.

Referring to FIGS. 14A and 14B, a second-tier structure can be formed over the first-tier structure (132, 142, 170, 165, 175, 148) and the inter-tier dielectric layer 180. The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Second stepped surfaces in the second stepped area can be formed in the staircase region 200 employing a same set of processing steps as the processing steps employed to form the first stepped surfaces in the first stepped area with suitable adjustment to the pattern of at least one masking layer. The second stepped surfaces can be laterally offset from the first stepped surfaces to avoid an overlap in a see-through top-down view. The cavity overlying the second stepped surfaces is herein referred to as a second stepped cavity.

Openings including substantially vertical straight sidewalls can be formed through the second-tier alternating stack (232, 242), for example, by applying a photoresist layer (not shown) and forming openings in the memory array region 100 within areas that overlie the first dielectric pillar portions 175 and the array-region sacrificial via fill structures 574. The pattern of the openings in the photoresist layer can be transferred through the second alternating stack (232, 242) by an anisotropic etch process to form openings 271 extending through the second alternating stack (232, 242). A top surface of an array-region sacrificial via fill structure 574 laterally enclosed by a first dielectric pillar portion 175 can be physically exposed at the bottom of each opening 271 through the second-tier alternating stack (232, 242). The photoresist layer can be removed, for example, by ashing.

Figure 15:
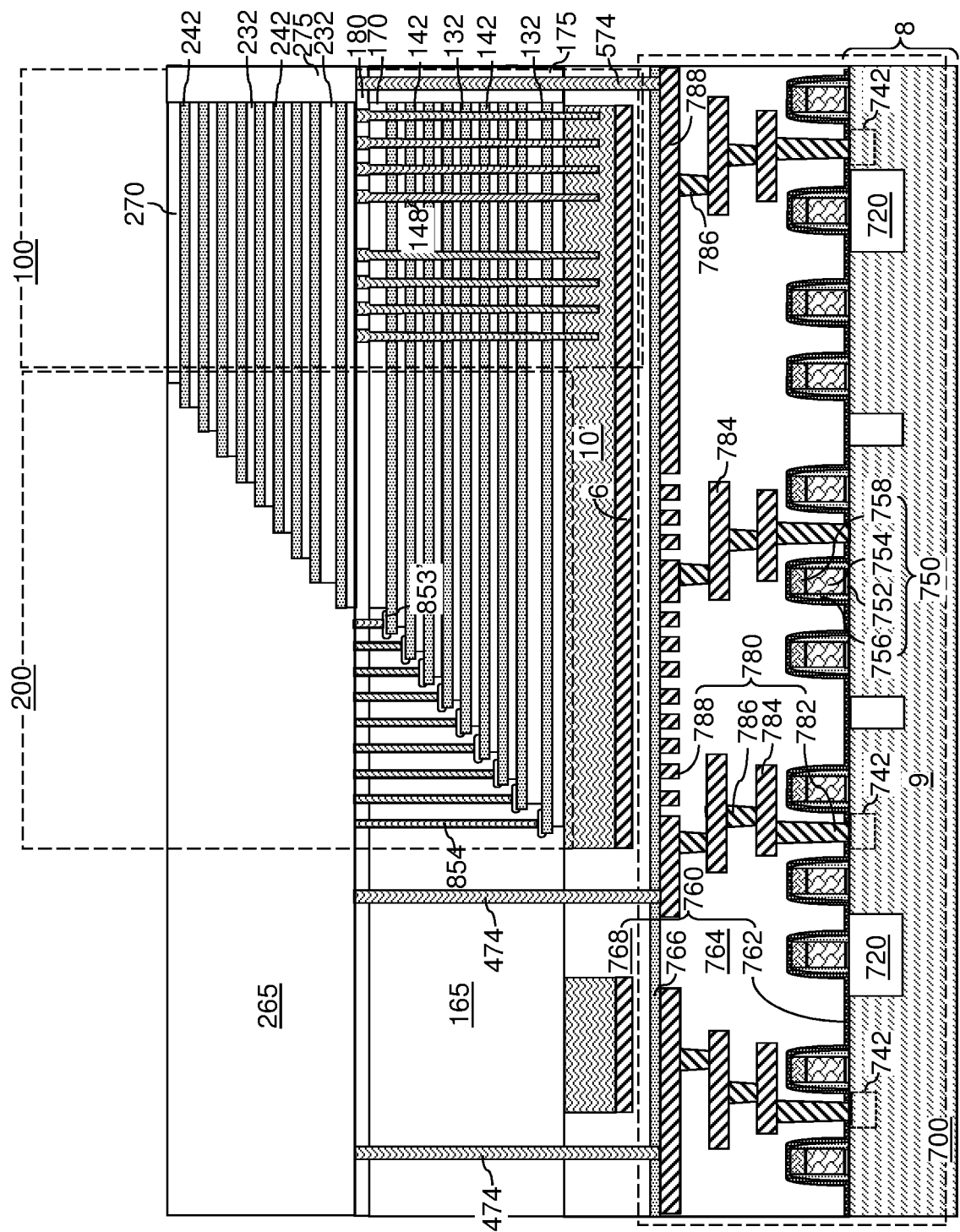
FIG. 15 is a vertical cross-sectional view of the exemplary structure after formation of a second retro-stepped dielectric material portion according to an embodiment of the present disclosure.

Referring to FIG. 15, a dielectric fill material (such as undoped silicate glass or doped silicate glass) can be deposited to fill the openings 271 in the memory array region 100 and the second stepped cavity. Excess portions of the dielectric fill material can be removed from above the horizontal plane including the top surface of the second insulating cap layer 270. Remaining portions of the dielectric fill material filling the opening 271 in the memory array region 100 constitutes second dielectric pillar portions 275. The second dielectric pillar portions 275 can overlie, and contact, a respective one of the first dielectric pillar portions 175. A remaining portion of the dielectric fill material that fills the region overlying the second stepped surfaces constitutes a second retro-stepped dielectric material portion 265. The second-tier alternating stack (232, 242), the second dielectric pillar portions 275, and the second retro-stepped dielectric material portion 265 collectively constitute a second-tier structure, which is an in-process structure that is subsequently modified.

Generally speaking, at least one alternating stack of insulating layers (132, 232) and spacer material layers (such as sacrificial material layers (142, 242) can be formed over the in-process source-level material layers 10', and at least one retro-stepped dielectric material portion (165, 265) can be formed in the staircase regions on the at least one alternating stack (132, 142, 232, 242).

Figure 16A:
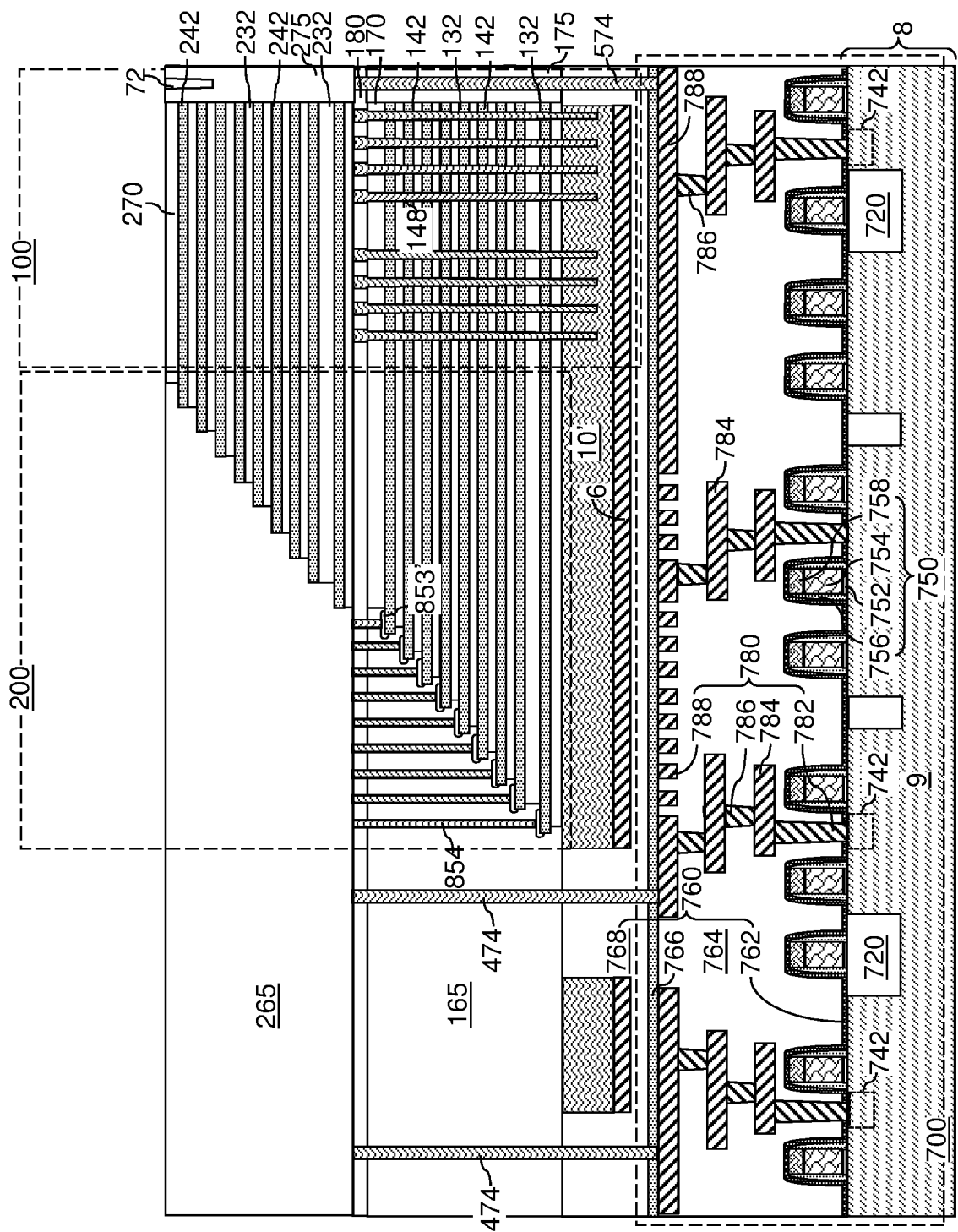
FIG. 16A is a vertical cross-sectional view of the exemplary structure after formation of second dielectric pillar portions and dielectric isolation structures according to an embodiment of the present disclosure.
Figure 16B:
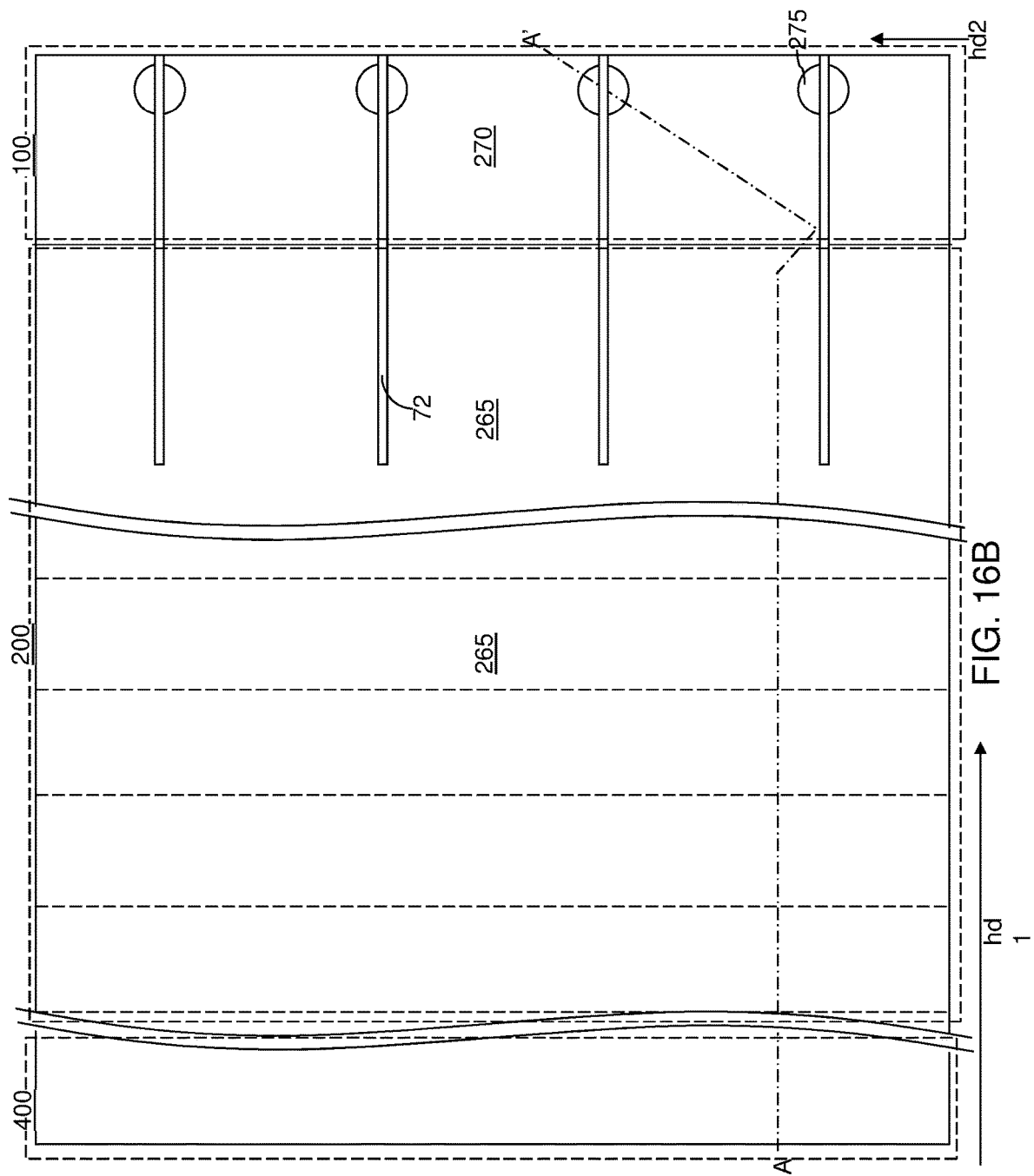
FIG. 16B is a top-down view of the exemplary structure of FIG. 16A. The hinged vertical plane A-A' corresponds to the plane of the vertical cross-sectional view of FIG. 16A.

Referring to FIGS. 16A and 16B, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Figure 17A:
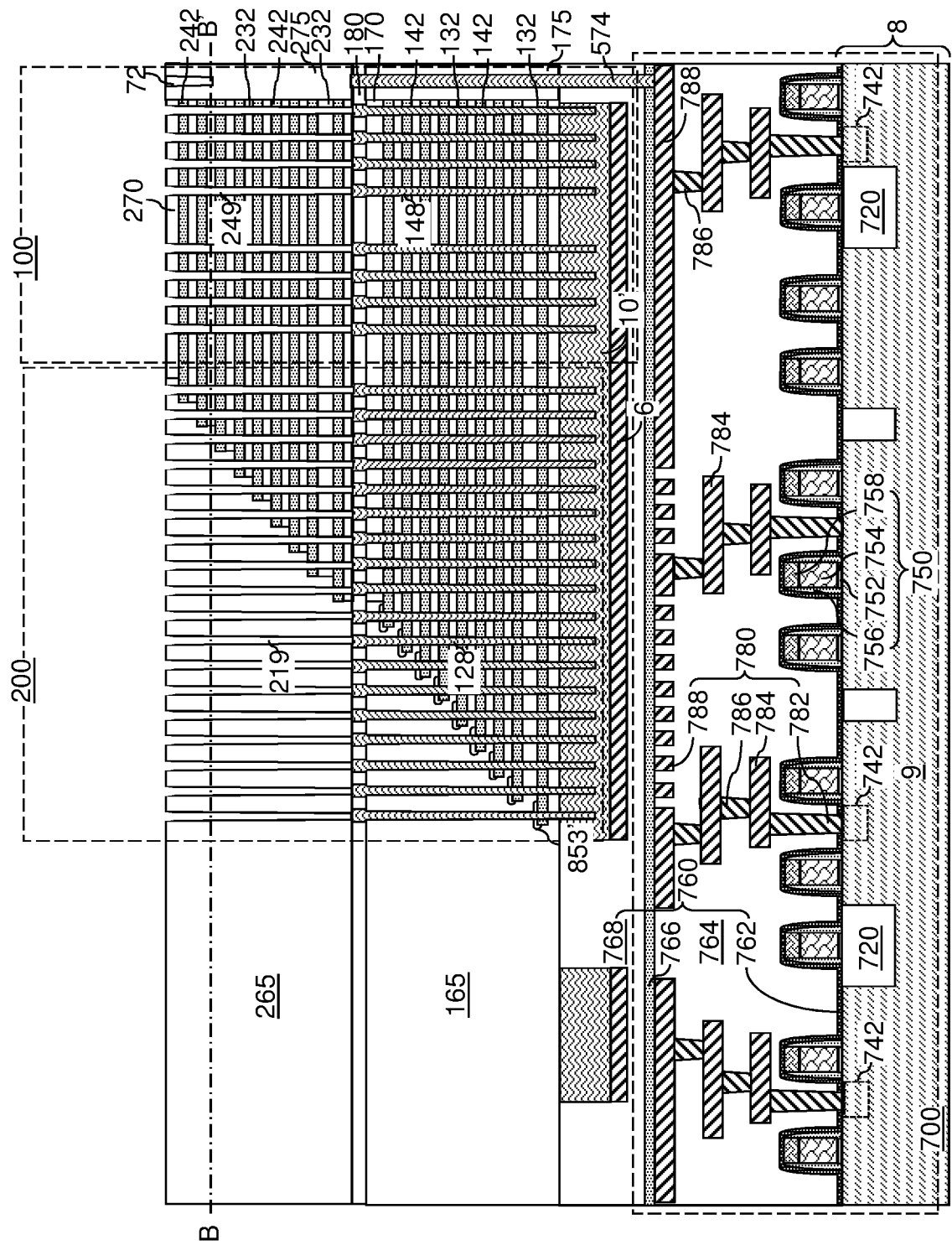
FIG. 17A is a vertical cross-sectional view of the exemplary structure after formation of second-tier memory openings and second-tier support openings according to an embodiment of the present disclosure.
Figure 17B:
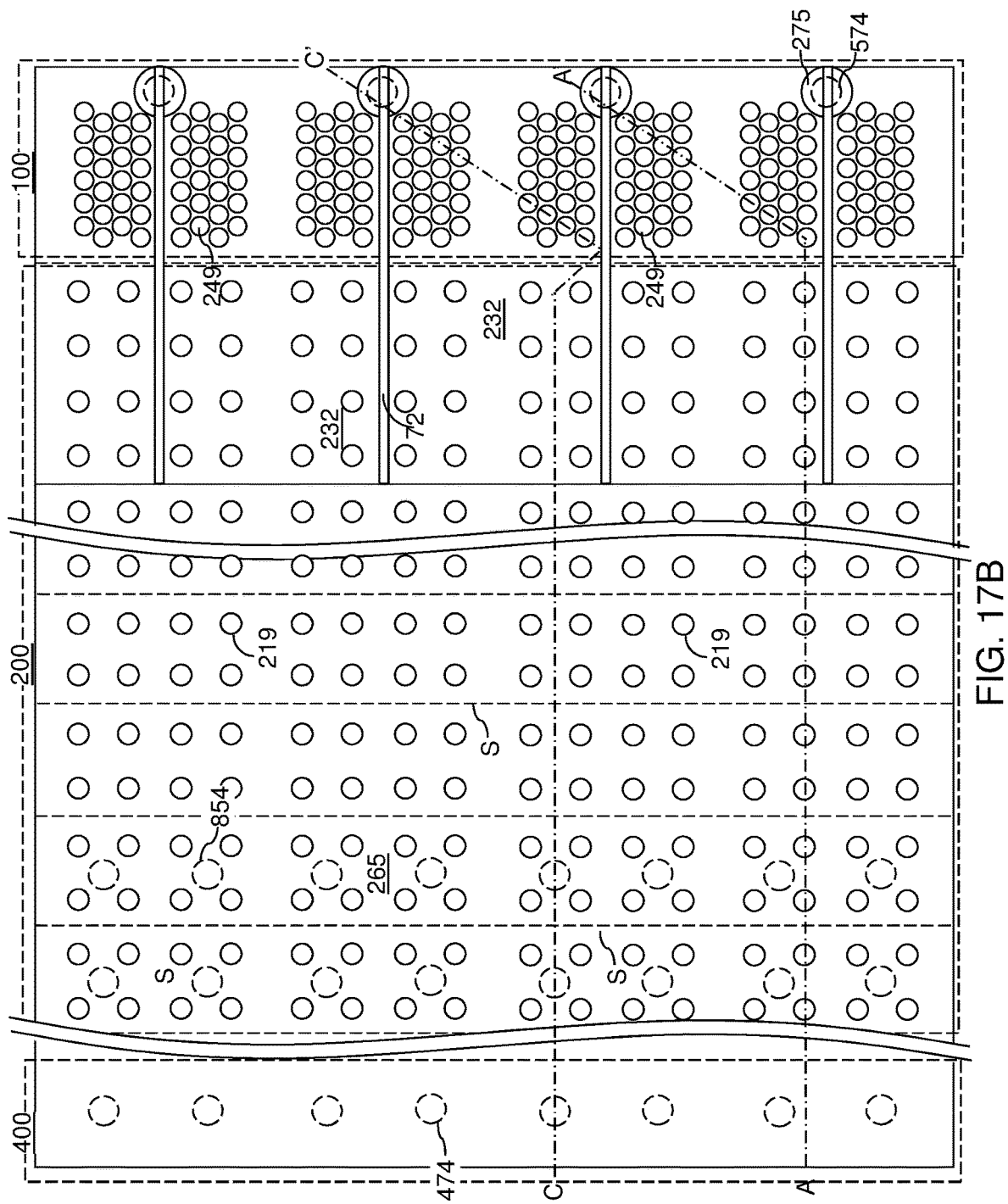
FIG. 17B is a horizontal cross-sectional of the exemplary structure along the horizontal plane B-B' of FIG. 17A. The hinged vertical plane A-A' corresponds to the plane of the vertical cross-sectional view of FIG. 17A.
Figure 17C:
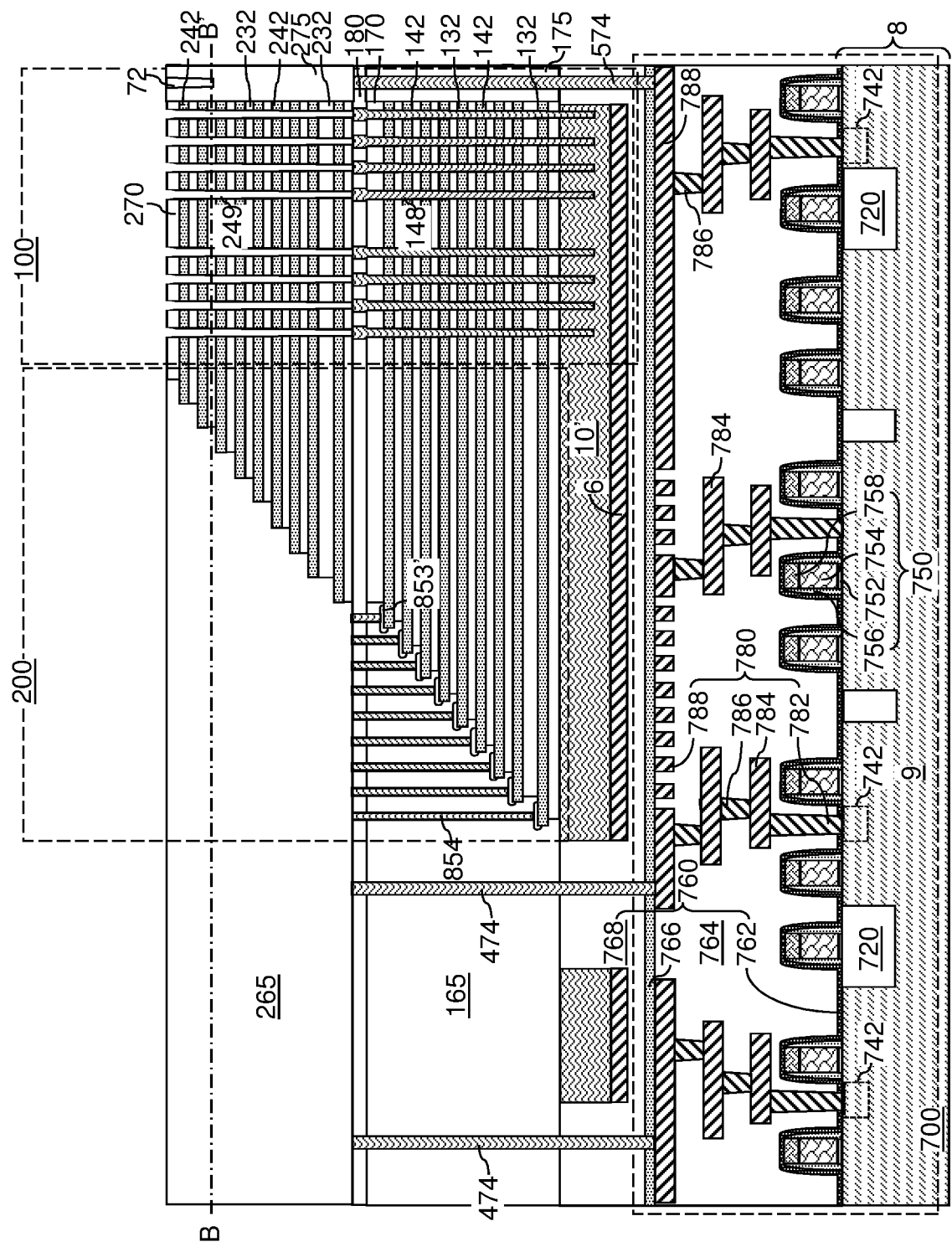
FIG. 17C is a vertical cross-sectional view of the exemplary structure along the hinged vertical plane C-C' of FIG. 17B.

Referring to FIGS. 17A-17C, second-tier memory openings 249 and second tier support openings 219 extending through the second-tier structure (232, 242, 270, 265, 275) are formed in areas overlying the sacrificial memory opening fill portions 148 and the sacrificial support opening fill portions 128. A photoresist layer can be applied over the second-tier structure (232, 242, 270, 265, 275), and can be lithographically patterned to form a same pattern as the pattern of the sacrificial memory opening fill portions 148 and the sacrificial support opening fill portions 128, i.e., the pattern of the first-tier memory openings 149 and the first-tier support openings 129. Thus, the lithographic mask employed to pattern the first-tier memory openings 149 and the first-tier support openings 129 can be employed to pattern the second-tier memory openings 249 and the second-tier support openings 219. An anisotropic etch can be performed to transfer the pattern of the lithographically patterned photoresist layer through the second-tier structure (232, 242, 270, 265, 275). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 128 can be physically exposed at the bottom of each second-tier support opening 219. After the top surfaces of the sacrificial memory opening fill portions 148 and the sacrificial support opening fill portions 128 are physically exposed, an etch process can be performed, which removes the sacrificial material of the sacrificial memory opening fill portions 148 and the sacrificial support opening fill portions 128 selective to the materials of the second-tier alternating stack (232, 242) and the first-tier alternating stack (132, 142) (e.g., $C_4F_8/O_2/Ar$ etch). If present, the sacrificial opening liners 147 can be removed.

Figure 18A:
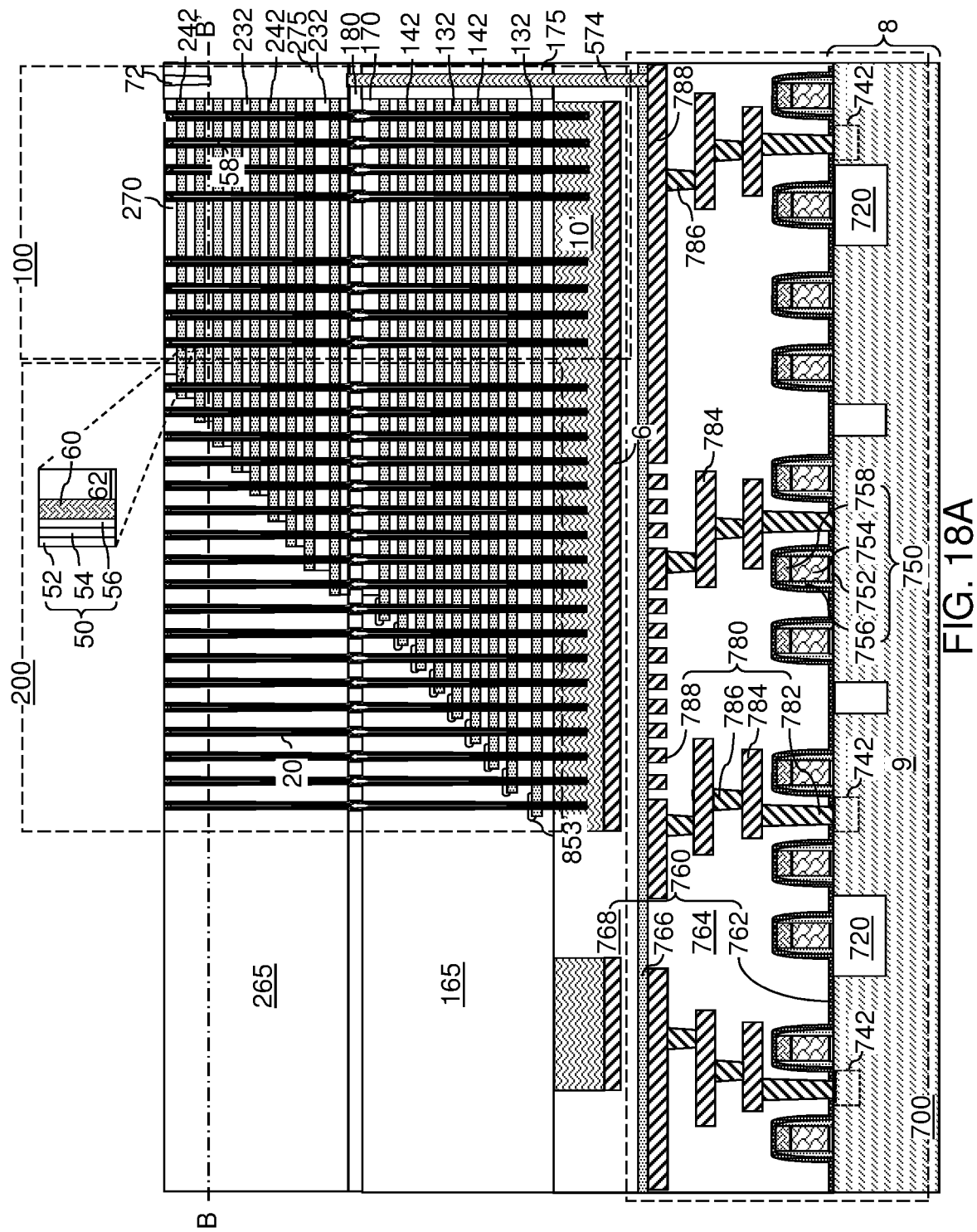
FIG. 18A is a vertical cross-sectional view of the exemplary structure after formation of memory opening fill structures and support pillar structures and second-tier support openings according to an embodiment of the present disclosure.
Figure 18B:
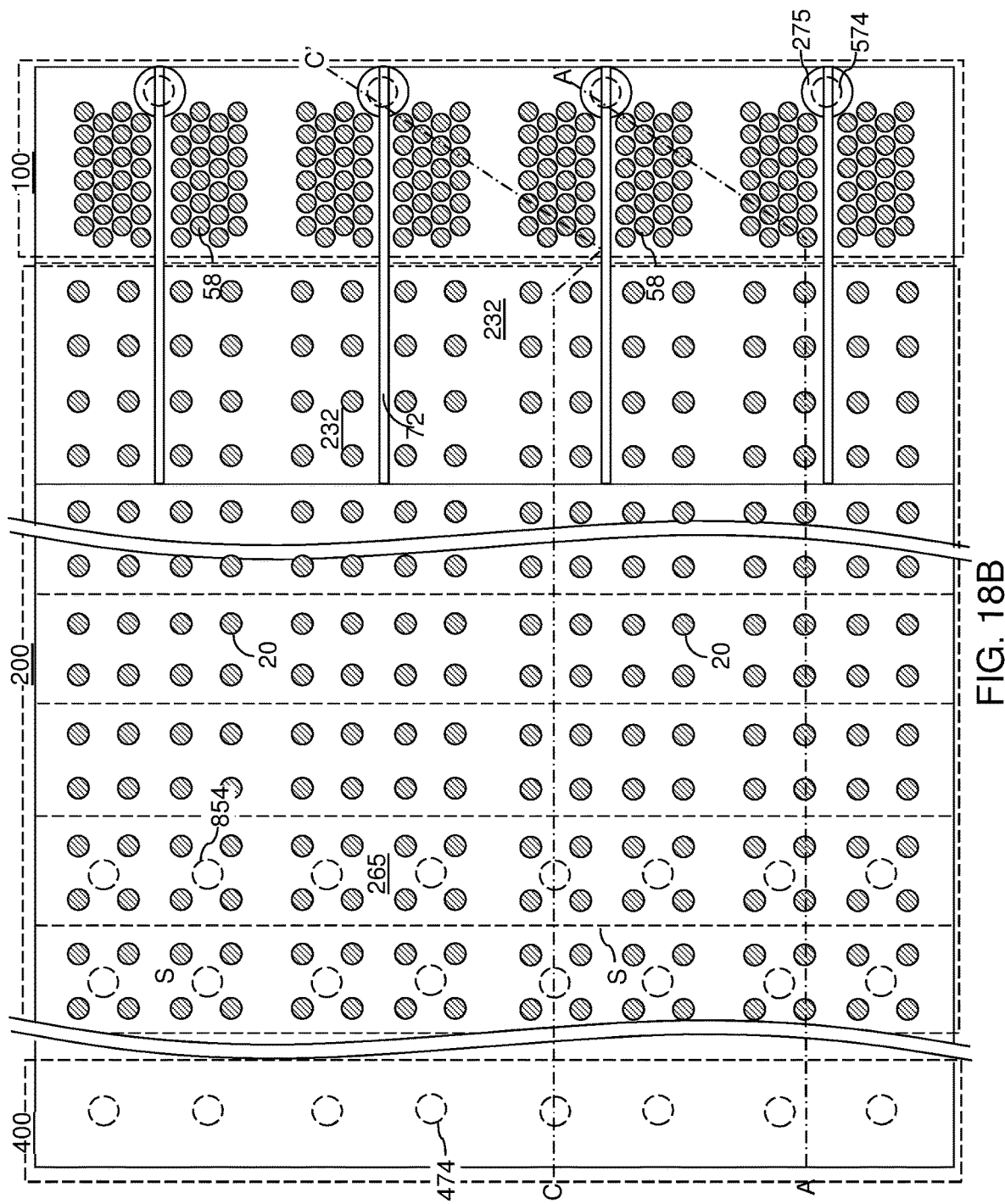
FIG. 18B is a horizontal cross-sectional of the exemplary structure along the horizontal plane B-B' of FIG. 18A. The hinged vertical plane A-A' corresponds to the plane of the vertical cross-sectional view of FIG. 18A.
Figure 18C:
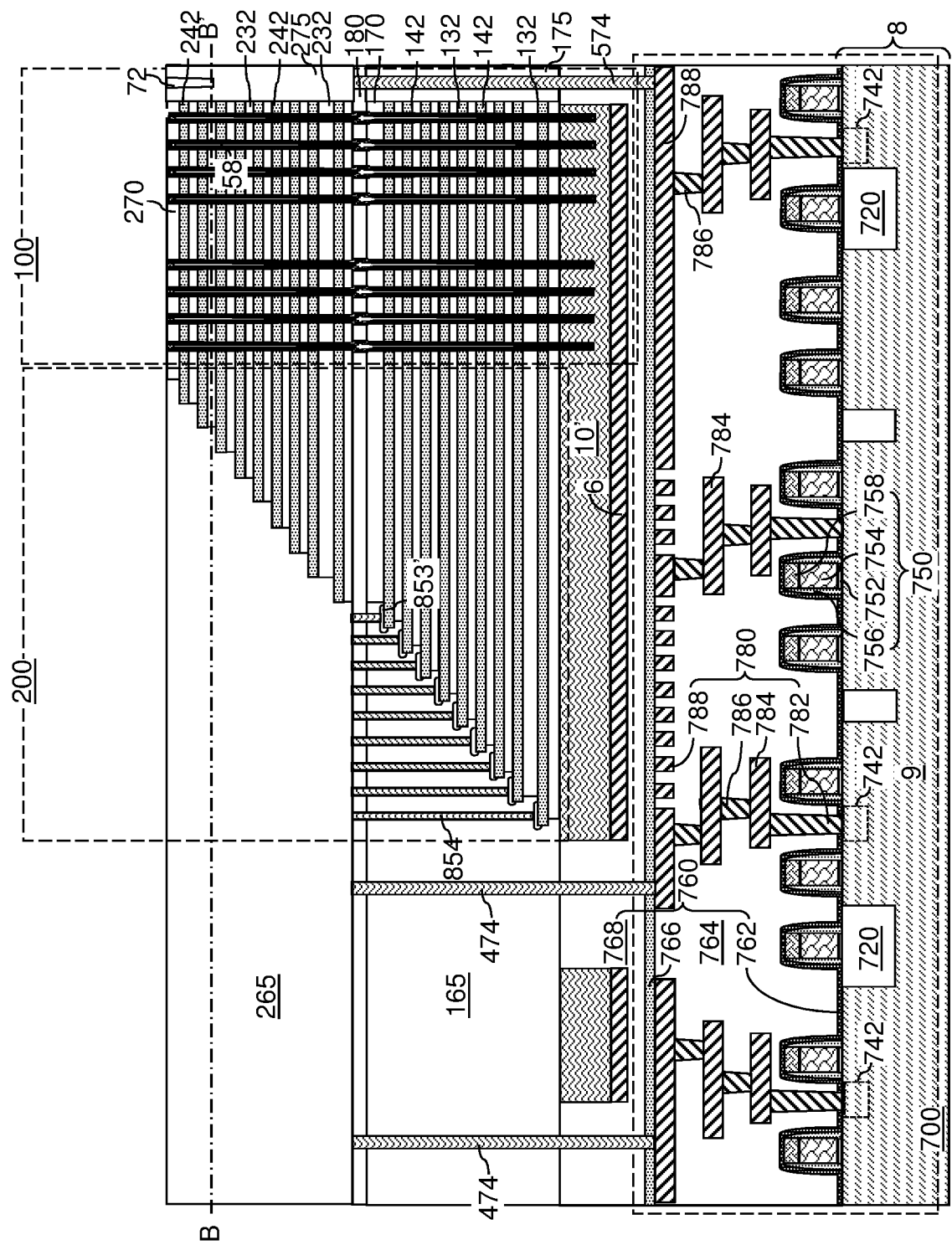
FIG. 18C is a vertical cross-sectional view of the exemplary structure along the hinged vertical plane C-C' of FIG. 18B.

Referring to FIGS. 18A-18C, upon removal of the sacrificial memory opening fill portions 148 (and the sacrificial opening liners 147), each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 128 (and the sacrificial opening liners 147), each vertically adjoining pair of a second-tier support opening 219 and a first-tier support opening 129 forms a continuous cavity that extends through the first-tier alternating stack (132, 142) and the second-tier alternating stack (232, 242). The continuous cavities are herein referred to as memory openings 49 (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines in FIG. 18B. Subsequently, a memory opening fill structure 58 is formed within each memory opening in the memory array region 100, and a support pillar structure is formed within each support opening in the staircase region 200.

FIGS. 19A-19D provide sequential cross-sectional views of a memory opening 49 during formation of a memory opening fill structure 58.

Referring to FIG. 19A, a memory opening 49 in the exemplary device structure of FIGS. 18A-18C is illustrated. The memory opening 49 extends through the first-tier structure and the second-tier structure. A top surface of the lower source layer 112 can be physically exposed at the bottom of each memory opening 49 and at the bottom of each support opening. Sidewalls of the lower sacrificial liner 103, the source-level sacrificial layer 104, the upper sacrificial liner 105, the upper source layer 116, the source-level insulating layer 117, and the optional source-select-level conductive layer 118 can be physically exposed around each memory opening 49 and around each support opening.

Referring to FIG. 19B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Referring to FIG. 19C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 19D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements which comprise portions of the charge storage layer 54, and an optional blocking dielectric layer 52. Each combination of a memory stack structure 55, a dielectric core 62, and a drain region 63 within a memory opening 49 constitutes a memory opening fill structure 58. Each memory opening is filled with a respective memory opening fill structure 58. Each of the memory stack structures 55 comprises a memory film 50 and a vertical semiconductor channel 60 laterally surrounded by the memory film 50. Each memory stack structure 55 can vertically extend through each layer within the first alternating stack (132, 142) and within the second alternating stack (232, 242), and can be formed within a two-dimensional array of memory stack structures 55 in the memory array region 100.

During formation of the memory opening fill structures 58 (i.e., during the processing steps of FIGS. 19A-19D), the same structural changes occur in each of the support openings to form a support pillar structure within each support opening. Each support pillar structure can have a same set of structural elements as a memory opening fill structure 58 with optional modifications that occur due to differences in the lateral dimensions of the support openings relative to the lateral dimensions of the memory openings. The support pillar structures are electrically inactive components (also referred to as dummy components), i.e., components that are not employed to form an electrically active component. The in-process source-level material layers 10', the first-tier structure (132, 142, 170, 165, 175), the second-tier structure (232, 242, 270, 265, 275), the inter-tier dielectric layer 180, the memory opening fill structures 58, and the support opening fill structures collectively constitute a memory-level assembly.

Figure 20A:
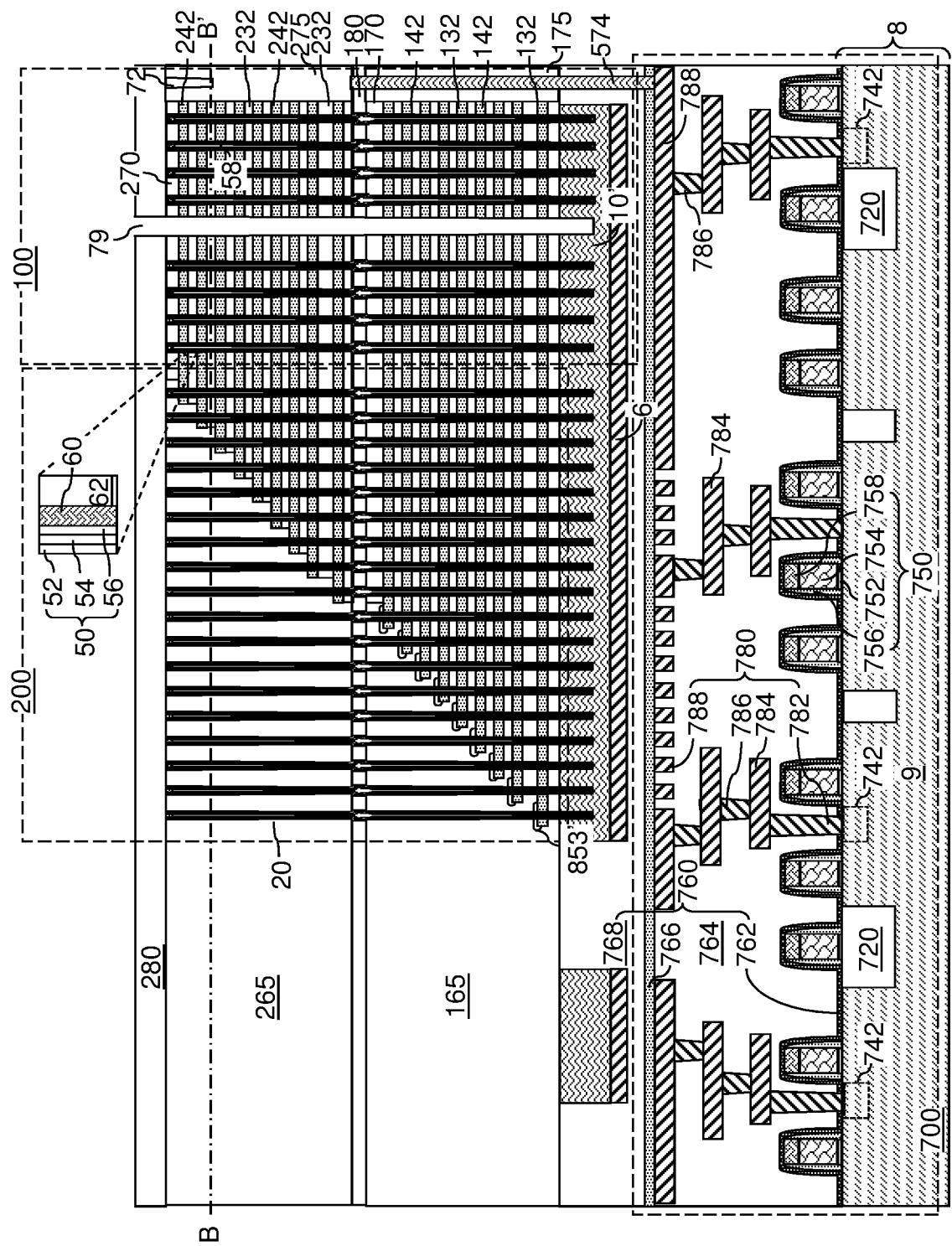
FIG. 20A is a vertical cross-sectional view of the exemplary structure after formation of a contact level dielectric layer and backside trenches according to an embodiment of the present disclosure.
Figure 20B:
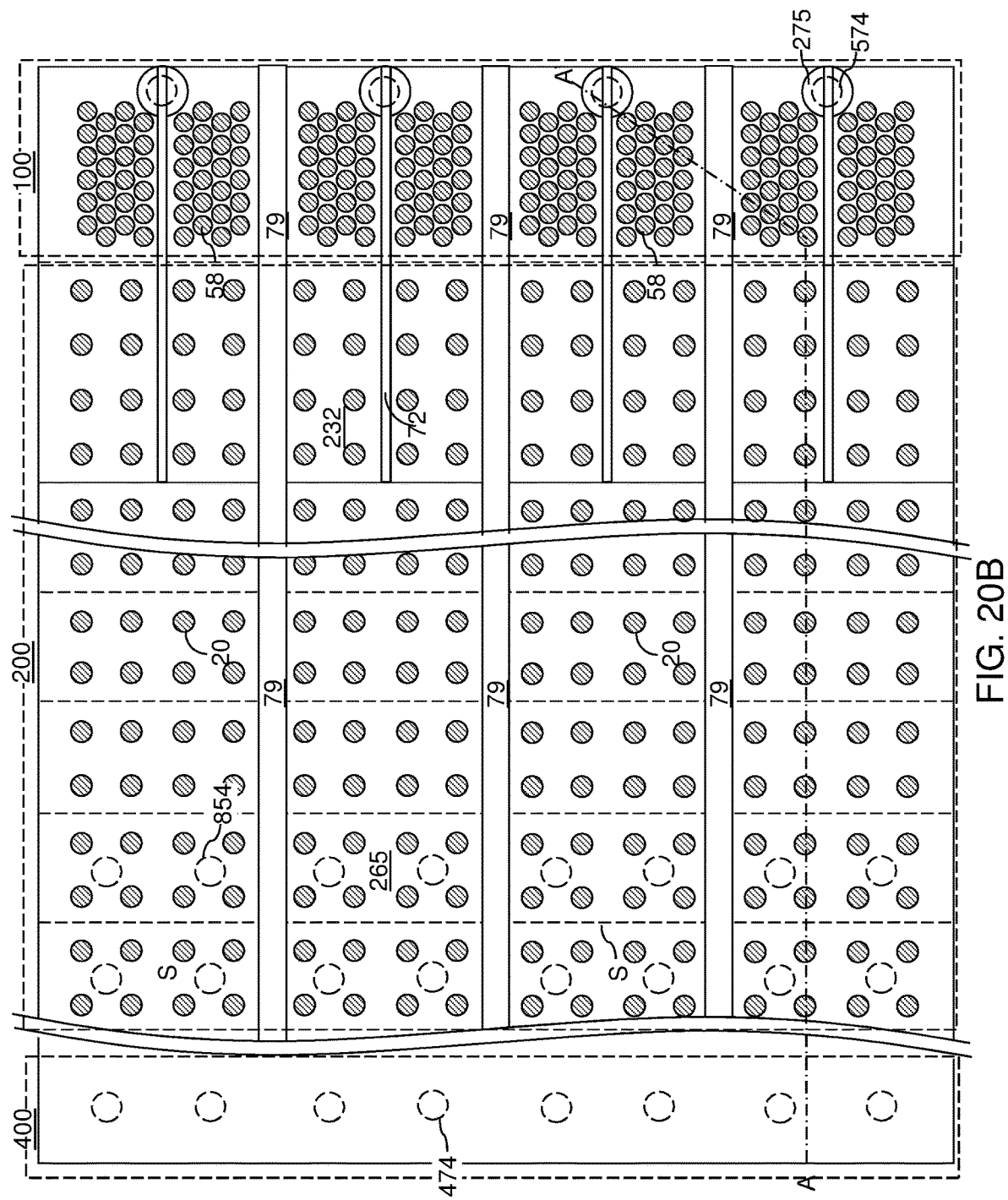
FIG. 20B is a top-down view of the exemplary structure of FIG. 20A. The hinged vertical plane A-A' corresponds to the plane of the vertical cross-sectional view of FIG. 20A.

Referring to FIGS. 20A and 20B, backside trenches 79 are subsequently formed through the contact level dielectric layer 280 and the memory-level assembly. For example, a photoresist layer can be applied and lithographically patterned over the contact level dielectric layer 280 to form elongated openings that extend along the first horizontal direction hd1. An anisotropic etch is performed to transfer the pattern in the patterned photoresist layer through a predominant portion of the memory-level assembly to the in-process source-level material layers 10'. For example, the backside trenches 79 can extend through the optional source-select-level conductive layer 118, the source-level insulating layer 117, the upper source layer 116, and the upper sacrificial liner 105 and into the source-level sacrificial layer 104. The optional source-select-level conductive layer 118 and the source-level sacrificial layer 104 can be employed as etch stop layers for the anisotropic etch process that forms the backside trenches 79. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Figure 21:
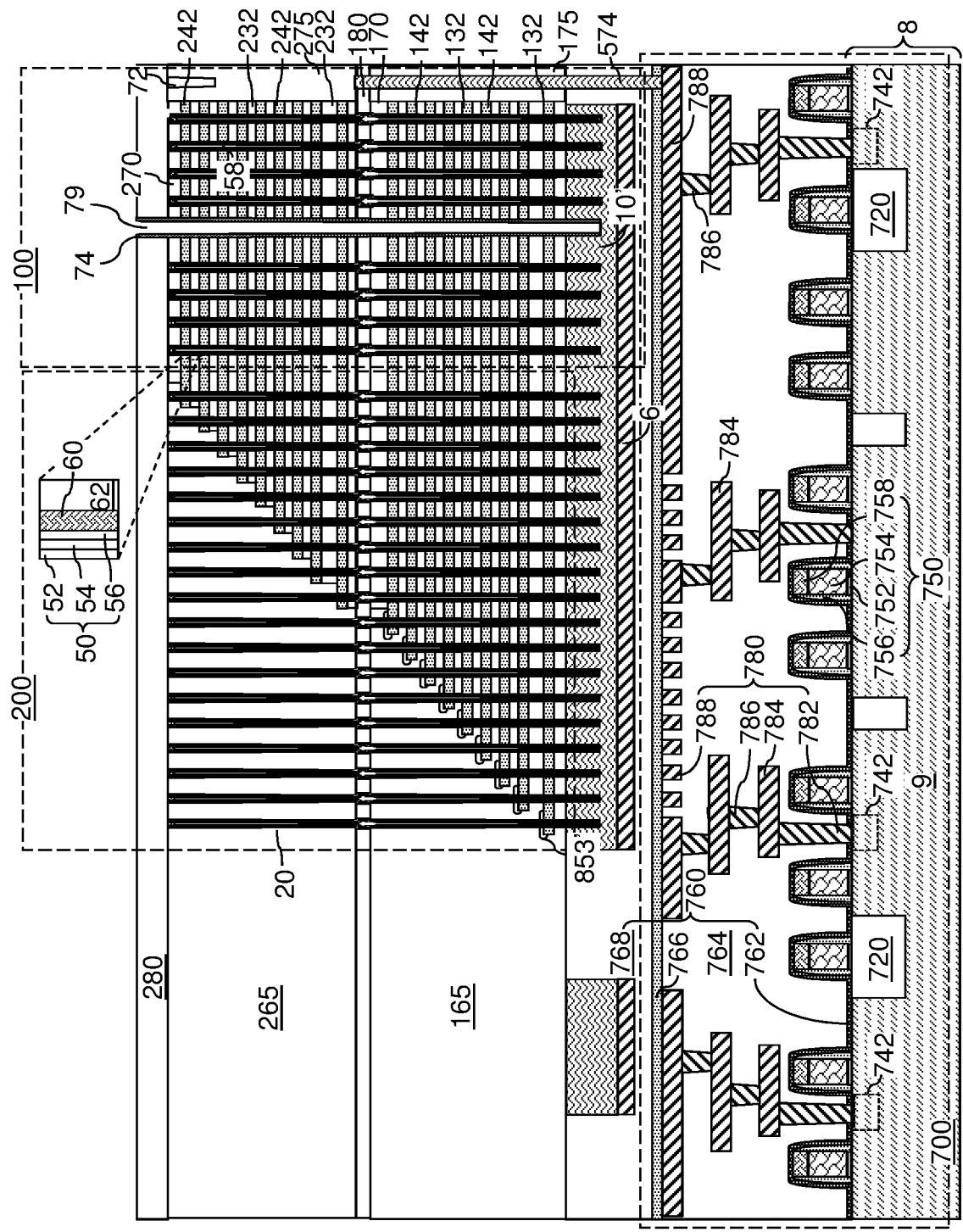
FIG. 21 is a vertical cross-sectional view of the exemplary structure after formation of silicon nitride spacers in the backside trenches according to an embodiment of the present disclosure.
Figure 22A:
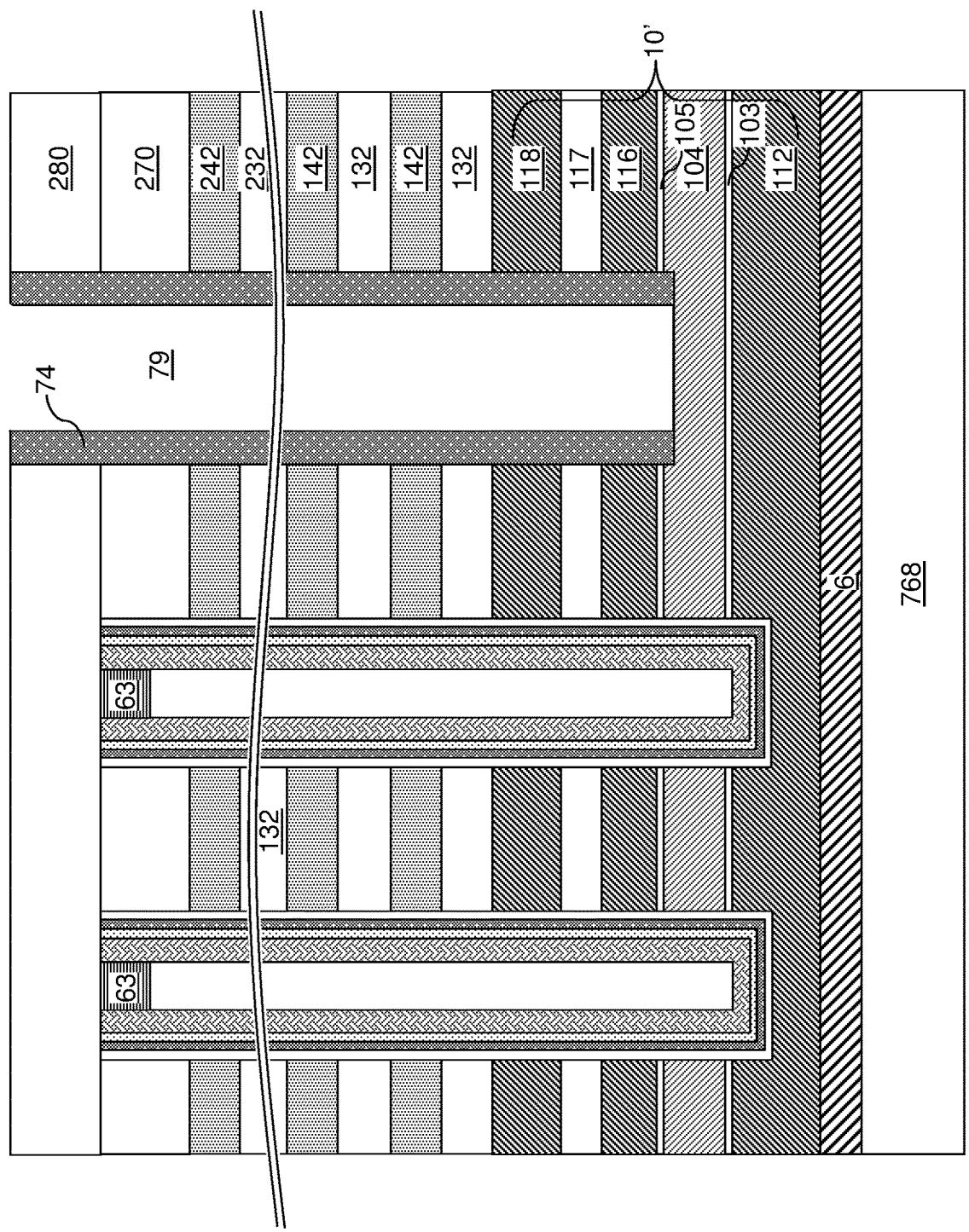
FIGS. 22A-22E are sequential vertical cross-sectional views of a region of the exemplary structure during formation of source level material layers by replacement of various material portions within the in-process source level material layers of FIG. 1B with a middle buried semiconductor layer according to an embodiment of the present disclosure.

Referring to FIGS. 21 and 22A, backside trench spacers 74 can be formed on sidewalls of the backside trenches 79 by conformal deposition of a dielectric spacer material and an anisotropic etch of the dielectric spacer material. The dielectric spacer material is a material that can be removed selective to the materials of first and second insulating layers (132, 232). For example, the dielectric spacer material can include silicon nitride. The lateral thickness of the backside trench spacers 74 can be in a range from 4 nm to 60 nm, such as from 8 nm to 30 nm, although lesser and greater thicknesses can also be employed.

Figure 22B:
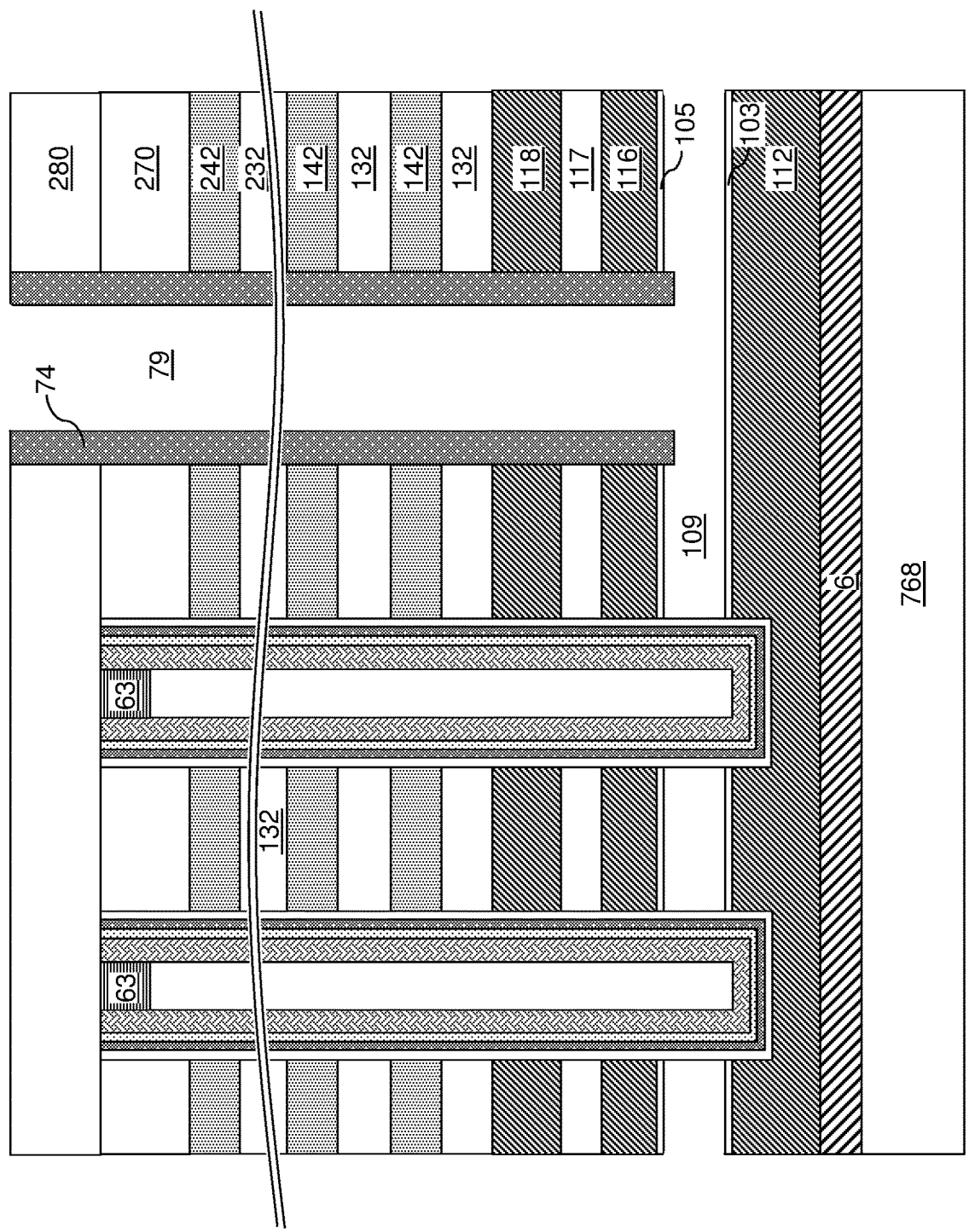

Referring to FIG. 22B, an etchant that etches the material of the source-level sacrificial layer 104 selective to the materials of the backside trench spacers 74, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 22C:
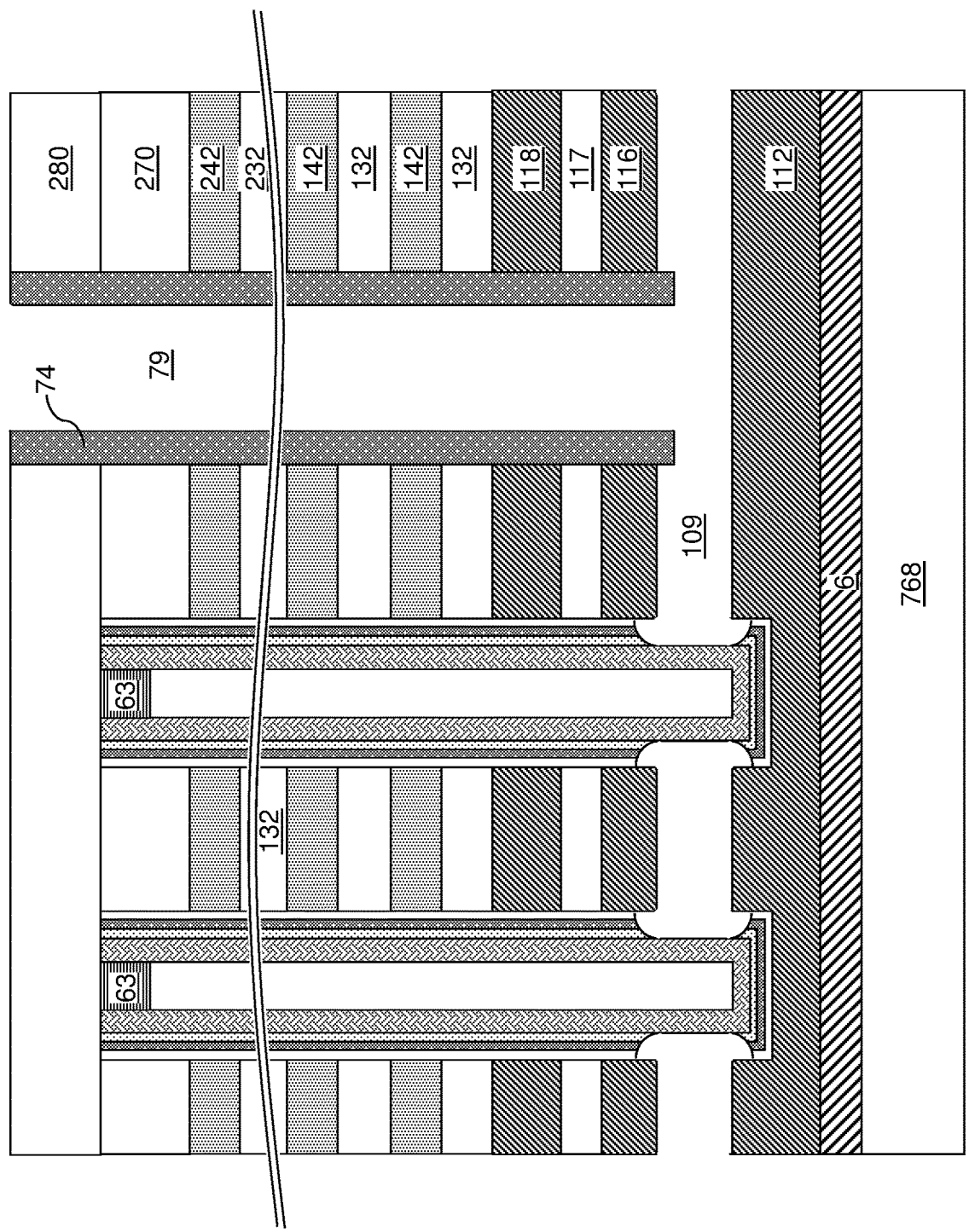

Referring to FIG. 22C, a sequence of isotropic etchants, such as wet etchants, can be applied through the backside trenches 79 and the source cavity 109 to the physically exposed portions of the memory films 50 in the source cavity 109 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 22D:
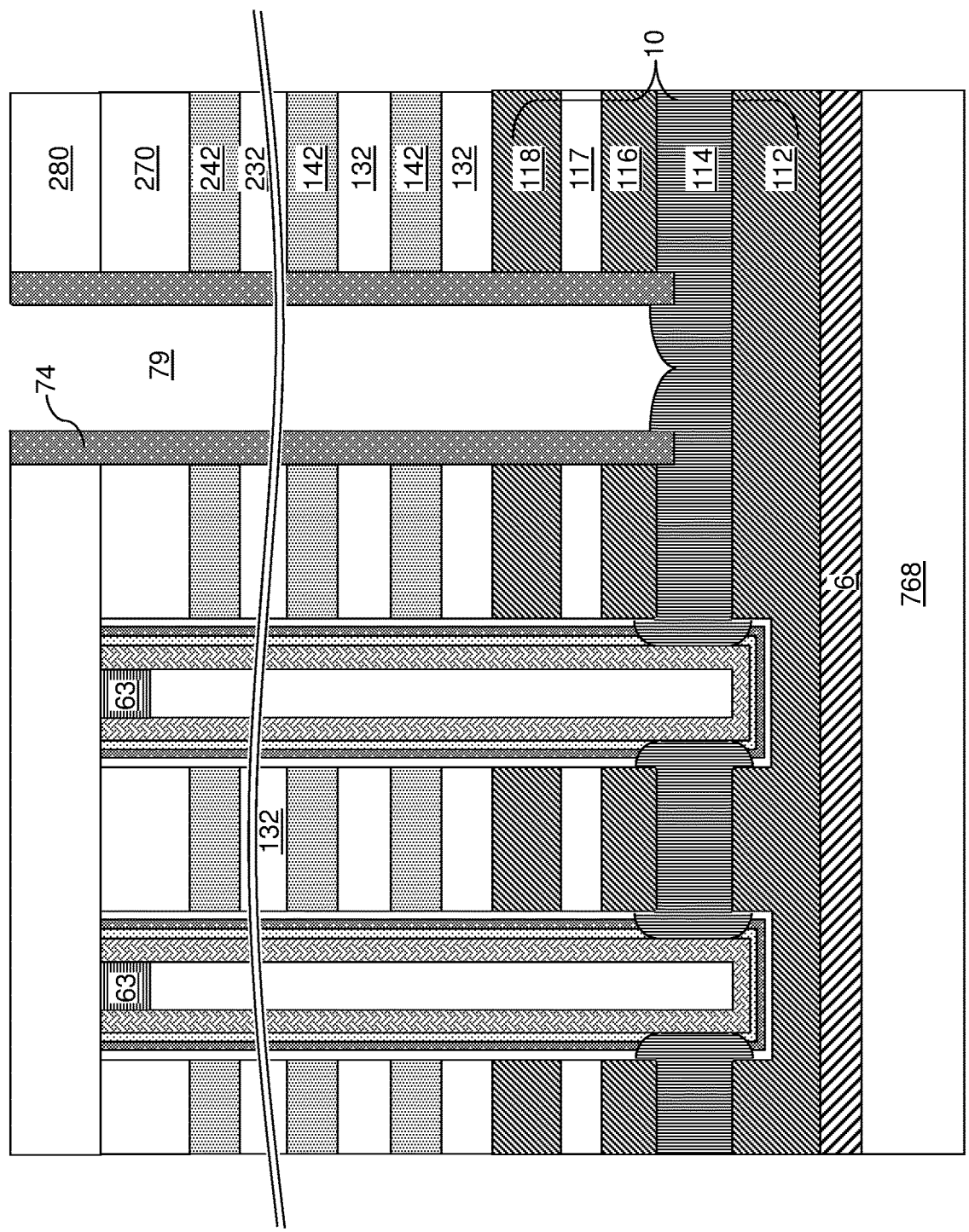

Referring to FIG. 22D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine can be provided. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts the exposed portions of the semiconductor channel 60 and bottom end portions of inner sidewalls of the backside trench spacers 74. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source level layers 10, which replace the in-process source level layers 10'.

Figure 22E:
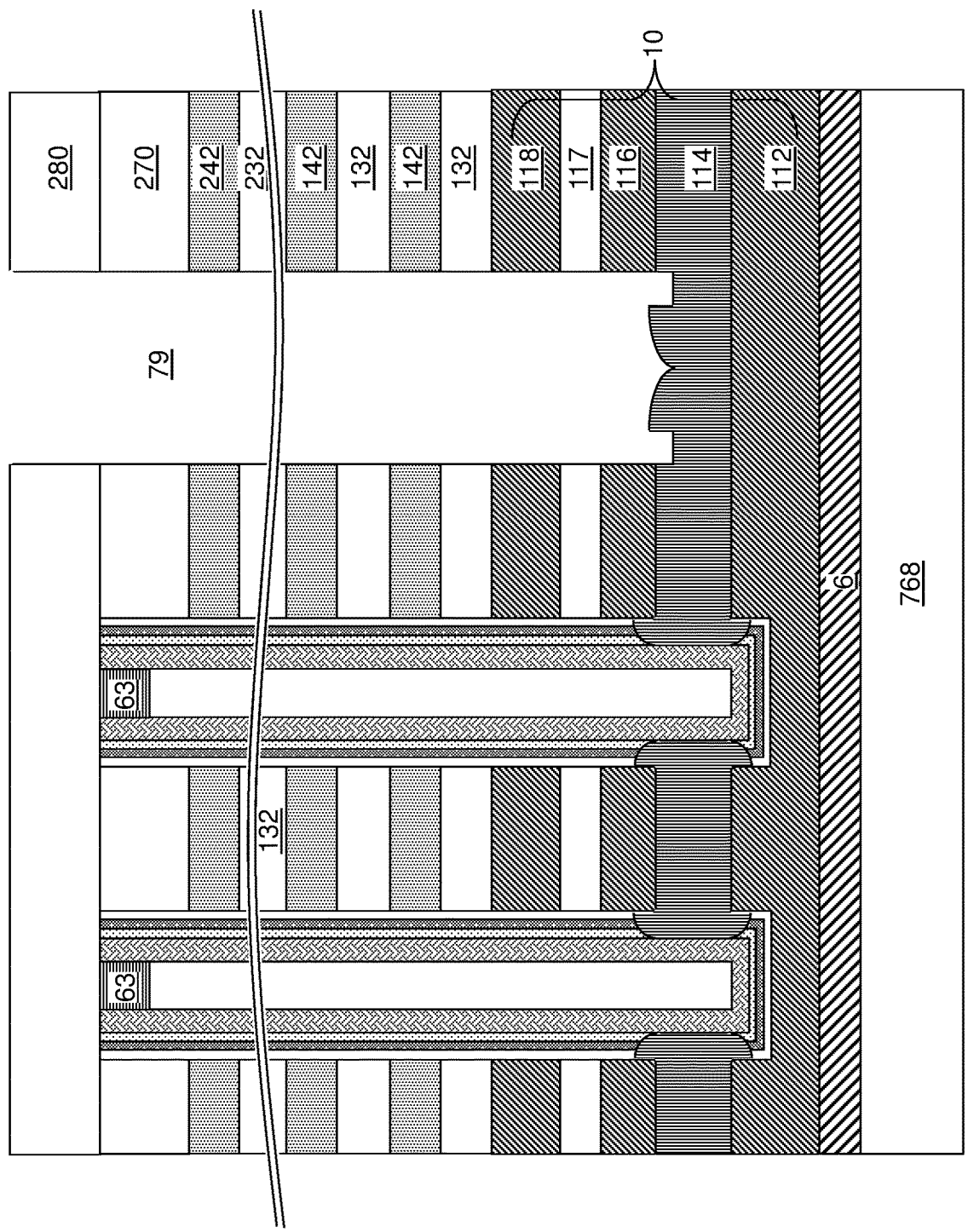
Figure 23:
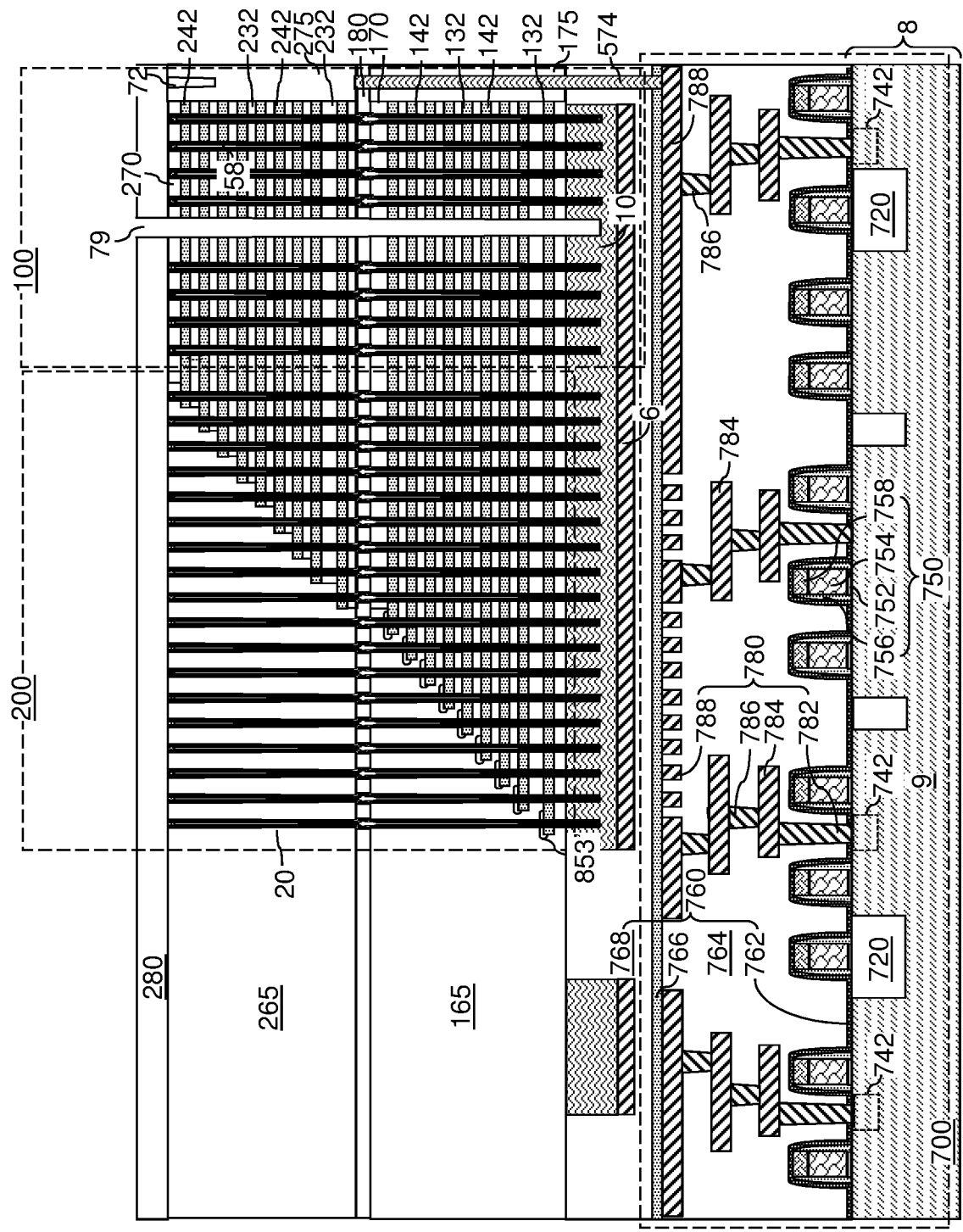
FIG. 23 is a vertical cross-sectional view of the exemplary structure at the processing steps of FIG. 22E.

Referring to FIGS. 22E and 23, an isotropic etch process can be performed to remove the backside trench spacers 74. In an illustrative example, if the backside trench spacers 74 include silicon nitride, a wet etch employing hot phosphoric acid can be employed to remove the backside trench spacers selective to the materials of the source contact layer 114, the insulating layers (132, 232), the first and second insulating cap layer (170, 270), and the contact level dielectric layer 280.

Figure 24:
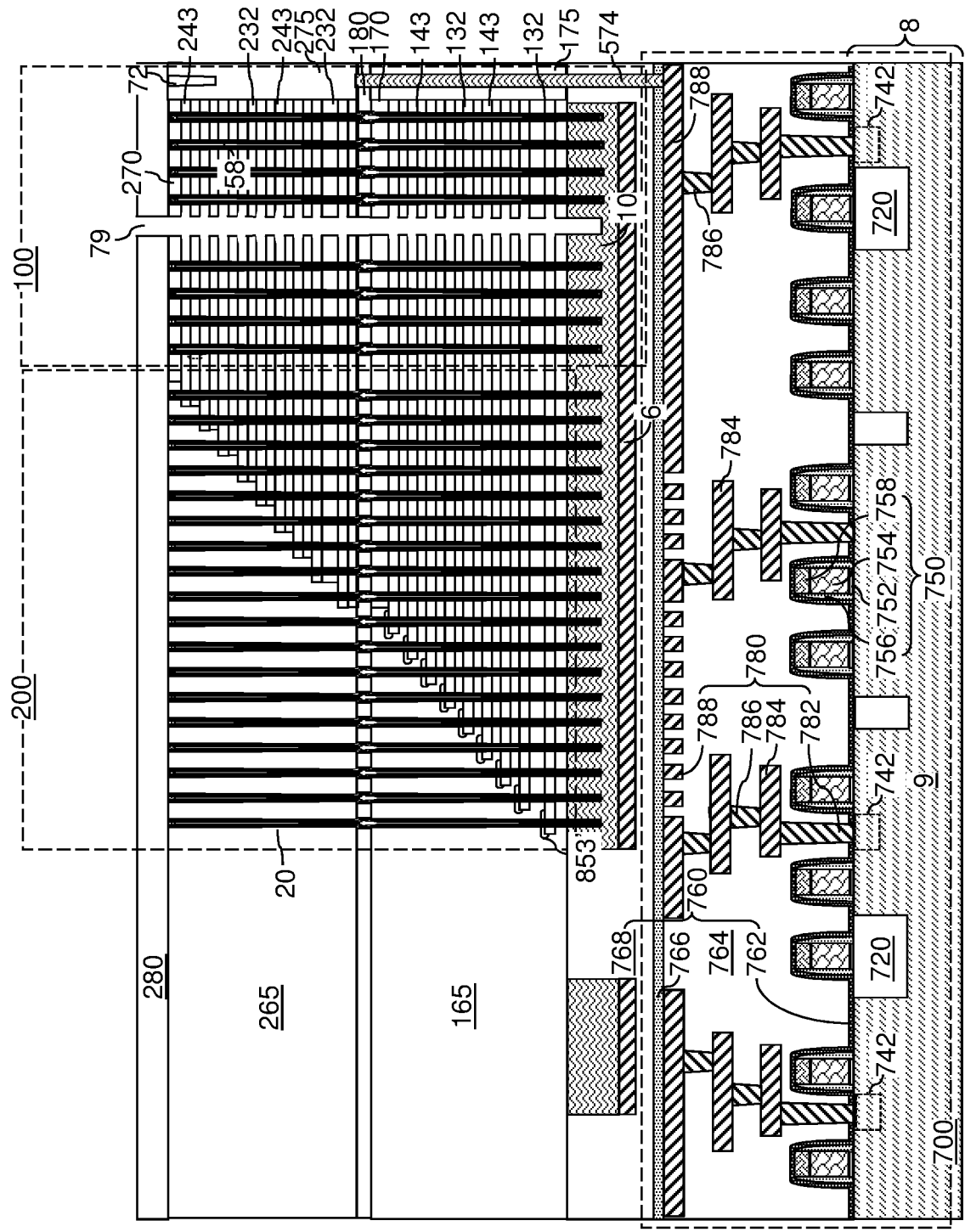
FIG. 24 is a vertical cross-sectional view of the exemplary structure after formation of backside recesses according to an embodiment of the present disclosure.

Referring to FIG. 24, an etchant that selectively etches the materials of the first and second sacrificial material layers (142, 242) with respect to the materials of the first and second insulating layers (132, 232), the first and second insulating cap layers (170, 270), the inter-tier insulating layer 180, the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the material of the inter-tier insulating layer 180, the material of the first and second retro-stepped dielectric material portions (165, 265), and the material of the outermost layer of the memory films 50 can include silicon oxide materials.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 25:
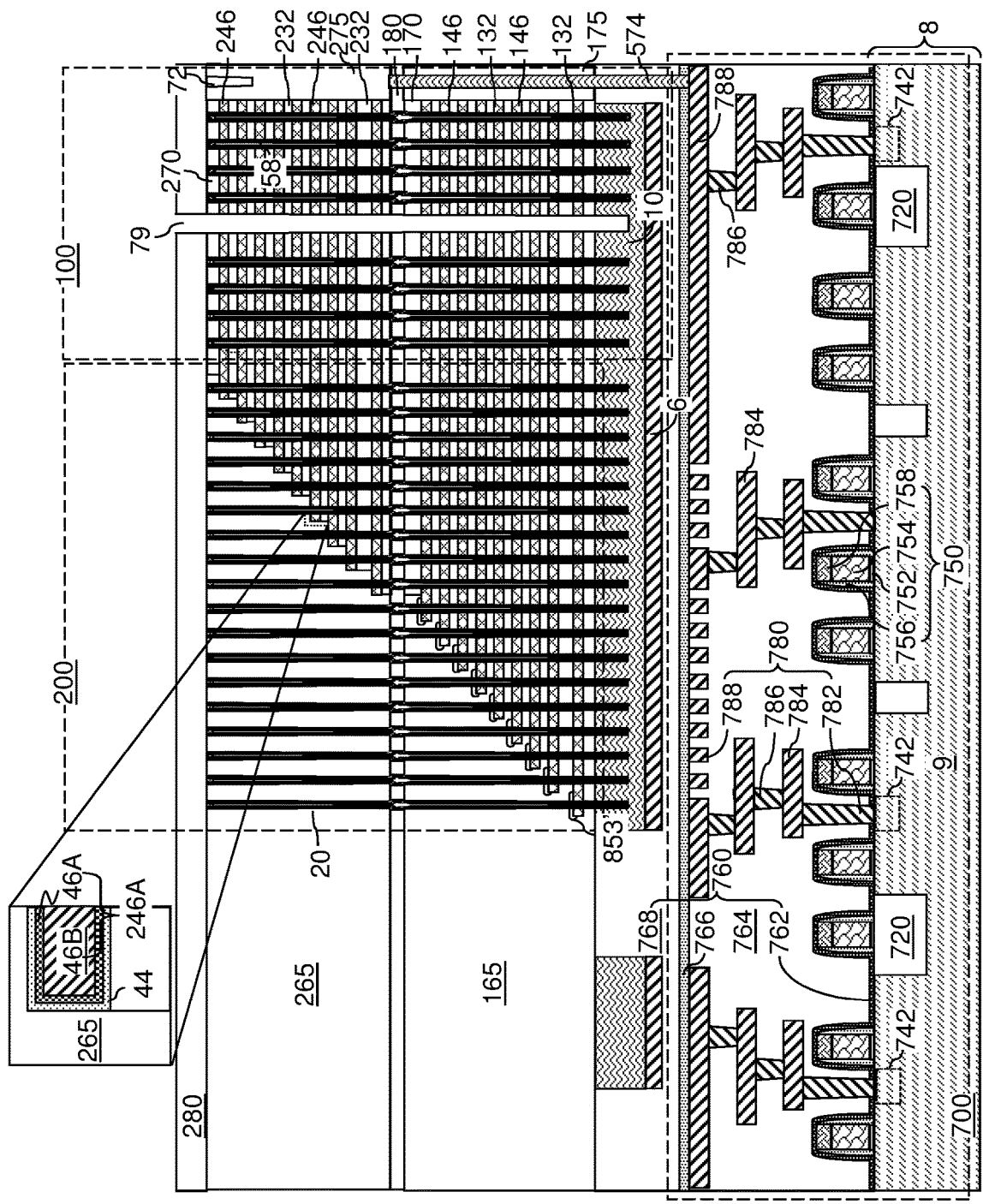
FIG. 25 is a vertical cross-sectional view of the exemplary structure after formation of electrically conductive layers in the backside recesses according to an embodiment of the present disclosure.

Referring to FIG. 25, a backside blocking dielectric layer 44 can be optionally deposited in the backside recesses and the backside trenches 79 and over the contact level dielectric layer 280. The backside blocking dielectric layer 44 can be deposited on the physically exposed portions of the outer surfaces of the memory stack structures 55, which are portions of the memory opening fill structures 58. The backside blocking dielectric layer 44 includes a dielectric material such as a dielectric metal oxide, silicon oxide, or a combination thereof. For example, the backside blocking dielectric layer 44 can include aluminum oxide. The backside blocking dielectric layer 44 can be formed by a conformal deposition process such as atomic layer deposition or chemical vapor deposition. The thickness of the backside blocking dielectric layer 44 can be in a range from 1 nm to 20 nm, such as from 2 nm to 10 nm, although lesser and greater thicknesses can also be employed.

At least one conductive material (46A, 46B) can be deposited in the plurality of backside recesses (243, 243), on the sidewalls of the backside trench 79, and over the contact level dielectric layer 280. The at least one conductive material (46A, 46B) can be deposited by a conformal deposition method, which can be, for example, chemical vapor deposition (CVD), atomic layer deposition (ALD), electroless plating, electroplating, or a combination thereof. The at least one conductive material (46A, 46B) can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. In one embodiment, the at least one conductive material (46A, 46B) can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material (46A, 46B) can include a conductive metallic nitride liner 46A that includes a conductive metallic nitride material such as TiN, TaN, WN, or a combination thereof, and a conductive fill material 46B such as W, Co, Ru, Mo, Cu, or combinations thereof. In one embodiment, the at least one conductive material (46A, 46B) for filling the backside recesses (143, 243) can be a combination of titanium nitride layer and a tungsten fill material.

Electrically conductive layers (146, 246) can be formed in the backside recesses (143, 243) by deposition of the at least one conductive material (46A, 46B). A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact level dielectric layer 280. Each of the first electrically conductive layers 146 and the second electrically conductive layers 246 can include a respective conductive metallic nitride liner 46A and a respective conductive fill material 46B. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly. The first sacrificial material layers 142 are replaced with material portions including the first electrically conductive layers 146 and a subset of the backside blocking dielectric layers 44. The second sacrificial material layers 242 are replaced with material portions including the second electrically conductive layers 246 and another subset of the backside blocking dielectric layers 44.

Figure 26A:
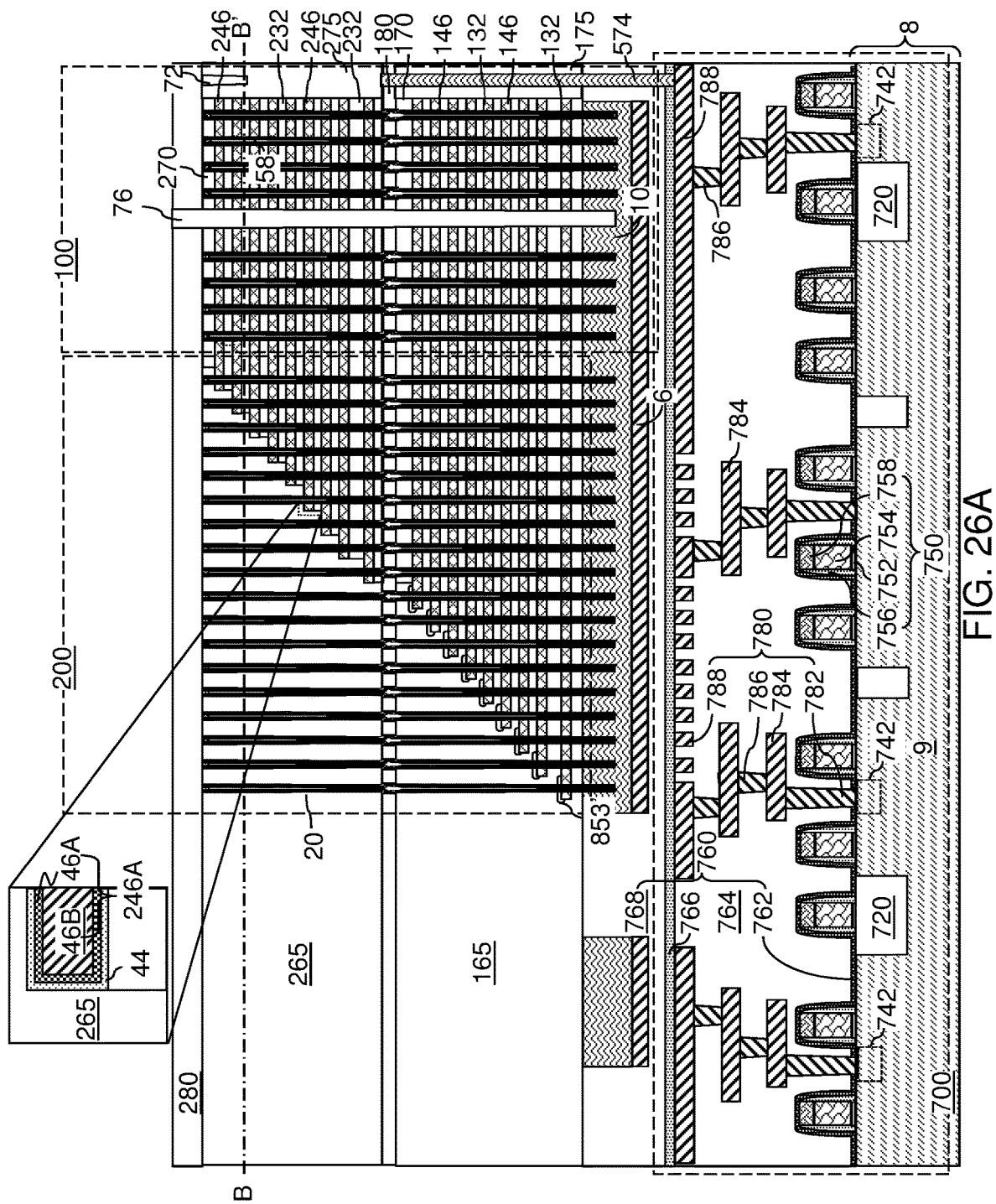
FIG. 26A is a vertical cross-sectional view of the exemplary structure after formation of dielectric wall structures in the backside trenches according to an embodiment of the present disclosure.
Figure 26B:
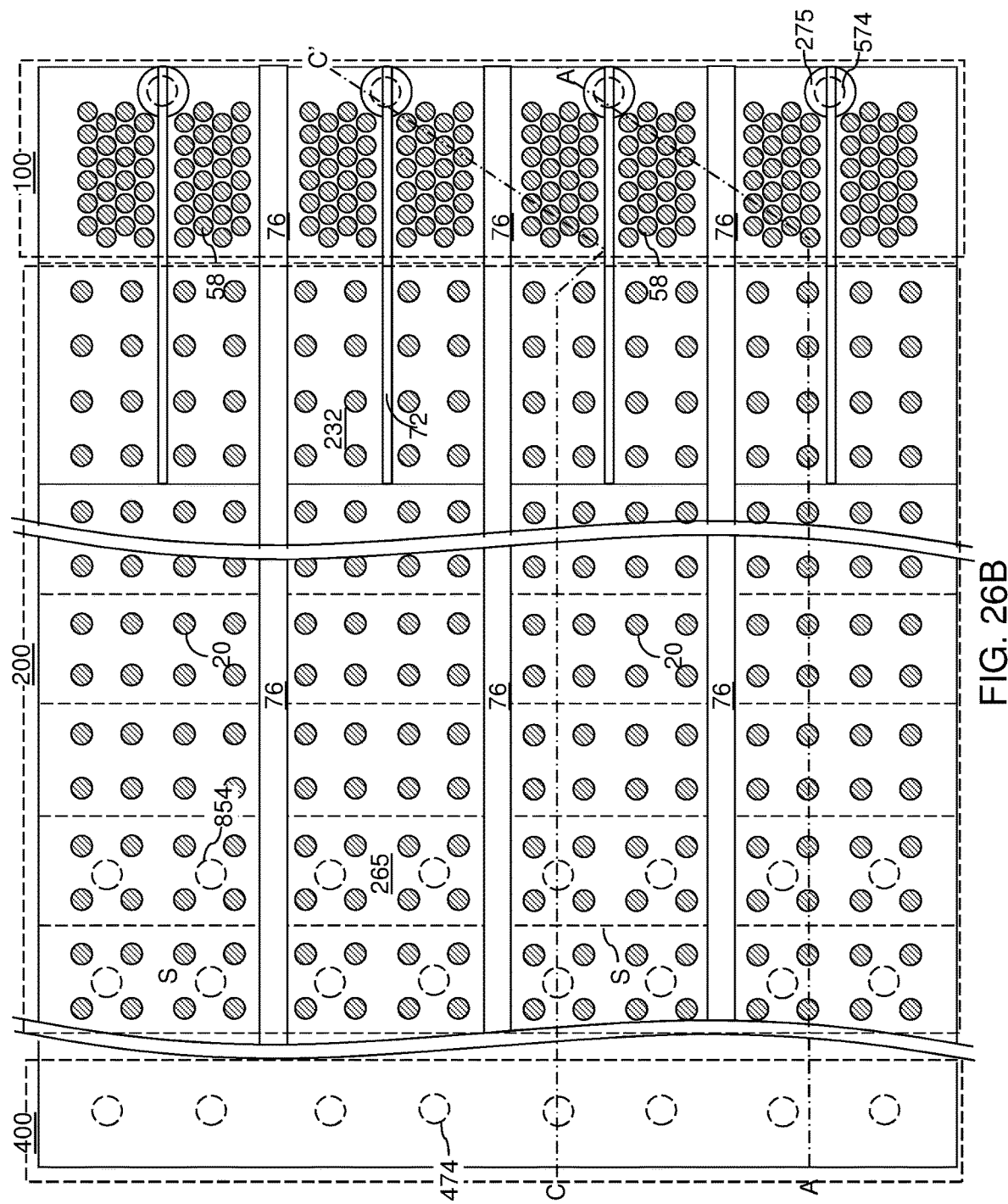
FIG. 26B is a horizontal cross-sectional of the exemplary structure along the vertical plane B-B' of FIG. 26A. The hinged vertical plane A-A' corresponds to the plane of the vertical cross-sectional view of FIG. 26A.
Figure 26C:
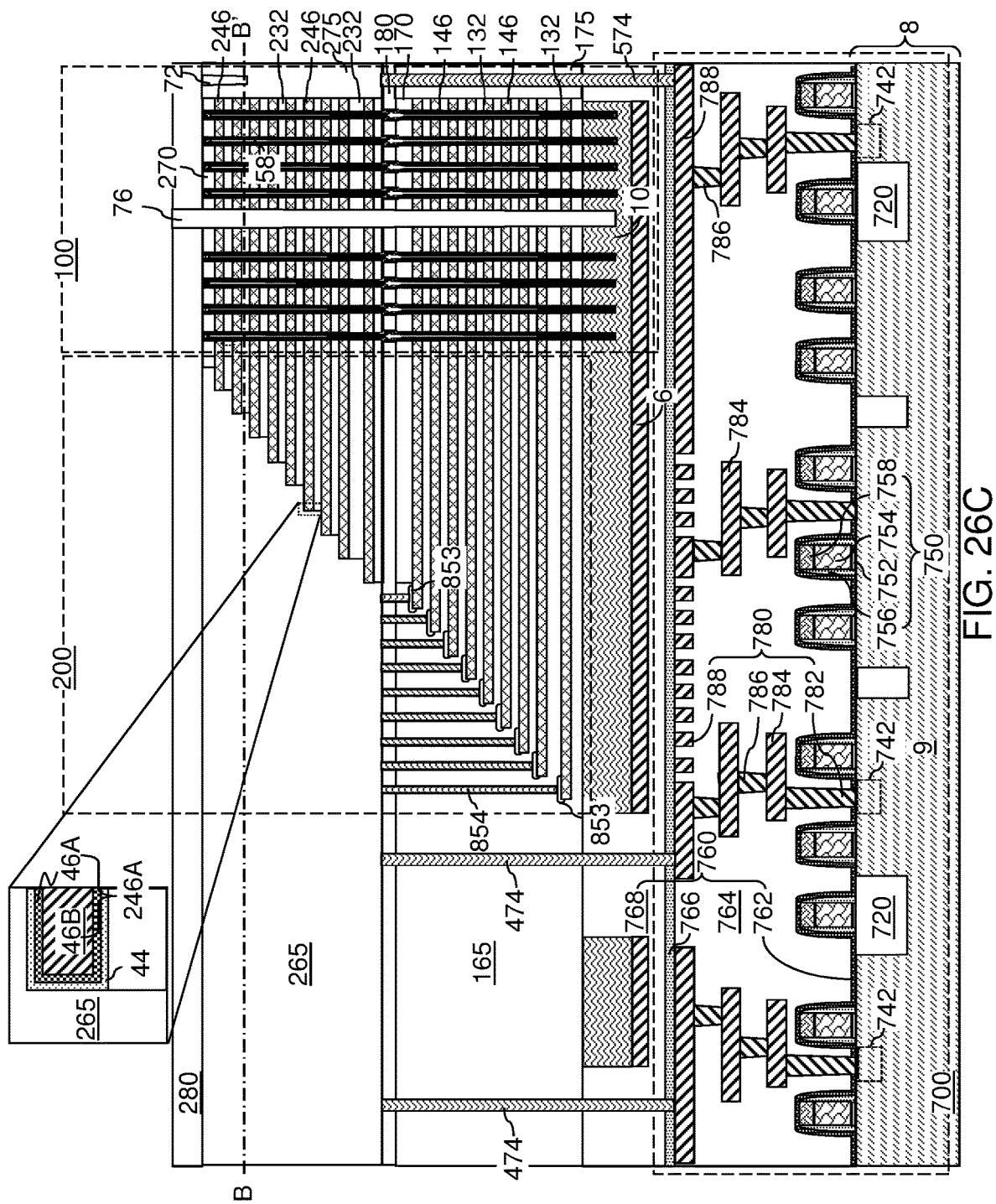
FIG. 26C is a vertical cross-sectional view of the exemplary structure along the hinged vertical plane C-C' of FIG. 26B.

Referring to FIGS. 26A-26C, an insulating material can be deposited in the backside trenches 79 by a conformal deposition process. Excess portions of the insulating material deposited over the top surface of the contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2.

Figure 27:
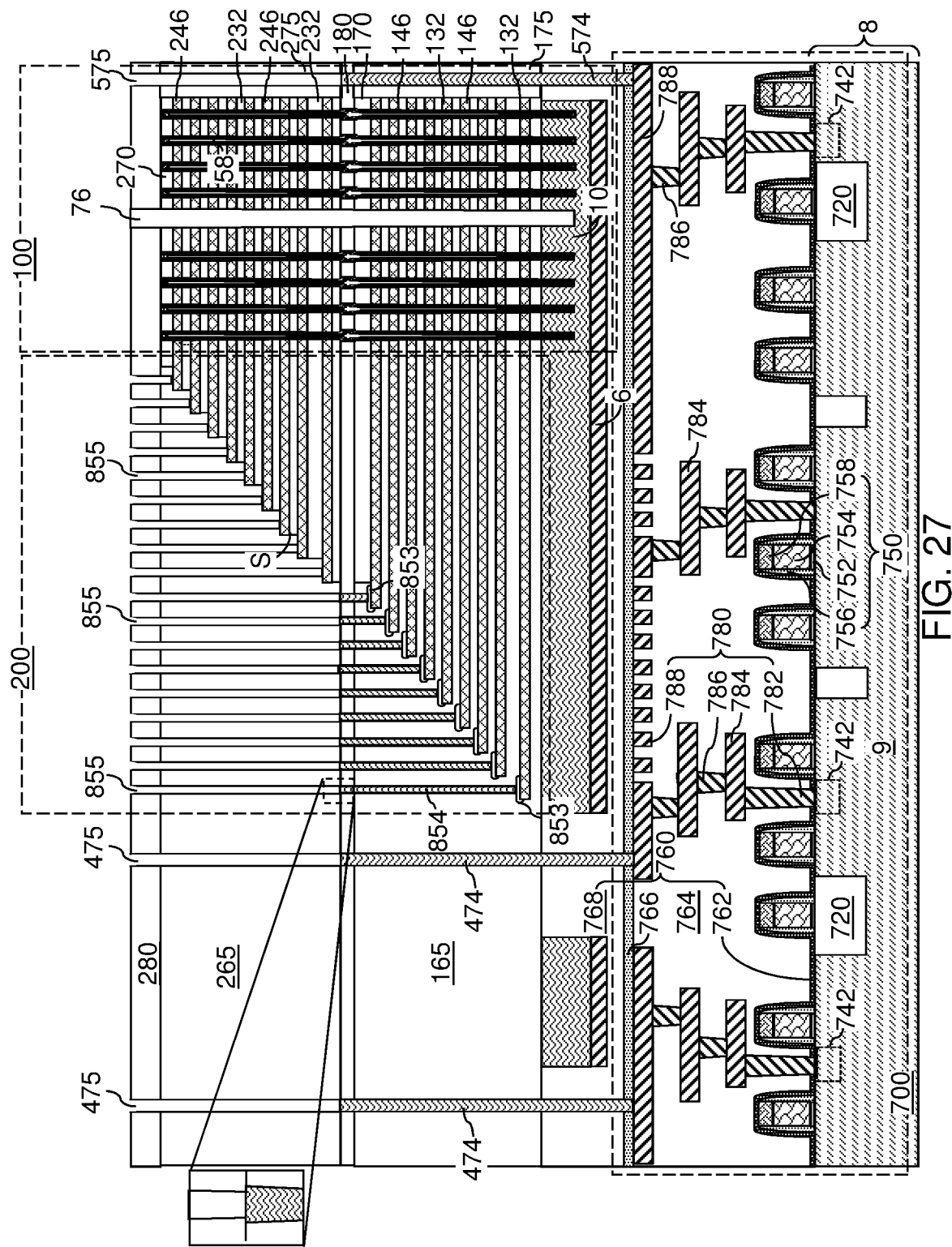
FIG. 27 is a vertical cross-sectional view of the exemplary structure after formation of second staircase-region contact via cavities, second peripheral-region via cavities, and second array-region via cavities according to an embodiment of the present disclosure.

Referring to FIG. 27, various second contact via cavities (855, 475, 575) are formed through the second-tier structure (232, 246, 270, 265, 275). For example, a photoresist layer (not shown) can be applied over the contact level dielectric layer 280, and can be lithographically patterned by exposure and development to form openings therein. The pattern of the openings in the photoresist layer can include the pattern of the first contact via cavities (851, 471, 571) formed at the processing steps of FIG. 7 and additional openings that overlie a respective one of the horizontal bottom surface of the second retro-stepped dielectric material portion 265, which may contact horizontal surfaces of the backside blocking dielectric layers 44 or horizontal surfaces of the second electrically conductive layers 246.

The pattern of the openings in the photoresist layer can be transferred through the second-tier structure (232, 246, 270, 265, 275) by an anisotropic etch process. Various second contact via cavities (855, 475, 575) replicating the pattern of the openings in the photoresist layer can be formed in the second-tier structure (232, 246, 270, 265, 275). The second contact via cavities (855, 475, 575) includes second staircase-region contact via cavities 855, second peripheral-region via cavities 475, and second array-region via cavities 575. A first subset of the second staircase-region contact via cavities 855 overlie a respective one of the staircase-region sacrificial via fill structures 854. A bottom periphery of each second staircase-region contact via cavity 855 may coincide with, or may be laterally offset from, a top periphery of an underlying staircase-region sacrificial via fill structure 854. Thus, a top surface of a staircase-region sacrificial via fill structure 854 is physically exposed at the bottom of each second staircase-region contact via cavity 855 within the first subset. Each second staircase-region contact via cavities 855 within the first subset can have the same depth, which is the sum of the thickness of the second retro-stepped dielectric material portion 265 and the contact level dielectric layer 280.

A second subset of the second staircase-region contact via cavities 855 extend through second retro-stepped dielectric material portion 265 and overlie the second stepped surfaces. Each second staircase-region contact via cavity 855 within the second subset can extend to a top surface of a backside blocking dielectric 44 located on a respective one of the second electrically conductive layer 246. Thus, each second staircase-region contact via cavity 855 within the second subset can be formed on a horizontal step of the second stepped surfaces located between a neighboring pair of vertical steps S of the second stepped surfaces. The second peripheral-region via cavities 475 can extend through the second retro-stepped dielectric material portion 265 to a top surface a respective one of the peripheral-region sacrificial via fill structure 474. A bottom periphery of each second peripheral-region via cavity 475 may coincide with, or may be laterally offset from, a top periphery of an underlying peripheral-region sacrificial via fill structure 474. The second array-region via cavities 575 can vertically extend through the second dielectric pillar portions 275 to a top surface a respective one of the array-region sacrificial via fill structure 574. A bottom periphery of each second array-region via cavity 575 may coincide with, or may be laterally offset from, a top periphery of an underlying array-region sacrificial via fill structure 574. In one embodiment, remaining portions of the second dielectric pillar portions 275 can have substantially vertical straight sidewalls at the periphery. The photoresist layer can be subsequently removed, for example, by ashing.

Figure 28:
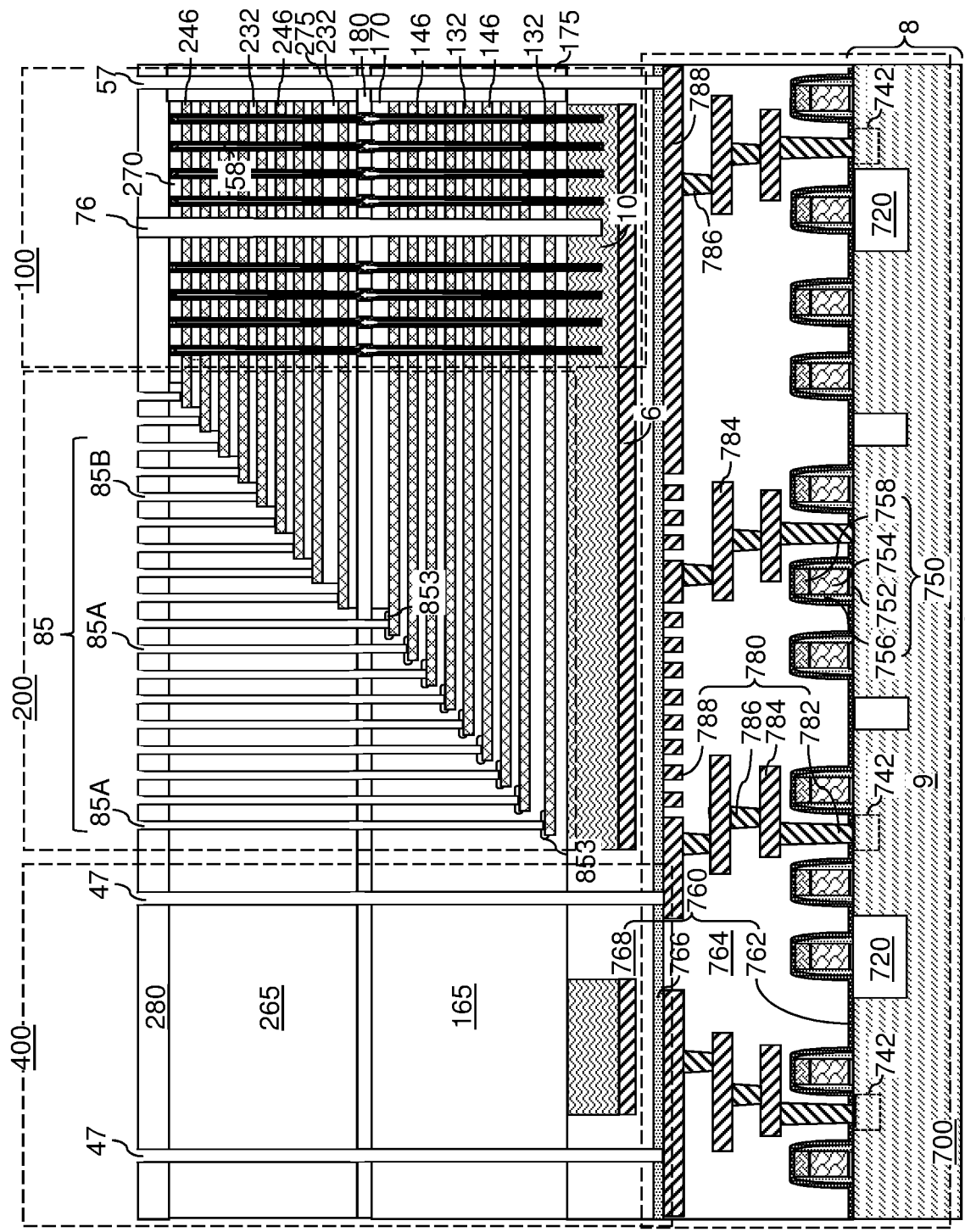
FIG. 28 is a vertical cross-sectional view of the exemplary structure after formation of staircase-region contact via cavities, inter-tier peripheral-region via cavities, and inter-tier array-region via cavities according to an embodiment of the present disclosure.
Figure 30A:
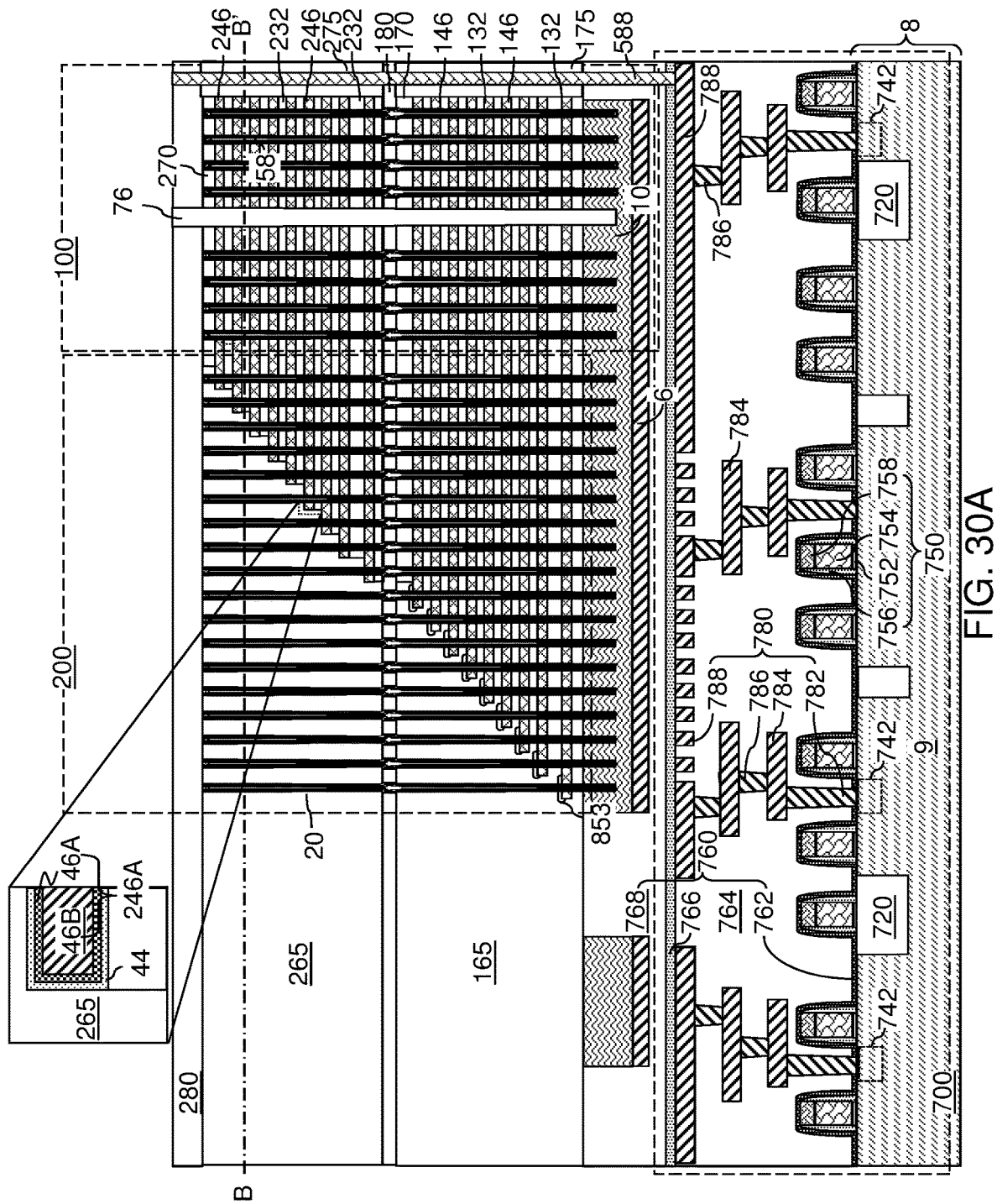
FIG. 30A is a vertical cross-sectional view of the exemplary structure after formation of various contact via structures in the various via cavities according to an embodiment of the present disclosure.
Figure 30B:
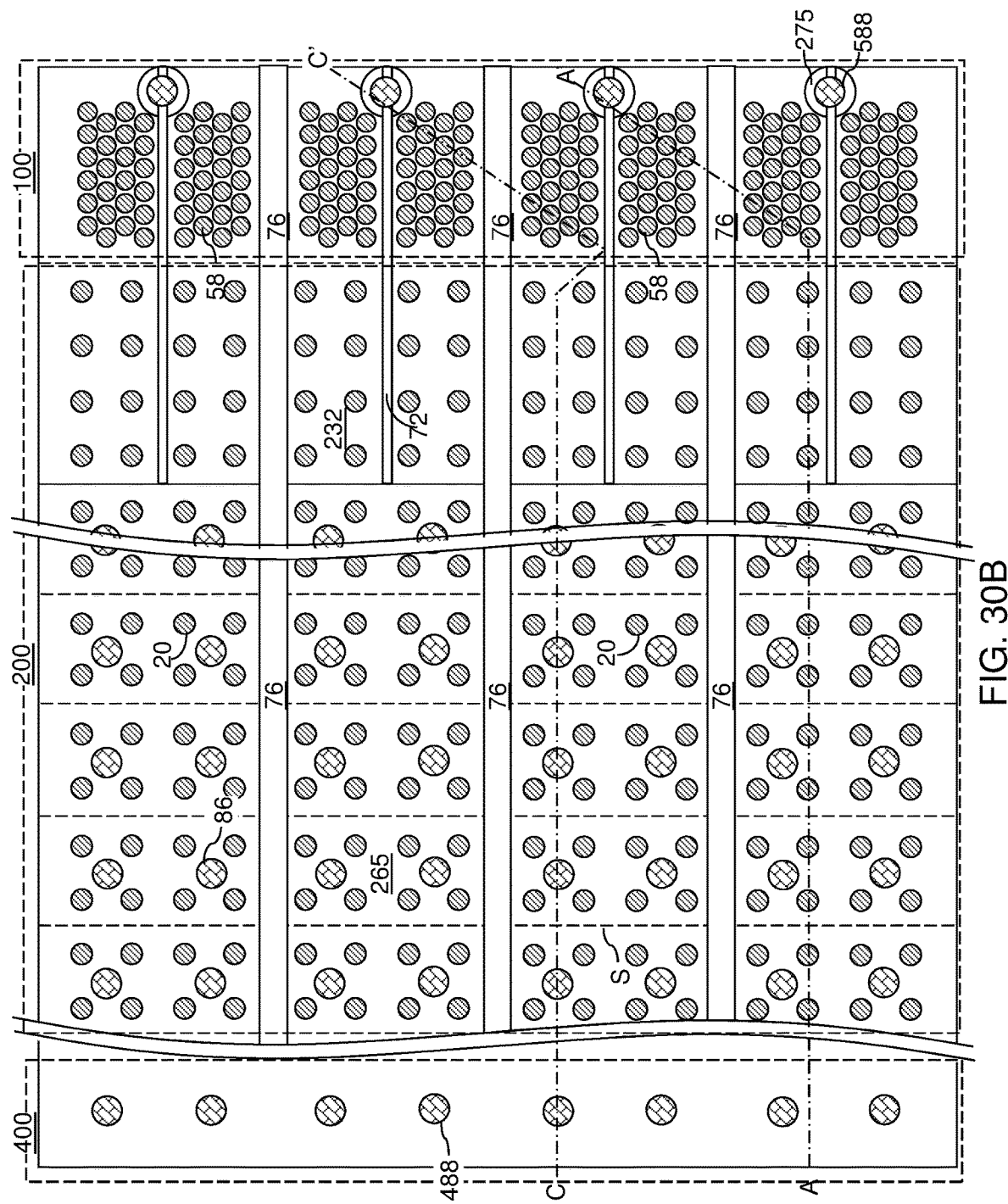
FIG. 30B is a horizontal cross-sectional view of the exemplary structure of FIG. 30A. The hinged vertical plane A-A' corresponds to the plane of the vertical cross-sectional view of FIG. 30A.
Figure 30C:
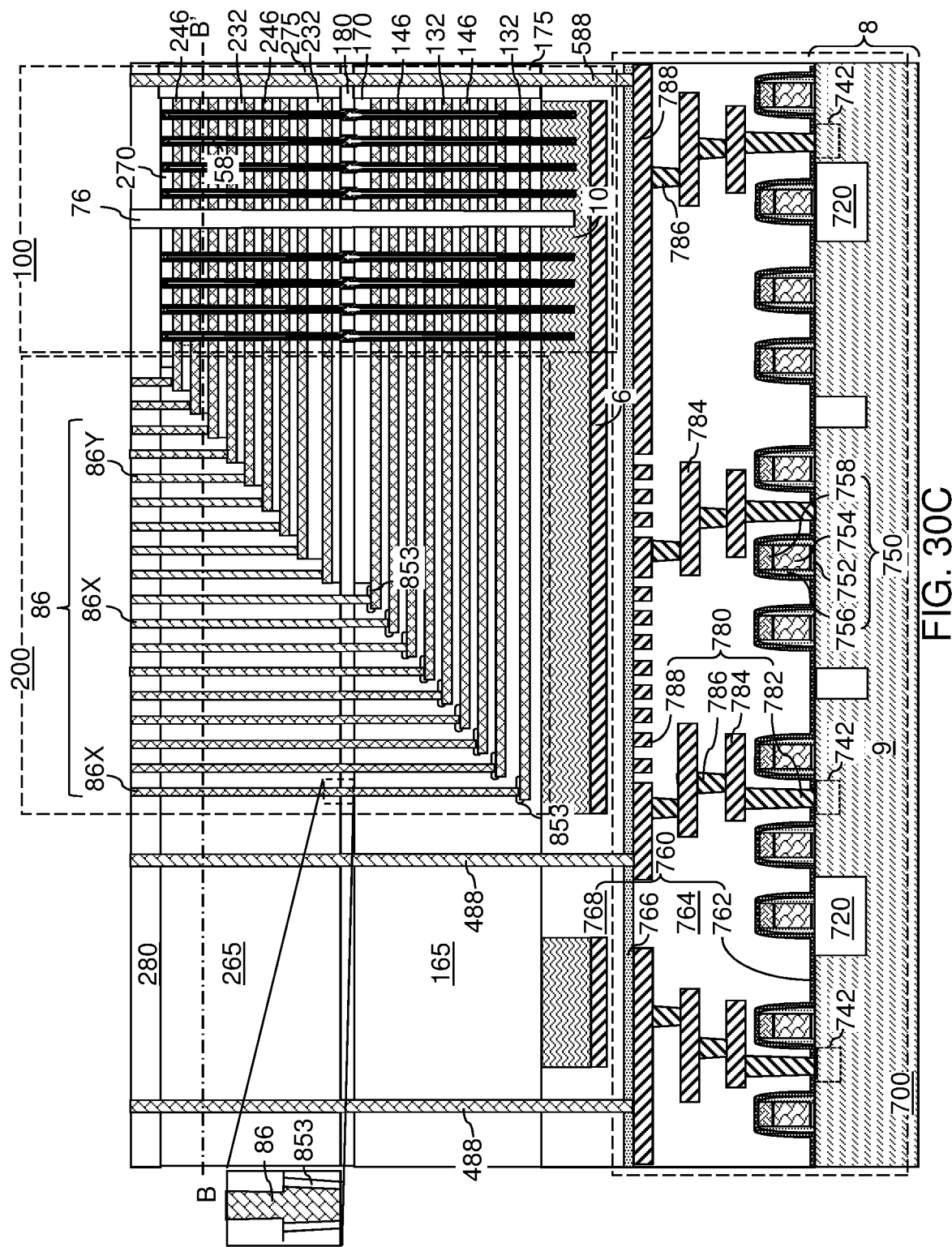
FIG. 30C is a vertical cross-sectional view of the exemplary structure along the hinged vertical plane C-C' of FIG. 30B.

Referring to FIGS. 28 and 29A, the staircase-region sacrificial via fill structures 854, the peripheral-region sacrificial via fill structures 474, and the array-region sacrificial via fill structures 574 can be removed selective to the materials of the contact level dielectric layer 280, the first and second retro-stepped dielectric material portions (165, 265), the first and second dielectric pillar portions (175, 275), and the insulating spacer layers 853'. For example, of the staircase-region sacrificial via fill structures 854, the peripheral-region sacrificial via fill structures 474, and the array-region sacrificial via fill structures 574 include amorphous silicon or polysilicon, a wet etch process employing hot trimethyl-2 hydroxyethyl ammonium hydroxide ("hot TMY") or tetramethyl ammonium hydroxide (TMAH) can be employed to remove the staircase-region sacrificial via fill structures 854, the peripheral-region sacrificial via fill structures 474, and the array-region sacrificial via fill structures 574 selective to the materials of the contact level dielectric layer 280, the first and second retro-stepped dielectric material portions (165, 265), the first and second dielectric pillar portions (175, 275), and the insulating spacer layers 853'.

Staircase-region contact via cavities 85 are formed in the staircase region 200. The staircase-region contact via cavities 85 include a first subset that includes staircase-region contact via cavities 85A extending into the first retro-stepped dielectric material portion 165 and a second subset that includes staircase-region contact via cavities 85B that do not extend into the first retro-stepped dielectric material portion 165. Each staircase-region contact via cavity 85A within the first subset of the staircase-region contact via cavities 85A includes a volume of a second staircase-region contact via cavity 855 within a first subset of the second staircase-region contact via cavities 855 and a volume from which a staircase-region sacrificial via fill structures 854 is removed. Each staircase-region contact via cavity 85B within the second subset of staircase-region contact via cavities 85 includes a volume of a second staircase-region contact via cavity 855 that do not extend below the bottommost surface of the second retro-stepped dielectric material portions 265. If there is an offset between the bottom periphery of a second staircase-region contact via cavity 855 and a top periphery of an underlying staircase-region sacrificial via fill structures 854, a horizontal step may be present in a resulting staircase-region contact via cavity 85.

Inter-tier peripheral-region via cavities 47 are formed in the peripheral device region 400. Each inter-tier peripheral-region via cavity 47 includes a volume of a second peripheral-region via cavities 475 and a volume from which a peripheral-region sacrificial via fill structure 474 is removed. If there is an offset between the bottom periphery of a second peripheral-region contact via cavity 475 and a top periphery of an underlying peripheral-region sacrificial via fill structures 474, a horizontal step may be present in a resulting peripheral-region contact via cavity 47.

Inter-tier array-region via cavities 57 are formed in the memory array region 100. Each inter-tier array-region via cavity 57 includes a volume of a second array-region via cavity 575 and a volume from which an array-region sacrificial via fill structure 575 is removed. If there is an offset between the bottom periphery of a second array-region contact via cavity 575 and a top periphery of an underlying array-region sacrificial via fill structures 574, a horizontal step may be present in a resulting array-region contact via cavity 57.

Referring to FIG. 29B, an anisotropic etch process can be performed to etch horizontal portions of the insulating spacer layers 853' to form an opening at a bottom of each insulating spacer layer 853' at the bottom of each first-type staircase-region contact via cavity 85A that overlies a first electrically conductive layer 146. The anisotropic etch process can be continued with a modification in the etch chemistry to remove horizontal portions of the backside blocking dielectric layer 44 exposed in the via cavities (85A, 85B). A top surface of a first electrically conductive layer 146 or a second electrically conductive layer 246 can be physically exposed at the bottom of each staircase-region contact via cavity 85. Each remaining portion of the insulating spacer layers 853' is herein referred to as a footed insulating spacer 853. Each footed insulating spacer 853 has a cylindrical portion 853C and an annular foot portion 853F. Each cylindrical portion 853C extends through the first retro-stepped dielectric material portion 165 and the inter-tier dielectric layer 180, and is located entirely below the second retro-stepped dielectric material portion 265. Each annular foot portion 853F adjoins a bottom end of a cylindrical portion 853C and laterally protrudes from a bottom portion of the outer periphery of the cylindrical portion 853C. Thus, each annular foot portion 853F has a greater lateral extent than the maximum lateral extent of the cylindrical portion 853C of the same footed insulating spacer 853. As used herein, a "maximum lateral extent" of an element is the maximum dimension within directions that is parallel to a top surface of a substrate such as the semiconductor substrate 8. In one embodiment, each footed insulating spacer 853 is present in the first subset of the staircase-region contact via cavities 85A which extend to the first electrically conductive layers 146, but is not present in the second subset of the staircase-region contact via cavities 85B which extend to the second electrically conductive layers 246.

Referring to FIGS. 29C and 30A-30C, at least one conductive material (86A, 86B) can be deposited in the staircase-region contact via cavities 85, the inter-tier peripheral-region via cavities 47, and the inter-tier array-region via cavities 57. The volumes of the staircase-region contact via cavities 85, the inter-tier peripheral-region via cavities 47, and the inter-tier array-region via cavities 57 include the volumes previously occupied by the various sacrificial via fill structures (854, 474, 574). The at least one conductive material (86A, 86B) can include a metallic nitride liner 86A and a metallic fill material 86B. The metallic nitride liner 86A can include a metallic nitride material such as TiN, TaN, WN, or combinations thereof. The metallic fill material 86B can include a metal or a metallic alloy such as W, Ru, Co, Mo, Cu, or combinations thereof. Excess portions of the at least one conductive material (86A, 86B) can be removed from above the horizontal plane including the top surface of the contact level dielectric layer 280 by a planarization process such as chemical mechanical planarization and/or a recess etch.

Each remaining portion of the at least one conductive material (86A, 86B) that remains in a staircase-region contact via cavities 85 constitutes a staircase-region contact via structure 86. Each remaining portion of the at least one conductive material (86A, 86B) that remains in an inter-tier peripheral-region via cavity 47 constitute a peripheral-region contact via structure 488. Each remaining portion of the at least one conductive material (86A, 86B) that remains in an inter-tier array-region via cavity 57 constitutes an array-region contact via structure 588.

The staircase-region contact via structures 86 include a first subset of the staircase-region contact via structures 86X that contact a respective one of the first electrically conductive layers 146 and a second subset of the staircase-region contact via structures 86Y that contact a respective one of the second electrically conductive layers 246. Each staircase-region contact via structure 86X within the first subset of the staircase-region contact via structures 86X can contact an inner cylindrical surface of a footed insulating spacer 853 and a cylindrical sidewall of the second retro-stepped dielectric material portion 265. Each backside blocking dielectric layer 44 located at the level of a first electrically conductive layer 146 can include a first contact area A1 that contacts a horizontal bottom surface of a footed insulating spacer 853, a second contact area A2 that contacts a sidewall of a downward-protruding portion of the footed insulating spacer 853, and a third contact area A3 that contacts the first retro-stepped dielectric material portion 165. Each of the second subset of the staircase-region contact via structures 86Y contact a top surface of a respective one of the second electrically conductive layers 246 and a sidewall of the second retro-stepped dielectric material portions 265, but in one embodiment do not contact any surface of a footed insulating spacer 853.

Each peripheral-region contact via structure 488 can contact an underlying lower metal interconnect structure 780 and sidewalls of the at least one second dielectric layer 768, the first retro-stepped dielectric material portion 165, the inter-tier dielectric layer 180, the second retro-stepped dielectric material portion 265, and the contact level dielectric layer 280. Each array-region contact via structure 588 can contact an underlying lower metal interconnect structure 780 and sidewalls of the at least one second dielectric layer 768, a first dielectric pillar portions 175, the inter-tier dielectric layer 180, a second dielectric pillar portions 275, and the contact level dielectric layer 280.

Figure 31:
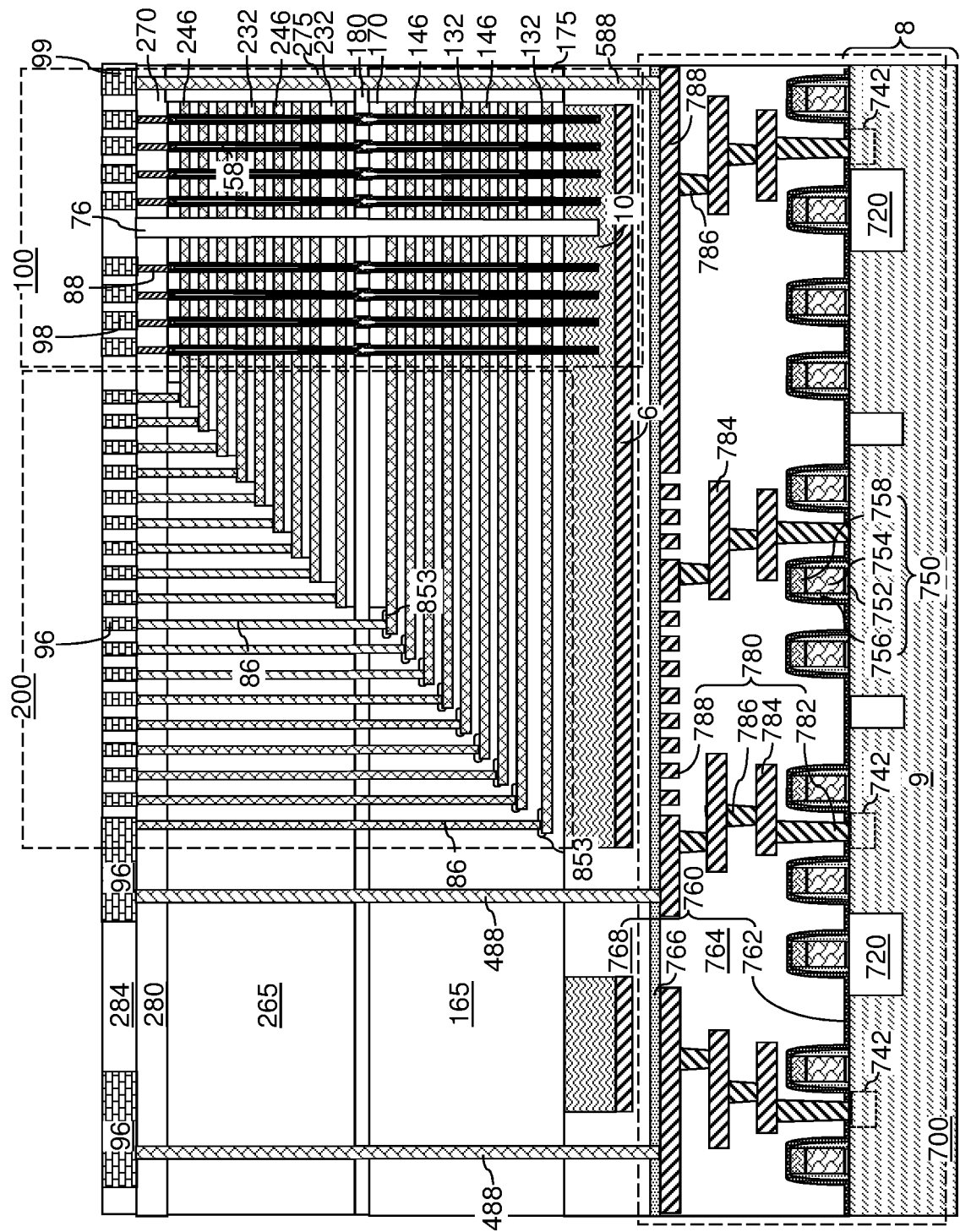
FIG. 31 is a vertical cross-sectional view of the exemplary structure after formation of upper metal line structures according to an embodiment of the present disclosure.

Referring to FIG. 31, drain contact via structures 88 can be formed through the contact level dielectric layer 280 directly on top surfaces of the drain regions 63. At least one additional dielectric layer can be formed over the contact level dielectric layer 280, and additional metal interconnect structures (herein referred to as upper-level metal interconnect structures) can be formed in the at least one additional dielectric layer. For example, the at least one additional dielectric layer can include a line-level dielectric layer 284 that is formed over the contact level dielectric layer 280. The upper-level metal interconnect structures can include bit lines 98 contacting, or electrically shorted to, a respective one of the drain contact via structures 88, interconnection line structures 96 contacting, and/or electrically shorted to, at least one of the staircase-region contact via structures 86 and/or the peripheral region contact via structures 488, and array-region line structures 99 contacting, and/or electrically shorted to, a respective one of the array-region contact via structures 588.

The sacrificial metal plates of the embodiments of the present disclosure limit the vertical extent of the staircase-region contact vias containing the via structures to reduce or prevent electrical shorts between the via structures and unrelated electrically conductive layers (e.g., word lines).

Referring to the various drawings and according to various embodiments of the present disclosure, a three-dimensional memory device is provided, which comprises: a first alternating stack (132, 146) of first insulating layers 132 and first electrically conductive layers 146; memory stack structures 55 vertically extending through each layer in the first alternating stack (132, 146) in a memory array region 100, wherein each of the memory stack structures 55 comprises a memory film 50 and a vertical semiconductor channel 60; a first retro-stepped dielectric material portion 165 having first stepped surfaces overlying the first alternating stack (132, 146), wherein each first electrically conductive layer 146 includes an overhang region that protrudes farther into the first retro-stepped dielectric material portion 165 than an underlying first insulating layer 132; and staircase-region contact via structures 86 extending through the first retro-stepped dielectric material portion 165 and contacting a respective one of the first electrically conductive layers 146.

In one embodiment, the three-dimensional memory device can include footed insulating spacers 853 embedded within the first retro-stepped dielectric material portion 165, wherein each of the footed insulating spacers 853 comprises a cylindrical portion 853C that laterally surrounds a respective one of the staircase-region contact via structures 86 and an annular foot portion 853F adjoined to a bottom end of the cylindrical portion 853C and having a lateral extent that is greater than a maximum lateral extent of the cylindrical portion 853F.

In one embodiment, the cylindrical portion 853C has a uniform lateral thickness between an inner sidewall and an outer sidewall, the annular foot portion 853F has an annular shape with an opening through which the respective one of the staircase-region contact via structures 86 vertically extends, and has a uniform vertical thickness within an area that overlies an underlying electrically conductive layer 146 that a staircase-region contact via structure 86 that is enclosed by the annular foot portion 853F directly contacts.

Backside blocking dielectric layers 44 can be located between each vertically neighboring pair of a first insulating layer 132 and a first electrically conductive layer 146, and can be located between the first retro-stepped dielectric material portion 165 and each of the first electrically conductive layers 146. The annular foot portion 853F contacts a top surface of one of the backside blocking dielectric layers 44 (in the first contact area A1) and an upper portion of a sidewall of the one of the backside blocking dielectric layers 44 (in the second contact area A2). A lower portion of the sidewall of the one of the backside blocking dielectric layers 44 contacts the first retro-stepped dielectric material portion 165 (in the third contact area A3).

In one embodiment, the first retro-stepped dielectric material portion 165 comprises a doped silicate glass, the footed insulating spacers 853F comprise an undoped silicate glass.

In one embodiment, the three-dimensional memory device can further comprise: a second alternating stack (232, 246) of second insulating layers 232 and second electrically conductive layers 246, and a second respective retro-stepped dielectric material portion 265 having second stepped surfaces that overlie the second alternating stack (232, 246). The staircase-region contact via structures 86 directly contact surfaces of the second retro-stepped dielectric material portion 265.

In one embodiment, the three-dimensional memory device further comprises additional staircase-region contact via structures 86 vertically extending through the second retro-stepped dielectric material portion 265 (i.e., a second subset of the staircase-region contact via structures 86). Each of the additional staircase-region contact via structures 86 contacts a top surface of a respective one of the second electrically conductive layers 246 and a respective cylindrical surface of the second retro-stepped dielectric material portion 265. In one embodiment, top surfaces of the staircase-region contact via structures 86 that contact the first electrically conductive layers 146 and top surfaces of the additional staircase-region contact via structures 86 that contact the second electrically conductive layers 246 are located within a same horizontal plane (such as the horizontal plane including the top surface of the contact level dielectric layer 280). In one embodiment, each of the memory stack structures 55 vertically extends through each layer of the first alternating stack (132, 146) and the second alternating stack (232, 246) in the memory array region 100.

In one embodiment, one of the staircase-region contact via structures 86 has a horizontal step that adjoins a bottom end of an upper sidewall of the one of the staircase-region contact via structures 86 and a top end of a lower sidewall of the one of the staircase-region contact via structures 86. The horizontal step can be located within a horizontal plane including a bottom surface of the second retro-stepped dielectric material portion 265, which can be the horizontal plane including the top surface of the inter-tier dielectric layer 180.

In one embodiment, the three-dimensional memory device can comprise footed insulating spacers 853 embedded within the first retro-stepped dielectric material portion 165 adjacent to the first alternating stack (132, 146). In one embodiment, there are no footed insulating spacers embedded within the second retro-stepped dielectric material portion 265 adjacent to the second alternating stack (232, 246). In this embodiment, each second electrically conductive layer 246 does not include an overhang region and does not protrude farther into the second retro-stepped dielectric material portion 265 than an underlying second insulating layer 232.

Each of the footed insulating spacers 853 comprise a cylindrical portion 853C that laterally surrounds a respective one of the staircase-region contact via structures 86 and an annular foot portion 853F adjoined to a bottom end of the cylindrical portion 853C and having a lateral extent that is greater than a maximum lateral extent of the cylindrical portion 853C. The footed insulating spacers 863 have top surfaces above the horizontal plane including the top surface of the first retro-stepped dielectric material portion 165 and below the horizontal plane including the bottom surface of the second retro-stepped dielectric material portion 265.

In one embodiment, the three-dimensional memory device comprises a monolithic three-dimensional NAND memory device; the first electrically conductive layers 146 comprise, or are electrically connected to, a respective word line of the monolithic three-dimensional NAND memory device; the substrate 8 comprises a silicon substrate; the monolithic three-dimensional NAND memory device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings; and the silicon substrate contains an integrated circuit comprising a driver circuit for the memory device located thereon.

In one embodiment, the first electrically conductive layers 146 comprise a plurality of control gate electrodes having a strip shape extending substantially parallel to the top surface of the substrate; and the plurality of control gate electrodes comprise at least a first control gate electrode located in the first device level and a second control gate electrode located in the second device level.

In one embodiment, the array of monolithic three-dimensional NAND strings comprises: a plurality of semiconductor channels 60, wherein at least one end portion of each of the plurality of semiconductor channels 60 extends substantially perpendicular to a top surface of the substrate 8, one of the plurality of semiconductor channels 60 including the vertical semiconductor channel 60, and a plurality of charge storage elements (as embodied as portions of the charge storage layers 54 located at levels of the first and second electrically conductive layers (146, 246)), each charge storage element located adjacent to a respective one of the plurality of semiconductor channels 60.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   a first alternating stack of first insulating layers and first electrically conductive layers;
   memory stack structures vertically extending through each layer in the first alternating stack in a memory array region, wherein each of the memory stack structures comprises a memory film and a vertical semiconductor channel;
   a first retro-stepped dielectric material portion having first stepped surfaces overlying the first alternating stack in a staircase region, wherein each first electrically conductive layer includes an overhang region that protrudes farther into the first retro-stepped dielectric material portion than an underlying first insulating layer;
   staircase-region contact via structures extending through the first retro-stepped dielectric material portion and contacting a respective one of the first electrically conductive layers; and
   footed insulating spacers embedded within the first retro-stepped dielectric material portion, wherein each of the footed insulating spacers comprises a cylindrical portion that laterally surrounds a respective one of the staircase-region contact via structures and an annular foot portion adjoined to a bottom end of the cylindrical portion and having a lateral extent that is greater than a maximum lateral extent of the cylindrical portion.

2. The three-dimensional memory device of claim 1, wherein:
   the cylindrical portion has a uniform lateral thickness between an inner sidewall and an outer sidewall; and
   the annular foot portion has an annular shape with an opening through which the respective one of the staircase-region contact via structures vertically extends, and has a uniform vertical thickness within an area that overlies an underlying electrically conductive layer that a staircase-region contact via structure enclosed by the annular foot portion directly contacts.

3. The three-dimensional memory device of claim 1, further comprising backside blocking dielectric layers located between each vertically neighboring pair of a first insulating layer and a first electrically conductive layer and between the first retro-stepped dielectric material portion and each of the first electrically conductive layers, wherein the annular foot portion contacts a top surface of one of the backside blocking dielectric layers and an upper portion of a sidewall of the one of the backside blocking dielectric layers, and wherein a lower portion of the sidewall of the one of the backside blocking dielectric layers contacts the first retro-stepped dielectric material portion.

4. The three-dimensional memory device of claim 1, wherein:
   the first retro-stepped dielectric material portion comprises a doped silicate glass; and
   the footed insulating spacers comprise an undoped silicate glass.

5. A three-dimensional memory device comprising:
a first alternating stack of first insulating layers and first electrically conductive layers;
memory stack structures vertically extending through each layer in the first alternating stack in a memory array region, wherein each of the memory stack structures comprises a memory film and a vertical semiconductor channel;
a first retro-stepped dielectric material portion having first stepped surfaces overlying the first alternating stack in a staircase region, wherein each first electrically conductive layer includes an overhang region that protrudes farther into the first retro-stepped dielectric material portion than an underlying first insulating layer;
staircase-region contact via structures extending through the first retro-stepped dielectric material portion and contacting a respective one of the first electrically conductive layers;
a second alternating stack of second insulating layers and second electrically conductive layers; and
a second respective retro-stepped dielectric material portion including second stepped surfaces that overlie the second alternating stack,
wherein the staircase-region contact via structures directly contact surfaces of the second retro-stepped dielectric material portion.

6. The three-dimensional memory device of claim 5, further comprising additional staircase-region contact via structures vertically extending through the second retro-stepped dielectric material portion, wherein each of the additional staircase-region contact via structures contacts a top surface of a respective one of the second electrically conductive layers and a respective cylindrical surface of the second retro-stepped dielectric material portion.

7. The three-dimensional memory device of claim 6, wherein:
top surfaces of the staircase-region contact via structures and top surfaces of the additional staircase-region contact via structures are located within a same horizontal plane; and
each of the memory stack structures vertically extends through each layer of the second alternating stack in the memory array region.

8. The three-dimensional memory device of claim 6, further comprising footed insulating spacers embedded within the first retro-stepped dielectric material portion adjacent to the first alternating stack, wherein:
there are no footed insulating spacers embedded within the second retro-stepped dielectric material portion adjacent to the second alternating stack, and
each second electrically conductive layer does not include an overhang region and does not protrude farther into the second retro-stepped dielectric material portion than an underlying second insulating layer.

9. The three-dimensional memory device of claim 8, wherein:
each of the footed insulating spacers comprise a cylindrical portion that laterally surrounds a respective one of the staircase-region contact via structures and an annular foot portion adjoined to a bottom end of the cylindrical portion and having a lateral extent that is greater than a maximum lateral extent of the cylindrical portion; and
the footed insulating spacers have top surfaces below the horizontal plane including the bottom surface of the second retro-stepped dielectric material portion.

10. The three-dimensional memory device of claim 5, wherein:
one of the staircase-region contact via structures has a horizontal step that adjoins a bottom end of an upper sidewall of the one of the staircase-region contact via structures and a top end of a lower sidewall of the one of the staircase-region contact via structures; and
the horizontal step is located within a horizontal plane including a bottom surface of the second retro-stepped dielectric material portion.

11. The three-dimensional memory device of claim 5, wherein:
the three-dimensional memory device comprises a monolithic three-dimensional NAND memory device;
the first electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the first electrically conductive layers comprise a plurality of control gate electrodes having a strip shape extending substantially parallel to the top surface of the substrate;
the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, one of the plurality of semiconductor channels including the vertical semiconductor channel, and
a plurality of charge storage elements, each charge storage element located adjacent to a respective one of the plurality of semiconductor channels.

* * * * *